US012166360B2

(12) United States Patent
Peralta et al.

(10) Patent No.: US 12,166,360 B2
(45) Date of Patent: *Dec. 10, 2024

(54) METHOD OF OPERATING A WIRELESS ELECTRICAL ENERGY TRANSMISSION SYSTEM

(71) Applicant: NuCurrent, Inc., Chicago, IL (US)

(72) Inventors: Alberto Peralta, Chicago, IL (US); Md. Nazmul Alam, Glendale Heights, IL (US); Jacob D. Babcock, Chicago, IL (US); Vinit Singh, Austin, TX (US); Christine A. Frysz, Orchard Park, NY (US)

(73) Assignee: NuCurrent, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/353,325

(22) Filed: Jul. 17, 2023

(65) Prior Publication Data

US 2024/0030748 A1  Jan. 25, 2024

Related U.S. Application Data

(63) Continuation of application No. 17/896,832, filed on Aug. 26, 2022, now Pat. No. 11,705,760, which is a
(Continued)

(51) Int. Cl.
*H02J 50/12* (2016.01)
*H01F 27/28* (2006.01)
(Continued)

(52) U.S. Cl.
CPC .......... *H02J 50/12* (2016.02); *H01F 27/2885* (2013.01); *H01F 27/36* (2013.01);
(Continued)

(58) Field of Classification Search
CPC ............ H02J 7/025; H02J 5/005; H02J 17/00
(Continued)

(56) References Cited

U.S. PATENT DOCUMENTS 2,797,393 A  6/1957 Clogston
2,911,605 A  11/1959 Wales, Jr. et al.
(Continued)

FOREIGN PATENT DOCUMENTS

CN  2650300 Y  10/2004
CN  103944196 A  7/2014
(Continued)

OTHER PUBLICATIONS

Exhibit E-09: Invalidity Contentions: '729 Patent in View of Kurz '634, NuCurrent v. Samsung Electronics America, Inc. et al., Case No. 1:19-cv-00798-DLC (S.D.N.Y.) Invalidity of U.S. Pat. No. 9,941,729 ("The '729 Patent") by United States Patent Publication No. 2015/0145635 ("Kurz '634"), Apr. 12, 2019, 122 pages.
(Continued)

*Primary Examiner* — David V Henze-Gongola
(74) *Attorney, Agent, or Firm* — Lee Sullivan Shea & Smith LLP

(57) ABSTRACT

A wireless electrical energy transmission system is provided. The system comprises a wireless transmission base configured to wirelessly transmit electrical energy or data via near field magnetic coupling to a receiving antenna configured within an electronic device. The wireless electrical energy transmission system is configured with at least one transmitting antenna and a transmitting electrical circuit positioned within the transmission base. The transmission base is configured so that at least one electronic device can be wirelessly electrically charged or powered by positioning the at least one device external and adjacent to the transmission base.

20 Claims, 24 Drawing Sheets

Related U.S. Application Data continuation of application No. 15/895,595, filed on Feb. 13, 2018, now Pat. No. 11,431,200.

(60) Provisional application No. 62/458,261, filed on Feb. 13, 2017.

(51) Int. Cl.

| | |
|---|---|
| *H01F 27/36* | (2006.01) |
| *H01F 38/14* | (2006.01) |
| *H01Q 1/08* | (2006.01) |
| *H02J 50/05* | (2016.01) |
| *H02J 50/10* | (2016.01) |
| *H02J 50/40* | (2016.01) |
| *H02J 50/50* | (2016.01) |
| *H02J 50/70* | (2016.01) |
| *H02J 50/80* | (2016.01) |
| *H04B 5/26* | (2024.01) |
| *H04B 5/48* | (2024.01) |
| *H04B 5/72* | (2024.01) |
| *H04B 5/79* | (2024.01) |
| *H05K 9/00* | (2006.01) |

(52) U.S. Cl.
CPC ......... *H01F 27/361* (2020.08); *H01F 27/363* (2020.08); *H01F 27/366* (2020.08); *H01F 38/14* (2013.01); *H01Q 1/085* (2013.01); *H02J 50/05* (2016.02); *H02J 50/10* (2016.02); *H02J 50/40* (2016.02); *H02J 50/50* (2016.02); *H02J 50/70* (2016.02); *H02J 50/80* (2016.02); *H04B 5/26* (2024.01); *H04B 5/48* (2024.01); *H04B 5/79* (2024.01); *H05K 9/0075* (2013.01); *H04B 5/72* (2024.01)

(58) Field of Classification Search
USPC .......................................... 320/108; 307/104
See application file for complete search history.

(56) References Cited

U.S. PATENT DOCUMENTS

| | | | |
|---|---|---|---|
| 3,484,731 A | 12/1969 | Rich et al. |
| 4,328,531 A | 5/1982 | Nagashima et al. |
| 4,494,100 A | 1/1985 | Stengel et al. |
| 4,959,631 A | 9/1990 | Hasegawa et al. |
| 4,996,165 A | 2/1991 | Chang et al. |
| 5,137,478 A | 8/1992 | Graf et al. |
| 5,237,165 A | 8/1993 | Tingley, III |
| 5,604,352 A | 2/1997 | Schuetz |
| 5,639,989 A | 6/1997 | Higgins, III |
| 5,713,939 A | 2/1998 | Nedungadi et al. |
| 5,748,464 A | 5/1998 | Schuetz |
| 5,767,808 A | 6/1998 | Robbins et al. |
| 5,767,813 A | 6/1998 | Verma et al. |
| 5,777,538 A | 7/1998 | Schuetz |
| 5,801,611 A | 9/1998 | Van Loenen et al. |
| 5,808,587 A | 9/1998 | Shima |
| 5,838,154 A | 11/1998 | Morikawa et al. |
| 5,883,392 A | 3/1999 | Schuetz |
| 5,892,489 A | 4/1999 | Kanba et al. |
| 5,980,773 A | 11/1999 | Takeda |
| 6,005,193 A | 12/1999 | Markel |
| 6,021,337 A | 2/2000 | Remillard et al. |
| 6,028,568 A | 2/2000 | Asakura et al. |
| 6,107,972 A | 8/2000 | Seward et al. |
| 6,148,221 A | 11/2000 | Ishikawa et al. |
| 6,163,307 A | 12/2000 | Kim et al. |
| 6,271,803 B1 | 8/2001 | Watanabe et al. |
| 6,501,364 B1 | 12/2002 | Hui et al. |
| 6,503,831 B2 | 1/2003 | Speakman |
| 6,556,101 B1 | 4/2003 | Tada et al. |
| 6,583,769 B2 | 6/2003 | Shiroki et al. |
| 6,664,863 B1 | 12/2003 | Okamoto et al. |
| 6,809,688 B2 | 10/2004 | Yamada |
| 6,897,830 B2 | 5/2005 | Bae et al. |
| 6,924,230 B2 | 8/2005 | Sun et al. |
| 7,046,113 B1 | 5/2006 | Okamoto et al. |
| 7,205,655 B2 | 4/2007 | Sippola |
| 7,355,558 B2 | 4/2008 | Lee |
| 7,563,352 B2 | 7/2009 | Hubel |
| 7,579,835 B2 | 8/2009 | Schnell et al. |
| 7,579,836 B2 | 8/2009 | Schnell et al. |
| 7,713,762 B2 | 5/2010 | Lee et al. |
| 7,786,836 B2 | 8/2010 | Gabara |
| 7,952,365 B2 | 5/2011 | Narita et al. |
| 7,962,186 B2 | 6/2011 | Cui et al. |
| 8,056,819 B2 | 11/2011 | Rowell et al. |
| 8,299,877 B2 | 10/2012 | Hong et al. |
| 8,436,780 B2 | 5/2013 | Schantz et al. |
| 8,541,974 B2 | 9/2013 | Farahani |
| 8,567,048 B2 | 10/2013 | Singh et al. |
| 8,610,530 B2 | 12/2013 | Singh et al. |
| 8,653,927 B2 | 2/2014 | Singh et al. |
| 8,680,960 B2 | 3/2014 | Singh et al. |
| 8,692,641 B2 | 4/2014 | Singh et al. |
| 8,692,642 B2 | 4/2014 | Singh et al. |
| 8,698,590 B2 | 4/2014 | Singh et al. |
| 8,698,591 B2 | 4/2014 | Singh et al. |
| 8,707,546 B2 | 4/2014 | Singh et al. |
| 8,710,948 B2 | 4/2014 | Singh et al. |
| 8,766,483 B2 | 7/2014 | Cook et al. |
| 8,774,712 B2 | 7/2014 | Sato et al. |
| 8,803,649 B2 | 8/2014 | Singh et al. |
| 8,823,481 B2 | 9/2014 | Singh et al. |
| 8,823,482 B2 | 9/2014 | Singh et al. |
| 8,855,786 B2 | 10/2014 | Derbas et al. |
| 8,860,545 B2 | 10/2014 | Singh et al. |
| 8,898,885 B2 | 12/2014 | Singh et al. |
| 9,178,369 B2 | 11/2015 | Partovi |
| 9,208,942 B2 | 12/2015 | Singh et al. |
| 9,559,526 B2 | 1/2017 | Von Novak, III et al. |
| 9,698,632 B2 | 7/2017 | Davison et al. |
| 9,912,173 B2 | 3/2018 | Tseng |
| 10,110,046 B1 | 10/2018 | Esquibel et al. |
| 10,868,444 B2 | 12/2020 | Peralta et al. |
| 10,892,646 B2 | 1/2021 | Peralta et al. |
| 11,177,695 B2 | 11/2021 | Peralta et al. |
| 11,431,200 B2 * | 8/2022 | Peralta ............... H02J 50/10 |
| 11,705,760 B2 * | 7/2023 | Peralta ............... H02J 50/10 |
| | | 320/108 |
| 2002/0020554 A1 | 2/2002 | Sakamoto et al. |
| 2002/0053992 A1 | 5/2002 | Kawakami et al. |
| 2002/0071003 A1 | 6/2002 | Kimura |
| 2002/0075191 A1 | 6/2002 | Yokoshima et al. |
| 2002/0101383 A1 | 8/2002 | Junod |
| 2002/0105080 A1 | 8/2002 | Speakman |
| 2003/0006069 A1 | 1/2003 | Takebe et al. |
| 2003/0058180 A1 | 3/2003 | Forster et al. |
| 2003/0119677 A1 | 6/2003 | Qiyan et al. |
| 2004/0000974 A1 | 1/2004 | Odenaal et al. |
| 2004/0085247 A1 | 5/2004 | Mickle et al. |
| 2004/0108311 A1 | 6/2004 | de Rooij et al. |
| 2004/0118920 A1 | 6/2004 | He |
| 2004/0140528 A1 | 7/2004 | Kim et al. |
| 2004/0159460 A1 | 8/2004 | Passiopoulos et al. |
| 2004/0189528 A1 | 9/2004 | Killen et al. |
| 2004/0217488 A1 | 11/2004 | Luechinger |
| 2004/0227608 A1 | 11/2004 | Nakatani et al. |
| 2005/0121229 A1 | 6/2005 | Takai et al. |
| 2005/0174628 A1 | 8/2005 | Kelly et al. |
| 2006/0022772 A1 | 2/2006 | Kanno et al. |
| 2006/0040628 A1 | 2/2006 | Porret et al. |
| 2006/0192645 A1 | 8/2006 | Lee et al. |
| 2006/0284718 A1 | 12/2006 | Baumgartner et al. |
| 2007/0018767 A1 | 1/2007 | Gabara |
| 2007/0020969 A1 | 1/2007 | Yungers |
| 2007/0023424 A1 | 2/2007 | Weber |
| 2007/0029965 A1 | 2/2007 | Hui |
| 2007/0045773 A1 | 3/2007 | Mi et al. |
| 2007/0046544 A1 | 3/2007 | Murofushi et al. |
| 2007/0095913 A1 | 5/2007 | Takahashi et al. |

(56) References Cited

U.S. PATENT DOCUMENTS

| | | |
|---|---|---|
| 2007/0120629 A1 | 5/2007 | Schnell et al. |
| 2007/0126544 A1 | 6/2007 | Wotherspoon et al. |
| 2007/0179570 A1 | 8/2007 | De Taboada et al. |
| 2007/0182367 A1 | 8/2007 | Partovi |
| 2007/0267718 A1 | 11/2007 | Lee |
| 2007/0279287 A1 | 12/2007 | Castaneda et al. |
| 2008/0039332 A1 | 2/2008 | Bernstein et al. |
| 2008/0055178 A1 | 3/2008 | Kim et al. |
| 2008/0062066 A1 | 3/2008 | Arai |
| 2008/0067874 A1 | 3/2008 | Tseng |
| 2008/0150693 A1 | 6/2008 | You et al. |
| 2008/0158092 A1 | 7/2008 | Yakubo et al. |
| 2008/0164840 A1 | 7/2008 | Kato et al. |
| 2008/0164844 A1 | 7/2008 | Kato et al. |
| 2008/0164960 A1 | 7/2008 | Schnell et al. |
| 2008/0197802 A1 | 8/2008 | Onishi et al. |
| 2008/0211320 A1 | 9/2008 | Cook et al. |
| 2008/0277386 A1 | 11/2008 | Haimer |
| 2008/0283277 A1 | 11/2008 | Muramatsu et al. |
| 2008/0303735 A1 | 12/2008 | Fujimoto et al. |
| 2009/0015266 A1 | 1/2009 | Narita et al. |
| 2009/0079628 A1 | 3/2009 | Rofougaran |
| 2009/0085706 A1 | 4/2009 | Baarman et al. |
| 2009/0096413 A1 | 4/2009 | Partovi et al. |
| 2009/0108974 A1 | 4/2009 | Raggam et al. |
| 2009/0134875 A1 | 5/2009 | Tomiha et al. |
| 2009/0140691 A1 | 6/2009 | Jung |
| 2009/0152542 A1 | 6/2009 | Lee et al. |
| 2009/0160262 A1 | 6/2009 | Schmidt |
| 2009/0230777 A1 | 9/2009 | Baarman et al. |
| 2009/0261778 A1 | 10/2009 | Kook |
| 2009/0261936 A1 | 10/2009 | Widjaja et al. |
| 2010/0033290 A1 | 2/2010 | Liu et al. |
| 2010/0038970 A1 | 2/2010 | Cook et al. |
| 2010/0072588 A1 | 3/2010 | Yang |
| 2010/0127660 A1 | 5/2010 | Cook et al. |
| 2010/0141042 A1 | 6/2010 | Kesler et al. |
| 2010/0156344 A1 | 6/2010 | Inoue et al. |
| 2010/0164296 A1 | 7/2010 | Kurs et al. |
| 2010/0201201 A1 | 8/2010 | Mobarhan et al. |
| 2010/0219694 A1 | 9/2010 | Kurs et al. |
| 2010/0289599 A1 | 11/2010 | Knecht et al. |
| 2010/0289709 A1 | 11/2010 | Guan |
| 2010/0295701 A1 | 11/2010 | Denis et al. |
| 2011/0024510 A1 | 2/2011 | Kato et al. |
| 2011/0084656 A1 | 4/2011 | Gao |
| 2011/0101788 A1 | 5/2011 | Sun et al. |
| 2011/0137379 A1 | 6/2011 | Wosmek et al. |
| 2011/0210617 A1 | 9/2011 | Randall |
| 2011/0234155 A1 | 9/2011 | Chen et al. |
| 2011/0241437 A1 | 10/2011 | Kanno |
| 2011/0248891 A1 | 10/2011 | Han et al. |
| 2011/0279198 A1 | 11/2011 | Haner |
| 2012/0010079 A1 | 1/2012 | Sedwick |
| 2012/0062345 A1 | 3/2012 | Kurs et al. |
| 2012/0095531 A1 | 4/2012 | Derbas et al. |
| 2012/0126544 A1 | 5/2012 | Simpson et al. |
| 2012/0169434 A1 | 7/2012 | Masuda et al. |
| 2012/0217819 A1 | 8/2012 | Yamakawa et al. |
| 2012/0222997 A1 | 9/2012 | Potucek et al. |
| 2012/0223595 A1 | 9/2012 | Oodachi et al. |
| 2012/0235500 A1 | 9/2012 | Ganem et al. |
| 2012/0235634 A1 | 9/2012 | Hall et al. |
| 2012/0235636 A1 | 9/2012 | Partovi |
| 2012/0248889 A1 | 10/2012 | Fukushi et al. |
| 2012/0249396 A1 | 10/2012 | Parsche |
| 2012/0274148 A1 | 11/2012 | Sung et al. |
| 2012/0280765 A1 | 11/2012 | Kurs et al. |
| 2012/0306284 A1 | 12/2012 | Lee et al. |
| 2012/0326931 A1 | 12/2012 | Murayama et al. |
| 2013/0067737 A1 | 3/2013 | Singh et al. |
| 2013/0067738 A1 | 3/2013 | Singh et al. |
| 2013/0068499 A1 | 3/2013 | Singh et al. |
| 2013/0068507 A1 | 3/2013 | Singh et al. |
| 2013/0069748 A1 | 3/2013 | Singh et al. |
| 2013/0069749 A1 | 3/2013 | Singh et al. |
| 2013/0069750 A1 | 3/2013 | Singh et al. |
| 2013/0069843 A1 | 3/2013 | Singh et al. |
| 2013/0076154 A1 | 3/2013 | Baarman et al. |
| 2013/0146671 A1 | 6/2013 | Grieshofer et al. |
| 2013/0181535 A1 | 7/2013 | Muratov et al. |
| 2013/0199027 A1 | 8/2013 | Singh et al. |
| 2013/0199028 A1 | 8/2013 | Singh et al. |
| 2013/0200070 A1 | 8/2013 | Singh et al. |
| 2013/0200722 A1 | 8/2013 | Singh et al. |
| 2013/0200968 A1 | 8/2013 | Singh et al. |
| 2013/0200969 A1 | 8/2013 | Singh et al. |
| 2013/0200976 A1 | 8/2013 | Singh et al. |
| 2013/0201589 A1 | 8/2013 | Singh et al. |
| 2013/0205582 A1 | 8/2013 | Singh et al. |
| 2013/0207744 A1 | 8/2013 | Singh et al. |
| 2013/0208389 A1 | 8/2013 | Singh et al. |
| 2013/0208390 A1 | 8/2013 | Singh et al. |
| 2013/0221757 A1 | 8/2013 | Cho et al. |
| 2013/0257362 A1 | 10/2013 | Lim et al. |
| 2013/0285606 A1 | 10/2013 | Ben-Shalom et al. |
| 2013/0300207 A1 | 11/2013 | Wang |
| 2013/0335284 A1 | 12/2013 | Hsu et al. |
| 2014/0008974 A1 | 1/2014 | Miyamoto |
| 2014/0028111 A1 | 1/2014 | Hansen et al. |
| 2014/0035383 A1 | 2/2014 | Riehl |
| 2014/0035793 A1 | 2/2014 | Kato et al. |
| 2014/0041218 A1 | 2/2014 | Signh et al. |
| 2014/0043196 A1 | 2/2014 | Gouchi et al. |
| 2014/0047713 A1 | 2/2014 | Singh et al. |
| 2014/0063666 A1 | 3/2014 | Kallal et al. |
| 2014/0084946 A1 | 3/2014 | Clark et al. |
| 2014/0091756 A1 | 4/2014 | Ofstein et al. |
| 2014/0168019 A1 | 6/2014 | Hirobe et al. |
| 2014/0183971 A1 | 7/2014 | Endo et al. |
| 2014/0197694 A1 | 7/2014 | Asanuma et al. |
| 2014/0203398 A1 | 7/2014 | Sturcken |
| 2014/0231518 A1 | 8/2014 | Yosui |
| 2014/0239892 A1 | 8/2014 | Sawa et al. |
| 2014/0252875 A1 | 9/2014 | Lee |
| 2014/0265617 A1 | 9/2014 | Roy et al. |
| 2014/0266019 A1 | 9/2014 | Pigott |
| 2014/0292100 A1 | 10/2014 | Lee et al. |
| 2014/0333148 A1 | 11/2014 | Uchida |
| 2014/0339913 A1 | 11/2014 | Tsuji et al. |
| 2014/0361628 A1 | 12/2014 | Huang et al. |
| 2015/0054455 A1 | 2/2015 | Kim et al. |
| 2015/0076922 A1 | 3/2015 | Kato et al. |
| 2015/0091502 A1 | 4/2015 | Mukherjee et al. |
| 2015/0102892 A1 | 4/2015 | Yeo et al. |
| 2015/0115723 A1 | 4/2015 | Levo et al. |
| 2015/0115727 A1 | 4/2015 | Carobolante et al. |
| 2015/0130583 A1 | 5/2015 | Zheng et al. |
| 2015/0136858 A1 | 5/2015 | Finn et al. |
| 2015/0137746 A1 | 5/2015 | Lee et al. |
| 2015/0140807 A1 | 5/2015 | Mohammed et al. |
| 2015/0145634 A1 | 5/2015 | Kurz et al. |
| 2015/0145635 A1 | 5/2015 | Kurz et al. |
| 2015/0180440 A1 | 6/2015 | Ishizuka |
| 2015/0207541 A1 | 7/2015 | Kuroda |
| 2015/0222129 A1 | 8/2015 | McCauley et al. |
| 2015/0236513 A1 | 8/2015 | Covic et al. |
| 2015/0236545 A1 | 8/2015 | Hyun et al. |
| 2015/0236550 A1 | 8/2015 | Yang et al. |
| 2015/0280322 A1 | 10/2015 | Saito et al. |
| 2015/0295416 A1 | 10/2015 | Li |
| 2015/0302985 A1 | 10/2015 | Kurs |
| 2015/0318710 A1 | 11/2015 | Lee et al. |
| 2015/0351292 A1 | 12/2015 | Chang et al. |
| 2015/0357827 A1 | 12/2015 | Muratov et al. |
| 2015/0379838 A1 | 12/2015 | Xie et al. |
| 2016/0029266 A1 | 1/2016 | Choi-Grogan et al. |
| 2016/0043571 A1 | 2/2016 | Kesler et al. |
| 2016/0056664 A1 | 2/2016 | Partovi |
| 2016/0072338 A1 | 3/2016 | Makwinski et al. |
| 2016/0099610 A1 | 4/2016 | Leabman et al. |
| 2016/0111208 A1 | 4/2016 | Park et al. |
| 2016/0111889 A1 | 4/2016 | Jeong |
| 2016/0118711 A1 | 4/2016 | Finn et al. |

(56) References Cited

U.S. PATENT DOCUMENTS

| | | |
|---|---|---|
| 2016/0126002 A1 | 5/2016 | Chien et al. |
| 2016/0141899 A1 | 5/2016 | Oo et al. |
| 2016/0149416 A1 | 5/2016 | Ha et al. |
| 2016/0156103 A1 | 6/2016 | Bae et al. |
| 2016/0156215 A1 | 6/2016 | Bae et al. |
| 2016/0224975 A1 | 8/2016 | Na et al. |
| 2016/0233711 A1 | 8/2016 | Miller et al. |
| 2016/0261147 A1 | 9/2016 | Blum et al. |
| 2016/0268847 A1 | 9/2016 | Yuasa |
| 2016/0292669 A1 | 10/2016 | Tunnell et al. |
| 2016/0322156 A1 | 11/2016 | Yeh et al. |
| 2016/0322850 A1 | 11/2016 | Yeh et al. |
| 2016/0322852 A1 | 11/2016 | Yeh et al. |
| 2016/0344196 A1 | 11/2016 | Ahmad et al. |
| 2016/0345472 A1 | 11/2016 | Park et al. |
| 2017/0126544 A1 | 5/2017 | Vigneras et al. |
| 2017/0187238 A1 | 6/2017 | Chong et al. |
| 2017/0279294 A1 | 9/2017 | Fujii |
| 2017/0301462 A1 | 10/2017 | Dela Cruz |
| 2017/0317536 A1 | 11/2017 | Marson et al. |
| 2017/0324267 A1 | 11/2017 | Decker et al. |
| 2017/0345555 A1 | 11/2017 | Jang et al. |
| 2018/0032730 A1 | 2/2018 | Miller et al. |
| 2018/0055175 A1 | 3/2018 | Rho et al. |
| 2018/0090968 A1 | 3/2018 | Pais et al. |
| 2018/0138746 A1 | 5/2018 | Jang |
| 2018/0167107 A1 | 6/2018 | Peralta et al. |
| 2018/0167108 A1 | 6/2018 | Peralta et al. |
| 2018/0167109 A1 | 6/2018 | Peralta et al. |
| 2018/0168057 A1 | 6/2018 | Peralta et al. |
| 2018/0205268 A1 | 7/2018 | Park |
| 2018/0212649 A1 | 7/2018 | Tenno |
| 2018/0316085 A1 | 11/2018 | Park et al. |
| 2019/0006094 A1 | 1/2019 | Furiya et al. |
| 2019/0052124 A1 | 2/2019 | Riehl et al. |
| 2019/0326049 A1 | 10/2019 | Nishimura et al. |

FOREIGN PATENT DOCUMENTS

| | | |
|---|---|---|
| CN | 104037493 A | 9/2014 |
| CN | 104037494 A | 9/2014 |
| EP | 0310396 A1 | 4/1989 |
| EP | 1609503 A1 | 12/2005 |
| EP | 2031729 A2 | 3/2009 |
| EP | 2557630 A1 | 2/2013 |
| EP | 2775564 A1 | 9/2014 |
| EP | 2775565 A1 | 9/2014 |
| JP | H01310518 A | 12/1989 |
| JP | H0582349 A | 4/1993 |
| JP | H0583249 A | 4/1993 |
| JP | H08307114 A | 11/1996 |
| JP | H0993005 A | 4/1997 |
| JP | H10255629 A | 9/1998 |
| JP | 2001344574 A | 12/2001 |
| JP | 2007042569 A | 2/2007 |
| JP | 2008160781 A | 7/2008 |
| JP | 2008205215 A | 9/2008 |
| JP | 2008294285 A | 12/2008 |
| JP | 2008307114 A | 12/2008 |
| JP | 2012147408 A | 8/2012 |
| JP | 2013093429 A | 5/2013 |
| JP | 2014175864 A | 9/2014 |
| JP | 2014175865 A | 9/2014 |
| KR | 20100092741 A | 8/2010 |
| KR | 20130015618 A | 2/2013 |
| KR | 20140111554 A | 9/2014 |
| KR | 20140111794 A | 9/2014 |
| KR | 20140135357 A | 11/2014 |
| KR | 101559939 B1 | 10/2015 |
| KR | 20160128861 A | 11/2016 |
| TW | 201436494 A | 9/2014 |
| TW | 201436495 A | 9/2014 |
| WO | 2008050917 A1 | 5/2008 |
| WO | 2010104569 A1 | 9/2010 |
| WO | 2010129369 A2 | 11/2010 |

OTHER PUBLICATIONS

Exhibit E-10: Invalidity Contentions: '729 Patent in View of Lee '746, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2015/0137746 ("Lee '746"), Apr. 12, 2019, 34 pages.

Exhibit E-11: Invalidity Contentions: '729 Patent in View of Mukherjee, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0091502 ("Mukherjee"), Apr. 12, 2019, 32 pages.

Exhibit E-12: Invalidity Contentions: '729 Patent in View of Asanuma, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2014/0197694 ("Asanuma"), Apr. 12, 2019, 24 pages.

Exhibit E-13: Invalidity Contentions: '729 Patent in View of Takashi, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2014/0008974 ("Takashi"), Apr. 12, 2019, 77 pages.

Exhibit E-14: Invalidity Contentions: '729 Patent in View of Hoon, *NuCurrent v. Samsung Electronics 4merica, Inc. et al.*, Case No. 1:19-cv-00798-DLC (S.D.N.Y.) Invalidity of U.S. Pat. No. 9,941,729 ("The '729 Patent") by Korean Patent Publication No. 20130015618 ("Hoon"), Apr. 12, 2019, 28 pages.

Exhibit E-15 : Invalidity Contentions: '729 Patent in View of Lee '710, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0318710 ("Lee '710"), Apr. 12, 2019, 42 pages.

Exhibit E-16: Invalidity Contentions: '729 Patent in View of Hisanori, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Publication No. 2012-147408 ("Hisanori"), Apr. 12, 2019, 45 pages.

Exhibit E-17: Invalidity Contentions: '729 Patent in View of Muratov Presentation, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Multi-Mode Wireless Power Systems can be a Bridge to the Promised Land of Universal Contactless Charging, presented by Vladimir Muratov ("Muratov Presentation"), Apr. 12, 2019, 57 pages.

Exhibit E-18: Invalidity Contentions: '729 Patent in View of Han, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2017/0353055 A1 ("Han"), Apr. 12, 2019, 46 pages.

Exhibit E-19: Invalidity Contentions: '729 Patent in View of Riehl IEEE, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Wireless Power Systems for Mobile Devices Supporting Inductive and Resonant Operating Modes, by Patrick S. Riehl et al., IEEE Transactions on Microwave Theory and Techniques, vol. 63, No. 3, Mar. 3, 2015 (Riehl IEEE), Apr. 12, 2019, 56 pages.

Exhibit F-01: Invalidity Contentions: '960 Patent in View of Chung Yeon Ho, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by Korean Patent Application Publication 2010/0092741 A ("Chung Yeon Ho"), Apr. 12, 2019, 34 pages.

Exhibit F-02: Invalidity Contentions: '960 Patent in View of Jung, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2009/0140691 A1 ("Chun-Kil Jung"), Apr. 12, 2019, 58 pages.

Exhibit F-03: Invalidity Contentions: '960 Patent in View of Kook, *NuCurrent v. Samsung Electronics America, Inc. et al.*, Case No. 1:19-cv-00798-DLC (S.D.N.Y.) Invalidity of U.S. Pat. No. 8,680,960

(56) References Cited

OTHER PUBLICATIONS ("The '960 Patent") by WIPO Patent Application Publication 2008/050917 A1 ("Kook Yoon-Sang"), Apr. 12, 2019, 30 pages.
Exhibit G-01: Invalidity Contentions: '046 Patent in View of Chung Yeon Ho, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Korean Patent Application Publication 2010/0092741 A ("Chung Yeon Ho"), Apr. 12, 2019, 33 pages.
Exhibit G-02: Invalidity Contentions: '046 Patent in View of Jung, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2009/0140691 A1 ("Chun-Kil Jung"), Apr. 12, 2019, 49 pages.
Exhibit G-03: Invalidity Contentions: '046 Patent in View of Kook, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by WIPO Patent Application Publication 2008/050917 A1 ("Kook Yoon-Sang"), Apr. 12, 2019, 26 pages.
Exhibit H-01: Invalidity Contentions: '591 Patent in View of Chung Yeon Ho, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by Korean Patent Application Publication 2010/0092741 A ("Chung Yeon Ho"), Apr. 12, 2019, 43 pages.
Exhibit H-02: Invalidity Contentions: '591 Patent in View of Jung, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2009/0140691 A1 ("Chun-Kil Jung"), Apr. 12, 2019, 88 pages.
Exhibit H-03: Invalidity Contentions: '591 Patent in View of Kook, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by WIPO Patent Application Publication 2008/050917 A1 ("Kook Yoon-Sang"), Apr. 12, 2019, 49 pages.
Exhibit I-01: Invalidity Contentions: '948 Patent in View of Chung Yeon Ho, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Korean Patent Application Publication 2010/0092741 A ("Chung Yeon Ho"), Apr. 12, 2019, 39 pages.
Exhibit I-02: Invalidity Contentions: '948 Patent in View of Jung, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2009/0140691 A1 ("Chun-Kil Jung"), Apr. 12, 2019, 78 pages.
Exhibit I-03: Invalidity Contentions: '948 Patent in View of Kook, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by WIPO Patent Application Publication 2008/050917 A1 ("Kook Yoon-Sang"), Apr. 12, 2019, 43 pages.
Exhibit J-01 : Invalidity Contentions: '729 Patent in View of Satoshi, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Publication No. 2001-344574 ("Satoshi"), Apr. 12, 2019, 19 pages.
Exhibit J-02: Invalidity Contentions: '729 Patent in View of Takahashi, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2007/0095913 ("Takahashi"), Apr. 12, 2019, 23 pages.
Exhibit J-03: Invalidity Contentions: '729 Patent in View of Baarman '953, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2011/0259953 ("Baarman '953"), Apr. 12, 2019, 31 pages.
Exhibit J-04: Invalidity Contentions: '729 Patent in View of Carobolante, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0115727 ("Carobolante"), Apr. 12, 2019, 12 pages.
Exhibit J-05: Invalidity Contentions: '729 Patent in View of Bae, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2016/0156103 ("Bae"), Apr. 12, 2019, 6 pages.
Exhibit J-06: Invalidity Contentions: '729 Patent in View of Singh, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by U.S. Pat. No. 8,680,960 ("Singh"), Apr. 12, 2019, 3 pages.
Exhibit J-07: Invalidity Contentions: '729 Patent in View of Qi 1.0.1, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Qi System Description, Wireless Power Transfer, vol. 1: Low Power, Part 1: Interface Definition, Version 1.0.1 ("Qi 1.0.1"), Apr. 12, 2019, 14 pages.
Exhibit J-08 : Invalidity Contentions: '729 Patent in View of Narayanan, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Application Note: Wireless Power Charging Coil Considerations, by Raghu Narayanan, Wurth Elektronik ("Narayanan"), Apr. 12, 2019, 6 pages.
Exhibit J-09: Invalidity Contentions: '729 Patent in View of Barcelo, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Application Note 138:Wireless Power User Guide, by Trevor Barcelo, Linear Technology ("Barcelo"), Apr. 12, 2019, 4 pages.
Exhibit K: Family Patents Combinations, *NuCurrent v. Samsung Electronics America, Inc. et al.*, Case No. 1:19-cv-00798-DLC (S.D.N.Y.), Invalidity Contentions, Apr. 12, 2019, 103 pages.
Exhibit L: '729 Patent Combinations, *NuCurrent v. Samsung Electronics America, Inc. et al.*, Case No. 1:19-cv-00798- DLC (S.D.N.Y.), Invalidity Contentions, Apr. 12, 2019, 106 pages.
Extended Search Report dated Sep. 10, 2019 for EP 19188841.1-1216, 11 pages.
First Office Action dated Aug. 5, 2019 for Chinese App. No. 201680058731.9, English Translation, 6 pages.
International Searhing Authority, International Search Report and Written Opinion mailed on Nov. 8, 2017, issued in connection with International Application No. PCT/US2017/048708, filed on Aug. 25, 2017, 10 pages.
International Searhing Authority, International Search Report and Written Opinion mailed on Oct. 14, 2016, issued in connection with International Application No. PCT/US2016/045588, filed on Aug. 4, 2016, 9 pages.
International Searhing Authority, International Search Report and Written Opinion mailed on Feb. 21, 2018, issued in connection with International Application No. PCT/US2017/065329, filed on Dec. 8, 2017, 7 pages.
International Searhing Authority, International Search Report and Written Opinion mailed on Oct. 28, 2016, issued in connection with International Application No. PCT/US2016/047607, filed on Aug. 18, 2016, 7 pages.
IPR2019-00858—*Samsung Electronics Co., Ltd. v. NuCurrent, Inc.*, Petition for Inter Partes Review of U.S. Pat. No. 3,680,960, Mar. 22, 2019, 90 pages.
IPR2019-00858, *Samsung Electronics Co., Ltd. vs. NuCurrent, Inc.*, Samsung Exhibit 1042—Order Denying [167] Motion for Preliminary Injunction, *NuCurrent, Inc. vs. Samsung Electronics Co., Ltd. et al.*, Case No. 1:19-cv-00798-DLC, Jul. 2, 2019, 15 pages.
IPR2019-00858—*Samsung Electronics Co., Ltd. v. NuCurrent, Inc.*, Ex. 1001, U.S. Pat. No. 8,680,960 to Singh et al., Mar. 22, 2019, 50 pages.
IPR2019-00859—*Samsung Electronics Co., Ltd. v. NuCurrent, Inc.*, Petition for Inter Partes Review of U.S. Pat. No. 9,300,046, Mar. 22, 2019, 87 pages.
IPR2019-00859—*Samsung Electronics Co., Ltd. vs. NuCurrent, Inc.*, Decision Granting Institution of Inter Partes Review for U.S. Pat. No. 9,300,046 B2, Sep. 25, 2019, 48 pages.

(56) References Cited

OTHER PUBLICATIONS

IPR2019-00859—*Samsung Electronics Co., Ltd.* vs. *NuCurrent, Inc.*, Ex. 1017—U.S. Pat. No. 5,812,344 to Balakrishnan, Mar. 22, 2019, 12 pages.
IPR2019-00859—*Samsung Electronics Co., Ltd.* vs. *NuCurrent, Inc.*, Ex. 102—US20070126544A1 to Wotherspoon, Mar. 22, 2019, 6 pages.
IPR2019-00859—*Samsung Electronics Co., Ltd.* vs. *NuCurrent, Inc.*, Samsung Ex. 1042—Order Denying [167] Motion for Preliminary Injunction, Jul. 2, 2019, 15 pages.
IPR2019-00860—Ex. 1022 U.S. Pat. No. 9,912,173 to Tseng, Mar. 6, 2018, 31 pages.
IPR2019-00860—Ex. 1023 U.S. Pat. No. 7,248,138 to Chiang, Jul. 24, 2007, 18 pages.
Exhibit C-27: Invalidity Contentions: '591 Patent in View of Von Novak, III, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 9,559,526 B2 ("William H. Von Novak, III"), Apr. 12, 2019, 81 pages.
Exhibit C-28: Invalidity Contentions: '591 Patent in View of Yamakawa, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2012/0217819 A1 ("Yamakawa"), Apr. 12, 2019, 46 pages.
Exhibit C-29: Invalidity Contentions: '591 Patent in View of Yoon & Allen, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by Embedded Conductor Technology for Micromachined Rf Elements ("Yoon & Allen"), Apr. 12, 2019, 44 pages.
Exhibit C-30: Invalidity Contentions: '591 Patent in View of Bae, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. Granted Publication No. 6,897,830 B2 ("Bae"), Apr. 12, 2019, 88 pages.
Exhibit C-31: Invalidity Contentions: '591 Patent in View of the Blackberry Z30, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by the Blackberry Z30, Apr. 12, 2019, 180 pages.
Exhibit C-32: Invalidity Contentions: '591 Patent in View of the LG G2, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by the LG G2, Apr. 12, 2019, 557 pages.
Exhibit C-33: Invalidity Contentions: Invalidity Contentions: '591 Patent in View of the LG G3 *NuCurrent v. Samsung Electronics America, Inc. et al.*, Case No. 1:19-cv-00798-DLC (S.D.N.Y.) Invalidity of U.S. Pat. No. 8,698,591 ("The 591 Patent") by the LG G3, Apr. 12, 2019, 266 pages.
Exhibit C-34: Invalidity Contentions: '591 Patent in View of the LG Nexus 5, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by the LG Nexus 5, Apr. 12, 2019, 468 pages.
Exhibit D-01: Invalidity Contentions: '948 Patent in View of Jitsuo, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Japanese Patent Application Publication JP05082349A ("Jitsuo"), Apr. 12, 2019, 54 pages.
Exhibit D-02: Invalidity Contentions: '948 Patent in View of Kurs, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2010/0219694 A1 ("Kurs"), Apr. 12, 2019, 59 pages.
Exhibit D-03: Invalidity Contentions: '948 Patent in View of Sheng-Yuan, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2007/267718 A1 ("Sheng-Yuan"), Apr. 12, 2019, 77 pages.
Exhibit D-04: Invalidity Contentions: '948 Patent in View of Wotherspoon, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2007/0126544 A1 ("Wotherspoon"), Apr. 12, 2019, 52 pages.
Exhibit D-05: Invalidity Contentions: '948 Patent in View of Baarman, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2009/0230777A1 ("David W. Baarman"), Apr. 12, 2019, 52 pages.
Exhibit D-06: Invalidity Contentions: '948 Patent in View of Bae, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. Granted Publication 6,897,830 B2 ("Bae"), Apr. 12, 2019, 82 pages.
Exhibit D-07: Invalidity Contentions: '948 Patent in View of Burghartz & Rejaei, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by on the Design of RF Spiral Inductors on Silicon ("Burghartz & Rejaei"), Apr. 12, 2019, 52 pages.
Exhibit D-08: Invalidity Contentions: '948 Patent in View of Ganem, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0235500 A1 ("Steven J. Ganem"), Apr. 12, 2019, 92 pages.
Exhibit D-09: Invalidity Contentions: '948 Patent in View of Gao, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2011/084656 A1 ("Gao"), Apr. 12, 2019, 44 pages.
Exhibit D-10: Invalidity Contentions: '948 Patent in View of Hasegawa '215, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by Japanese Patent Application Publication 2008-205215 A ("Hasegawa Minoru '215"), Apr. 12, 2019, 16 pages.
Exhibit D-11: Invalidity Contentions: '948 Patent in View of Hasegawa Michio '631, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. Granted Publication 4,959,631 A ("Hasegawa Michio '631"), Apr. 12, 2019, 37 pages.
Exhibit D-12: Invalidity Contentions: '948 Patent in View of Hasegawa '518, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by J.P. Patent Application Publication 01310518 A ("Hasegawa Michio '518"), Apr. 12, 2019, 78 pages.
Exhibit D-13: Invalidity Contentions: '948 Patent in View of Ishihara, *NuCurrent v. Samsung Electronics America, Inc. et al.*, Case No. 1:19-cv-00798-DLC (S.D.N.Y.) Invalidity of U.S. Pat. No. 8,710,948 ("the '948 Patent") by 2008/294285 A ("IshiharaKeien"), Apr. 12, 2019, 38 pages.
Exhibit D-14: Invalidity Contentions: '948 Patent in View of Kato, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2008/164840 A1 ("Hiroshi Kato"), Apr. 12, 2019, 34 pages.
Exhibit D-15: Invalidity Contentions: '948 Patent in View of Kato, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2008/164844 A1 ("Hiroshi Kato"), Apr. 12, 2019, 39 pages.
Exhibit D-16: Invalidity Contentions: '948 Patent in View of Kimura, *NuCurrent v. Samsung Electronics America, Inc. et al.*, Case No. 1:19-cv-00798-DLC (S.D.N.Y.) Invalidity of U.S. Pat. No.

(56) References Cited

OTHER PUBLICATIONS 8,710,948 ("The '948 Patent") by U.S. Patent Application Publication 2002/071003 A1 ("Isao Kimura"), Apr. 12, 2019, 50 pages.
Exhibit D-17: Invalidity Contentions: '948 Patent in View of Kurs '765, *NuCurrent* v. *Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2012/0280765 A1 ("Kurs '765"), Apr. 12, 2019, 57 pages.
Exhibit D-18: Invalidity Contentions: '948 Patent in View of Misumi, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by Japanese. Patent Application Publication JP 10255629 A ("Misumi Shuichi"), Apr. 12, 2019, 34 pages.
Exhibit D-19: Invalidity Contentions: '948 Patent in View of Nakatani, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2004/227608 A1 ("Toshifumi Nakatani"), Apr. 12, 2019, 56 pages.
Exhibit D-20: Invalidity Contentions: '948 Patent in View of Partovi '367, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2007/0182367 A1 ("Partovi '367"), Apr. 12, 2019, 51 pages.
Exhibit D-21: Invalidity Contentions: '948 Patent in View of Partovi '413, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2009/0096413 A1 ("Afshin Partovi '413"), Apr. 12, 2019, 51 pages.
Exhibit D-22: Invalidity Contentions: '948 Patent in View of Partovi '636, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0235636 A1 ("Afshin Partovi '636"), Apr. 12, 2019, 67 pages.
Exhibit D-23: Invalidity Contentions: '948 Patent in View of 01 0.95, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by Qi System Description, Wireless Power Transfer, vol. 1: Low Power, Version 0.95 ("Qi 0.95"), Apr. 12, 2019, 28 pages.
Exhibit D-24: Invalidity Contentions: '948 Patent in View of Qi 1.0.1, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by Qi System Description, Wireless Power Transfer, vol. 1: Low Power, Part 1: Interface Definition, Version 1.0.1 ("Qi 1.0.1"), Apr. 12, 2019, 55 pages.
Exhibit D-25: Invalidity Contentions: '948 Patent in View of Shima, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 5,808,587 ("Hiroshi Shima"), Apr. 12, 2019, 94 pages.
Exhibit D-26: Invalidity Contentions: '948 Patent in View of Sun, *NuCurrent* v. *Samsung Electronics America, Inc. et al.*, Case No. 1:19-cv-00798-DLC (S.D.N.Y.) Invalidity of U.S. Pat. No. 8,710,948 ("the '948 Patent") by 2011/0101788 A1 ("Sun"), Apr. 12, 2019, 63 pages.
Exhibit D-27: Invalidity Contentions: '948 Patent in View of Tseng, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 9,912, 173 B2 ("Ryan Tseng"), Apr. 12, 2019, 75 pages.
Exhibit D-28: Invalidity Contentions: '948 Patent in View of Von Novak, III, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 9,559,526 B2 ("William H. Von Novak, III"), Apr. 12, 2019, 73 pages.

Exhibit D-29: Invalidity Contentions: '948 Patent in View of Yamakawa, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0217819 A1 ("Yamakawa"), Apr. 12, 2019, 42 pages.
Exhibit D-30: Invalidity Contentions: '948 Patent in View of Yoon & Allen, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by Embedded Conductor Technology for Micromachined Rf Elements ("Yoon & Allen"), Apr. 12, 2019, 41 pages.
Exhibit D-31—Invalidity Contentions: '948 Patent in View of the Blackberry Z30, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by the Blackberry Z30, Apr. 12, 2019, 168 pages.
Exhibit D-32: Invalidity Contentions: '948 Patent in View of the LG G2, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by the LG G2, Apr. 12, 2019, 511 pages.
Exhibit D-33—Invalidity Contentions: '948 Patent in View of LG G3, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by the LG G3, Apr. 12, 2019, 249 pages.
Exhibit D-34—Invalidity Contentions: '948 Patent in View of the LG Nexus 5, *NuCurrent* v. *Samsung Electronics America, Inc. et al.*, Case No. 1:19-cv-00798-DLC (S.D.N.Y.) Invalidity of U.S. Pat. No. 8,710,948 ("the '948 Patent") by the LG Nexus 5, Apr. 12, 2019, 434 pages.
Exhibit E-01: Invalidity Contentions: '729 Patent in View of Ha, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2016/0149416 ("Ha"), Apr. 12, 2019, 99 pages.
Exhibit E-02: Invalidity Contentions: '729 Patent in View of Riehl, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication 2014/0035383 ("Riehl"), Apr. 12, 2019, 50 pages.
Exhibit E-03 : Invalidity Contentions: '729 Patent in View of Baarman '154, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2013/0076154 ("Baarman '154"), Apr. 12, 2019, 42 pages.
Exhibit E-04: Invalidity Contentions: '729 Patent in View of Kanno, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication 2011/0241437 ("Kanno"), Apr. 12, 2019, 30 pages.
Exhibit E-05: Invalidity Contentions: '729 Patent in View of Kazuya, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Application Publication 2013093429 ("Kazuya"), Apr. 12, 2019, 32 pages.
Exhibit E-06: Invalidity Contentions: '729 Patent in View of Muratov, *NuCurrent* v. *Samsung Electronics America, Inc. et al.*, Case No. 1:19-cv-00798-DLC (S.D.N.Y.) Invalidity of U.S. Pat. No. 3,941,729 ("The '729 Patent") by United States Patent Application Publication No. 2015/0357827 ("Muratov"), Apr. 12, 2019, 35 pages.
Exhibit E-07: Invalidity Contentions: '729 Patent in View of Sung, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2012/0274148 ("Sung"), Apr. 12, 2019, 27 pages.
Exhibit E-08 : Invalidity Contentions: '729 Patent in View of Kurz '635, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0145635 ("Kurz '635"), Apr. 12, 2019, 133 pages.

(56) References Cited

OTHER PUBLICATIONS

IPR2019-00860—Ex. 1024 U.S. Pat. No. 5,084,958 to Yerman et al., Feb. 4, 1992, 20 pages.
IPR2019-00860—Ex. 1028-U.S. Pat. No. 9,820,374 to Bois et al., Nov. 14, 2017, 9 pages.
IPR2019-00860—Ex. 1029 U.S. Pat. No. 7,601,919 to Phan et al., Oct. 13, 2009, 14 pages.
IPR2019-00860—Ex. 1030 U.S. Pat. No. 5,108,825 to Wojnarowski et al., Apr. 28, 1992, 10 pages.
IPR2019-00860—Ex. 1034—U.S. Pat. No. 6,608,363 to Fazelpour, Aug. 19, 2003, 8 pages.
IPR2019-00860—*Samsung Electronics Co., Ltd. v. NuCurrent, Inc.*, Decision Denying Institution of Inter Partes Review re U.S. Pat. No. 8,680,960 B2, Sep. 25, 2019, 6 pages.
IPR2019-00860—*Samsung Electronics Co., Ltd. v. NuCurrent, Inc.*, Petition for Inter Partes Review of U.S. Pat. No. 8,680,960, Mar. 22, 2019, 86 pages.
IPR2019-00860—Samsung Exhibit 1042, *Samsung Electronics Co., Ltd. v. NuCurrent, Inc.*, Order Denying [167] Motion for Preliminary Injunction, *NuCurrent, Inc. v. Samsung Electronics Co., Ltd. et al.*, Case 1:19-cv-00798-DLC, Jul. 2, 2019, 15 pages.
IPR2019-00861—*Samsung Electronics Co., Ltd. v. NuCurrent, Inc.*, Petition for Inter Partes Review of U.S. Pat. No. 9,300,046, Mar. 22, 2019, 89 pages.
IPR2019-00862, *Samsung Electronics Co., Ltd. v. NuCurrent, Inc.*, Samsung Exhibit 1042—Order Denying [167] Motion for Preliminary injunction, *NuCurrent, Inc. vs. Samsung Electronics Co., Ltd. et al.*, Case No. 1:19-cv-00798- DLC, Jul. 2, 2019, 15 pages.
IPR2019-00862—*Samsung Electronics Co., Ltd. v. NuCurrent, Inc.*, Petition for Inter Partes Review of U.S. Pat. No. 8,710,948, Mar. 22, 2019, 88 pages.
IPR2019-00863, *Samsung Electronics Co., Ltd. v. NuCurrent, Inc.*, Decision Granting Institution of Inter Partes Review re U.S. Pat. No. 8,698,591 B2, Oct. 7, 2019, 42 pages.
IPR2019-00863—Ex. 1002—*Samsung Electronics Co., Ltd. v. NuCurrent, Inc.*, Corrected Dr. Steven Leeb Declaration, Mar. 22, 2019, 124 pages.
IPR2019-01217—*Samsung Electronics Co., Ltd. v. NuCurrent, Inc.*, Petition for Inter Partes Review of U.S. Pat. No. 9,941,729, Jun. 19, 2019, 90 pages.
IPR2019-01217—Ex. 1001—U.S. Pat. No. 9,941,729, Peralta, Apr. 10, 2018, 48 pages.
IPR2019-01217—Ex. 1002—*Samsung Electronics Co., Ltd. v. NuCurrent, Inc.*, Declaration of R. Jacob Baker, Ph.D., Re., in Support of Petition for Inter Partes Review of U.S. Pat. No. 9,941,729, Jun. 17, 2019, 143 pages.
IPR2019-01217—Ex. 1003—CV of R. Jacob Baker, Jun. 19, 2019, 35 pages.
IPR2019-01217—Ex. 1004—U.S. Appl. No. 14/821,065, filed Aug. 7, 2015, part 1, 330 pages.
IPR2019-01217—Ex. 1004—U.S. Appl. No. 14/821,065, filed Aug. 7, 2015, part 3, 230 pages.
IPR2019-01217—Ex. 1004—U.S. Appl. No. 14/821,065, filed Aug. 7, 2015, part 4, 299 pages.
IPR2019-01217—Ex. 1004—U.S. Appl. No. 14/821,065, part 2, filing date Aug. 7, 2015, 430 pages.
IPR2019-01217—Ex.1015—Wotherspoon—US 2007/0126544, Jun. 7, 2007, 6 pages.
IPR2019-0863, *Samsung Electronics Co., Ltd. v. NuCurrent, Inc.*, Petition for Inter Partes Review of U.S. Pat. No. 8,698,591, Mar. 22, 2019, 89 pages.
Lee, Y., "Antenna Circuit Design for RFID Applications", 2003 Microchip Technology, AN710, 50 pages.
Machine Translation of Jang KR-20160128861-A, Year: 2020.
Muratov, V., "Multi-Mode Wireless Power Systems can be a bridge to the Promised Land of Universal Contactless charging", Mediatek, Inc., Nov. 20, 2014, 15 pages.
Narayanan, R., "Wireless Power Charging Coil Changing Considerations", Wurth Elektronik, Feb. 23, 2015, 9 pages.

Notification of Decision of Rejection dated May 14, 2019 for KR 10-2013-0026135, 8 pages.
Notification of Decision of Rejection dated May 14, 2019 for KR App. No. 10-2013-0025858, with English Translation, & pages.
Office Action dated Apr. 27, 2018 in corresponding TW Application No. 102108345, 11 pages.
Office Action dated Aug. 23, 2017 in corresponding CN Application No. 201310074946.8, 10 pages.
Office Action dated Aug. 25, 2017 in corresponding CN Application No. 201310075086.X, 10 pages.
Office Action dated Dec. 12, 2017 issued in corresponding Japanese Patent Application No. 2013-047048, 11 pages.
Office Action dated Feb. 21, 2017, issued in corresponding Taiwanese Patent Application No. 102108342, 10 pages.
Office Action dated Jan. 31, 2017 in corresponding JP Application No. 2013-047049, 5 pages.
Office Action dated Jun. 29, 2017 issued in corresponding EP Patent Application No. 14000885.5, 4 pages.
Office Action dated Mar. 21, 2017 issued in corresponding Japanese Patent Application No. 2013-047048, 12 pages.
Office Action dated Mar. 27, 2018 issued in corresponding Chinese Patent Application No. 201310075086.X, 12 pages.
Office Action dated Mar. 30, 2018 issued in corresponding Chinese Patent Application No. 201310074946.8, 12 pages.
Office Action dated May 8, 2018, issued in corresponding Japanese Patent Application No. 2013-047048, 2 pages.
Office Action dated Nov. 28, 2017 in corresponding JP Application No. 2013-047049, 5 pages.
Office Action dated Oct. 29, 2018 in corresponding KR Application No. 10-2013-0025858, 12 pages.
Office Action dated Oct. 29, 2018 in corresponding KR Application No. 10-2013-0026135, 12 pages.
Office Action dated Sep. 12, 2018 in corresponding CN Application No. 201310074946.8, 9 pages.
Office Action dated Sep. 12, 2018 in corresponding CN Application No. 201310075086.X, 10 pages.
Office Action dated Sep. 27, 2016 in corresponding EP Application No. 13 001 121.6, 6 pages.
Office Action dated Sep. 27, 2016 in corresponding EP Application No. 13 001 130.7 6, pages.
Paul A., et al., "Electro Magnetic Shielding Effectiveness of High Density Polyethylene based Composite Materials" International Journal of Science and Research (IJSR), Apr. 2015, vol. 4(5), pp. 2184-2187.
PGR2019-00049—Ex. 1002—*Samsung Electronics Co., Ltd. v. NuCurrent, Inc.*, Declaration of Jacob Baker, Ph.D., P. E. In Support of Petition for Post-Grant Review of U.S. Pat. No. 10,063,100, May 27, 2019, 141 pages.
PGR2019-00049—*Samsung Electronics Co., Ltd. v. NuCurrent, Inc.*, Petition for Post-Grant Review re U.S. Pat. No. 10,063,100, May 28, 2019, 112 pages.
Barcelo T., "Wireless Power User Guide", Linear Technology, Application Note 138, Oct. 2013, 8 pages.
Burghartz, J., "On the Design of RF Spiral Inductors on Silicon", IEEE Transactions on Electron Devices, vol. 50, No. 3, Mar. 2003, pp. 718-729.
Decision of Dismissal of Amendment issued in corresponding Japanese Patent Application No. 2013-047048, dated May 8, 2018, 7 pages.
EP Communication pursuant to Rule 62 EPC regarding extended European Search Report dated May 15, 2019, for EP App. No. 16835665.7-1212, 16 pages.
EP Office Communication Pursuant to Article 94(3) dated Jan. 17, 2019 for EP App. No. 13001121.6-1216, 4 pages.
European Patent Office, Extended European Search Report mailed on Aug. 1, 2013, issued in connection with EP Application No. 13001121.6, 6 pages.
European Patent Office, Extended European Search Report mailed on Aug. 1, 2013, issued in connection with EP Application No. 13001130.7, 6 pages.
European Patent Office, Extended European Search Report mailed on Nov. 4, 2014, issued in connection with EP Application No. 14000885.5, 8 pages.

(56) References Cited

OTHER PUBLICATIONS

European Patent Office, Extended European Search Report mailed on Aug. 7, 2014, issued in connection with EP Application No. 10751119.8, 12 pages.
European Patent Office, Extended European Search Report mailed on Jun. 12, 2019, issued in connection with EP Application No. 19154162.2, 9 pages.
European Patent Office, Extended European Search Report mailed on Dec. 17, 2019, issued in connection with EP Application No. 17879649.6, 9 pages.
European Patent Office, Partial Supplementary European Search Report mailed on Feb. 14, 2019, issued in connection with EP Application No. 16835665.7, 10 pages.
Ex. 1001 U.S. Pat. No. 8,698,591, Singh, Apr. 15, 2014, 49 pages.
Ex. 1001 U.S. Pat. No. 8,710,948 to Singh et al., Apr. 29, 2014, 49 pages.
Ex. 1001 U.S. Pat. No. 9,300,046 to Singh et al., Mar. 29, 2016, 50 pages.
Ex. 1001—U.S. Pat. 10,063,100, Singh, Aug. 28, 2018, 48 pages.
Ex. 1003—CV of Dr. Steven B. Leeb, Mar. 22, 2019, 7 pages.
Ex. 1004 File History of U.S. Pat. No. 8,710,948 to Singh et al., Apr. 29, 2014, 213 pages.
Ex 1004—File History for U.S. Pat. No. 8,680,960, Singh, Mar. 25, 2014, 201 pages. (in two attachments due to size).
Ex. 1004—File History of U.S. Appl. No. 14/821,157, Aug. 7, 2015, Part 1, 475 pages.
Ex. 1004—File History of U.S. Appl. No. 14/821,157, Aug. 7, 2015, Part 2, 475 pages.
Ex. 1004—File History of U.S. Appl. No. 14/821,157, Part 3, Aug. 7, 2015, 438 pages.
Ex. 1004—Prosecution History of U.S. Pat. No. 8,698,591, Singh, Apr. 15, 2014, 180 pages.
Ex. 1004—Prosecution History of U.S. Pat. No. 9,300,046, Singh, Mar. 29, 2016, 322 pages (in two attachments A and B) due to size.
Ex. 1005—U.S. Publication 2014-0035383 to Riehl, Feb. 6, 2014, 11 pages.
Ex. 1005—U.S. Pat. No. 20070267718A1 to Lee, Nov. 22, 2007, 13 pages.
Ex. 1006—Riehl P.S., et al., "Wireless Power Systems for Mobile Devices Supporting Inductive and Resonant Operating Modes," IEEE Transactions on Microwave Theriory and Techniques, Mar. 2015, vol. 63, No. 3, pp. 780-790 (17 pages).
Ex 1006—Semat—Physics Chapters 29-32, 81 pages, (1958).
Ex. 1007 U.S. Publication 2011/0241437 to Kanno, Oct. 6, 2011, 21 pages.
Ex. 1008—U.S. Publication 2012/0274148 to Sung et al., Nov. 1, 2012, 13 pages.
Ex. 1009—JP Patent No. 2013-93429 to Kazuya, May 16, 2013, 27 pages.
Ex 1009—U.S. Pat. No. 20090096413 to Partovi, Apr. 16, 2009, 88 pages.
Ex. 1010—IEEE Standard Dictionary of Electrical and Electronics Terms, Sixth Edition (1996), 9 pages.
Ex. 1010—U.S. Publication No. 2015/0091502 to Mukherjee et al., Apr. 2, 2015, 7 pages.
Ex. 1011—KR Patent No. 10-2013-0045307 to Yu, May 3, 2013, 45 pages.
Ex. 1011—U.S. Pat. No. 20070089773A1 to Koester et al., Apr. 26, 2007, 26 pages.
Ex. 1012—U.S. Pat. No. 20120280765 to Kurs, Nov. 8, 2012, 122 pages.
Ex. 1012—IEE Transactions on microwave theory and techniques, New York, NY 1953, 17 pages.
Ex. 1012—U.S. Pat. No. 6,432,497 to Bunyan, Aug. 13, 2002, 12 pages.
Ex. 1013—Asa, et al., "A Novel Multi-Level Phase-Controlled Resonant Inverter with Common Mode Capacitor for Wireless EV Chargers," 2015, 6 pages.
Ex. 1014 U.S. Pat. No. 6,083,842 to Cheung et al., Jun. 4, 2000, 8 pages.

Ex. 1014—Abstract of a Novel Multi-Level Phase-Controlled Resonant Inverter with Common Mode Capacitor for Wireless EV Chargers, IEEE XPlore Digital Library, Jun. 14-17, 2015, 2 pages.
Ex. 1015 Reinhold, et al., "Efficient Antenna Design of Inductive Coupled RFID-Systems with High Power Demand," Journal of Communication, Nov. 2007, vol. 2, No. 6, pp. 14-23.
Ex. 1016 U.S. Pat. No. 4,549,042 to Akiba et al., Oct. 22, 1985, 8 pages.
Ex. 1018—Wheeler, "Formulas for the Skin Effect," Proceeding of the I.R.E, Sep. 1942, pp. 412-424.
Ex. 1019—Kyriazidou—U.S. Pat. No. 7,236,080, Jun. 26, 2007, 12 pages.
Ex. 1020 Alldred, et al., "A 1.2 V, 60 Ghz Radio Receiver With Onchip Transformers and Inductors in 90 nm CMOS," Proc. IEEE Compound Semiconductor Integrated Circuits SYmp., pp. 51-54, Nov. 2006 ("Alldred"), 12 pages.
Ex. 1031 Ahn U.S. Pat. No. 7,030,725, Apr. 18, 2006, 9 pages.
Ex. 1032—U.S. Pat. No. 5,745,331 to Shamouilian et al., Apr. 28, 1998, 23 pages.
Ex. 1033—Hu, et al., "AC Resistance to Planar Power Inductors and the Quasidistributed Gap Technique," IEEE Transactions on Power Electronics, vol. 16, No. 4, Jul. 2001 ("Hu"), 13 pages.
Exhibit B-11: Invalidity Contentions: '046 Patent in View of Hasegawa '518, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by J.P. Patent Application Publication 01310518 A ("Hasegawa Michio '518"), Apr. 12, 2019, 69 pages.
Exhibit B-12: Invalidity Contentions: '046 Patent in View of Hasegawa Michio '631, *NuCurrent v. Samsung Electronics America, Inc. et al.*, Case No. Case No. 1:19-cv-00798-DLC (S.D.N.Y.) Invalidity of U.S. Pat. No. 9,300,046 ("The '046 Patent") by U.S. Pat. No. Granted Publication 4,959,631 A ("Hasegawa Michio '631"), Apr. 12, 2019, 37 pages.
Exhibit B-13: Invalidity Contentions: '046 Patent in View of Ishihara, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by JP Patent Application Publication 2008/294285 A ("Ishihara Keien"), Apr. 12, 2019, 33 pages.
Exhibit B-14: Invalidity Contentions: '046 Patent in View of Kato '840, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by U.S. Patent Application Publication 2008/164840 A1 ("Hiroshi Kato"), Apr. 12, 2019, 32 pages.
Exhibit B-15: Invalidity Contentions: '046 Patent in View of Kato '844, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2008/164844 A1 ("Hiroshi Kato"), Apr. 12, 2019, 37 pages.
Exhibit B-16: Invalidity Contentions: '046 Patent in View of Inventor Kimura, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2002/071003 A1 ("Isao Kimura"), Apr. 12, 2019, 53 pages.
Exhibit B-17: Invalidity Contentions: '046 Patent in View of Kurs 765, *NuCurrent v. Samsung Electronics America, Inc. et al.*, Case No. 1:19-cv-00798-DLC (S.D.N.Y.) Invalidity of U.S. Pat. No. 9,300,046 ("the '046 Patent") by 2012/0280765 A1 ("Kurs'765"), Apr. 12, 2019, 50 pages.
Exhibit B-18: Invalidity Contentions: '046 Patent in View of Misumi, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Japanese. Patent Application Publication JP 10255629 A ("Misumi Shuichi"), Apr. 12, 2019, 33 pages.
Exhibit B-19: Invalidity Contentions: '046 Patent in View of Nakatani, *NuCurrent v. Samsung Electronics America, Inc. et al.*, Case No. 1:19-cv-00798-DLC (S.D.N.Y.) Invalidity of U.S. Pat. No. 9,300,046 ("the '046 Patent") by US 2004/227608 A1 ("Toshifumi Nakatani"), Apr. 12, 2019, 51 pages.
Exhibit B-20: Invalidity Contentions: '046 Patent in View of Partovi '367, *NuCurrent v. Samsung Electronics America, Inc. et al.*, Case

(56) References Cited

OTHER PUBLICATIONS

No. 1:19-cv-00798-DLC (S.D.N.Y.) Invalidity of U.S. Pat. No. 9,300,046 ("The '046 Patent") by U.S. Patent Application Publication 2007/0182367 A1 ("Partovi '367"), Apr. 12, 2019, 37 pages.
Exhibit B-21: Invalidity Contentions '046 Patent in View of Inventor Partovi '413, NuCurrent v. Samsung Electronics America, Inc. et al., Case No. 1:19-cv-00798-DLC (S.D.N.Y.) Invalidity of U.S. Pat. No. 9,300,046 ("The '046 Patent") by U.S. Patent Application Publication 2009/0096413 A1 ("Afshin Partovi '413"), Apr. 12, 2019, 39 pages.
Exhibit B-22: Invalidity Contentions: '046 Patent in View of Partovi '636, NuCurrent v. Samsung Electronics America, Inc. et al., Case No. 1:19-cv-00798-DLC (S.D.N. Y.) Invalidity of U.S. Pat. No. 9,300,046 ("The '046 Patent") by U.S. Patent Application Publication 2012/0235636 A1 ("Afshin Partovi '636"), Apr. 12, 2019, 55 pages.
Exhibit B-23: Invalidity Contentions: '046 Patent in View of 01 0.95, NuCurrent v. Samsung Electronics America, Inc. et al., Case No. 1:19-cv-00798-DLC (S.D.N.Y.) Invalidity of U.S. Pat. No. 9,300,046 ("The '046 Patent") by Qi System Description, Wireless Power Transfer, vol. 1: Low Power, Version 0.95 ("Qi 0.95"), Apr. 12, 2019, 23 pages.
Exhibit B-24: Invalidity Contentions: '046 Patent in View of Qi 1.0.1, NuCurrent v. Samsung Electronics America, Inc. et al., Case No. 1:19-cv-00798-DLC (S.D.N.Y.) Invalidity of U.S. Pat. No. 9,300,046 ("The '046 Patent") by Qi System Description, Wireless Power Transfer, vol. 1: Low Power, Part 1: Interface Definition, Version 1.0.1 ("Qi 1.0.1"), Apr. 12, 2019, 44 pages.
Exhibit B-25: Invalidity Contentions: '046 Patent in View of Shima, NuCurrent v. Samsung Electronics America, Inc. et al., Case No. 1:19-cv-00798-DLC (S.D.N.Y.) Invalidity of U.S. Pat. No. 9,300,046 ("the '046 Patent") by U.S. Pat. No. 5,808,587 A "HiroshiShima"), Apr. 12, 2019, 76 pages.
Exhibit B-26: Invalidity Contentions: '046 Patent in View of Sun, NuCurrent v. Samsung Electronics America, Inc. et al., Case No. 1:19-cv-00798-DLC (S.D.N.Y.) Invalidity of U.S. Pat. No. 9,300,046 ("The '046 Patent") by U.S. Patent Application Publication 2011/0101788 A1 ("Sun"), Apr. 12, 2019, 55 pages.
Exhibit B-27: Invalidity Contentions: '046 Patent in View of Tseng, NuCurrent v. Samsung Electronics America, Inc. et al., Case No. 1:19-cv-00798-DLC (S.D.N.Y.) Invalidity of U.S. Pat. No. 9,300,046 ("The '046 Patent") by U.S. Pat. No. 9,912,173 B2 ("Ryan Tseng"), Apr. 12, 2019, 62 pages.
Exhibit B-28: Invalidity Contentions: '046 Patent in View of Von Novak, III, NuCurrent v. Samsung Electronics America, Inc. et al., Case No. 1:19-cv-00798-DLC (S.D.N.Y.) Invalidity of U.S. Pat. No. 9,300,046 ("The '046 Patent") by U.S. Pat. No. 9,559,526 B2 ("William H. Von Novak, III"), Apr. 12, 2019, 50 pages.
Exhibit B-29: Invalidity Contentions: '046 Patent in View of Yamakawa, NuCurrent v. Samsung Electronics America, Inc. et al., Case No. 1:19-cv-00798-DLC (S.D.N.Y.) Invalidity of U.S. Pat. No. 9,300,046 ("The '046 Patent") by U.S. Patent Application Publication 2012/0217819 A1 ("Yamakawa"), Apr. 12, 2019, 36 pages.
Exhibit B-30: Invalidity Contentions: '046 Patent in View of Yoon & Allen, NuCurrent v. Samsung Electronics America, Inc. et al., Case No. 1:19-cv-00798-DLC (S.D.N.Y.) Invalidity of U.S. Pat. No. 9,300,046 ("The '046 Patent") by Embedded Conductor Technology for Micromachined Rf Elements ("Yoon & Allen"), Apr. 12, 2019, 39 pages.
Exhibit B-31: Invalidity Contentions: '046 Patent in View of the Blackberry Z30, NuCurrent v. Samsung Electronics America, Inc. et al., Case No. 1:19-cv-00798-DLC (S.D.N.Y.) Invalidity of U.S. Pat. No. 9,300,046 ("The '046 Patent") by the Blackberry Z30, Apr. 12, 2019, 135 pages.
Exhibit B-32: Invalidity Contentions: '046 Patent in View of the LG G2, NuCurrent v. Samsung Electronics America, Inc. et al., Case No. 1:19-cv-00798-DLC (S.D.N.Y.) Invalidity of U.S. Pat. No. 9,300,046 ("the '046 Patent") by the LG G2, Apr. 12, 2019, 401 pages.
Exhibit B-33: Invalidity Contentions: '046 Patent in View of the LG G3, NuCurrent v. Samsung Electronics America, Inc. et al., Case No. 1:19-cv-00798-DLC (S.D.N.Y.) Invalidity of U.S. Pat. No. 9,300,046 ("the '046 Patent") by the LG G3, Apr. 12, 2019, 200 pages.
Exhibit B-34: Invalidity Contentions: '046 Patent in View of the LG Nexus 5, NuCurrent v. Samsung Electronics America, Inc. et al., Case No. 1:19-cv-00798-DLC (S.D.N.Y.) Invalidity of U.S. Pat. No. 9,300,046 ("The '046 Patent") by the LG Nexus 5, Apr. 12, 2019, 340 pages.
Exhibit C-01: Invalidity Contentions: '591 Patent in View of Jitsuo, NuCurrent v. Samsung Electronics America, Inc. et al., Case No. 1:19-cv-00798-DLC (S.D.N.Y.) Invalidity of U.S. Pat. No. 8,698,591 ("The '591 Patent") by Japanese Patent Application Publication JP05082349A ("Jitsuo"), Apr. 12, 2019, 59 pages.
Exhibit C-02: Invalidity Contentions: '591 Patent in View of Kurs '694, NuCurrent v. Samsung Electronics America, Inc. et al., Case No. 1:19-cv-00798-DLC (S.D.N.Y.) Invalidity of U.S. Pat. No. 8,698,591 ("the '591 Patent") by U.S. 2010/0219694 A1 ("Kurs'694"), Apr. 12, 2019, 61 pages.
Exhibit C-03: Invalidity Contentions: '591 Patent in View of Sheng-Yuan, NuCurrent v. Samsung Electronics America, Inc. et al., Case No. 1:19-cv-00798-DLC (S.D.N.Y.) Invalidity of U.S. Pat. No. 8,698,591 ("The '591 Patent") by U.S. Patent Application Publication 2007/267718 A1 ("Sheng-Yuan"), Apr. 12, 2019, 84 pages.
Exhibit C-04: Invalidity Contentions: '591 Patent in View of Wotherspoon, NuCurrent v. Samsung Electronics America, Inc. et al., Case No. 1:19-cv-00798-DLC (S.D.N.Y.) Invalidity of U.S. Pat. No. 3,698,591 ("The '591 Patent") by U.S. Patent Application Publication 2007/0126544 A1 ("Wotherspoon"), Apr. 12, 2019, 58 pages.
Exhibit C-05: Invalidity Contentions: '591 Patent in View of Baarman '777, NuCurrent v. Samsung Electronics America, Inc. et al., Case No. 1:19-cv-00798-DLC (S.D.N.Y.) Invalidity of U.S. Pat. No. 8,698,591 ("the '591 Patent") by U.S. 2009/0230777A1 ("Baarman '777"), Apr. 12, 2019, 57 pages.
Exhibit C-06: Invalidity Contentions: '591 Patent in View of Burghartz & Rejaei, NuCurrent v. Samsung Electronics America, Inc. et al., Case No. 1:19-cv-00798-DLC (S.D.N.Y.) Invalidity of U.S. Pat. No. 8,698,591 ("The '591 Patent") by on the Design of RF Spiral Inductors on Silicon ("Burghartz & Rejaei"), Apr. 12, 2019, 61 pages.
Exhibit C-07:Invalidity Contentions: '591 Patent in View of Ganem, NuCurrent v. Samsung Electronics America, Inc. et al., Case No. 1:19-cv-00798-DLC (S.D.N.Y.) Invalidity of U.S. Pat. No. 8,698,591 ("The '591 Patent") by U.S. Patent Application Publication 2012/0235500 A1 ("Steven J. Ganem"), Apr. 12, 2019, 98 pages.
Exhibit C-08: Invalidity Contentions: '591 Patent in View of Gao, NuCurrent v. Samsung Electronics America, Inc. et al., Case No. 1:19-cv-00798-DLC (S.D.N.Y.) Invalidity of U.S. Pat. No. 8,698,591 ("The '591 Patent") by U.S. Patent Application Publication 2011/084656 A1 ("Gao"), Apr. 12, 2019, 49 pages.
Exhibit C-09: Invalidity Contentions: '591 Patent in View of Hasegawa '215, NuCurrent v. Samsung Electronics America, Inc. et al., Case No. 1:19-cv-00798-DLC (S.D.N.Y.) Invalidity of U.S. Pat. No. 8,698,591 ("The '591 Patent") by Japanese Patent Application Publication 2008-205215 A ("Hasegawa Minoru"), Apr. 12, 2019, 50 pages.
Exhibit C-10: Invalidity Contentions: '591 Patent in View of Hasegawa '518, NuCurrent v. Samsung Electronics America, Inc. et al., Case No. 1:19-cv-00798-DLC (S.D.N.Y.) Invalidity of U.S. Pat. No. 8,698,591 ("The '591 Patent") by J.P. Patent Application Publication 01310518 A ("Hasegawa Michio '518"), Apr. 12, 2019, 85 pages.
Exhibit C-11: Invalidity Contentions: '591 Patent in View of Hasegawa '631, NuCurrent v. Samsung Electronics America, Inc. et al., Case No. 1:19-cv-00798-DLC (S.D.N.Y.) Invalidity of U.S. Pat. No. 8,698,591 ("The '591 Patent") by U.S. Pat. No. Granted Publication 4,959,631 A ("Hasegawa'631"), Apr. 12, 2019, 40 pages.
Exhibit C-12: Invalidity Contentions: '591 Patent in View of Ishihara, NuCurrent v. Samsung Electronics America, Inc. et al., Case No. 1:19-cv-00798-DLC (S.D.N.Y.) Invalidity of U.S. Pat. No.

(56) References Cited

OTHER PUBLICATIONS 8,698,591 ("The '591 Patent") by JP Patent Application Publication 2008/294285 A ("Ishihara Keien"), Apr. 12, 2019, 40 pages.
Exhibit C-13: Invalidity Contentions: '591 Patent in View of Kato '840, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2008/164840 A1 ("Hiroshi Kato"), Apr. 12, 2019, 35 pages.
Exhibit C-14: Invalidity Contentions: '591 Patent in View of Kato '844, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2008/164844 A1 ("Hiroshi Kato"), Apr. 12, 2019, 39 pages.
Exhibit C-15: Invalidity Contentions: '591 Patent in View of Kimura, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2002/071003 A1 ("Isao Kimura "), Apr. 12, 2019, 52 pages.
Exhibit C-16: Invalidity Contentions: '591 Patent in View of Kurs '765, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2012/0280765 A1 ("Kurs '765"), Apr. 12, 2019, 61 pages.
Exhibit C-17: Invalidity Contentions: '591 Patent in View of Misum, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by Japanese. Patent Application Publication JP 10255629 A ("Misum Shuichi"), Apr. 12, 2019, 37 pages.
Exhibit C-18: Invalidity Contentions: '591 Patent in View of Nakatani, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by 2004/227608 A1 ("Toshifumi Nakatani"), Apr. 12, 2019, 59 pages.
Exhibit C-19: Invalidity Contentions: '591 Patent in View of Partovi '367, *NuCurrent* v. *Samsung Electronics America, Inc. et al.*, Case No. 1:19-cv-00798-DLC (S.D.N.Y.) Invalidity of U.S. Pat. No. 8,698,591 ("The '591 patent") by U.S. Patent Application Publication 2007/0182367 A1 ("Partovi '367"), Apr. 12, 2019, 55 pages.
Exhibit C-20: Invalidity Contentions: '591 Patent in View of Afshin Partovi '413, *NuCurrent* v. *Samsung Electronics America, Inc. et al.*, Case No. 1:19-cv-00798-DLC (S.D.N.Y.) Invalidity of U.S. Pat. No. 3,698,591 ("The '591 Patent") by U.S. Patent Application Publication 2009/0096413 A1 ("Afshin Partovi '413"), Apr. 12, 2019, 56 pages.
Exhibit C-21: Invalidity Contentions: '591 Patent in View of Partovi '636, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2012/0235636 A1 ("Afshin Partovi '636"), Apr. 12, 2019, 77 pages.
Exhibit C-22: Invalidity Contentions: '591 Patent in View of 01 0.95, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by Qi System Description, Wireless Power Transfer, vol. 1: Low Power, Version 0.95 ("Qi 0.95"), Apr. 12, 2019, 29 pages.
Exhibit C-23: Invalidity Contentions: '591 Patent in View of 01 1.0.1, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by Qi System Description, Wireless Power Transfer, vol. 1: Low Power, Part 1: Interface Definition, Version 1.0.1 ("Qi 1.0.1"), Apr. 12, 2019, 57 pages.
Exhibit C-24: Invalidity Contentions: '591 Patent in View of Shima, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. No. 5,808,587 A ("Hiroshi Shima"), Apr. 12, 2019, 102 pages.
Exhibit C-25: Invalidity Contentions: '591 Patent in View of Sun, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2011/0101788 A1 ("Sun"), Apr. 12, 2019, 68 pages.
Exhibit C-26: Invalidity Contentions: '591 Patent in View of Tseng, *NuCurrent* v. *Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. No. 9,912,173 B2 ("Ryan Tseng"), Apr. 12, 2019, 84 pages.
Ex. 1035—A 1.2V 60-GHz Radio Receiver With On-Chip Transformers and Inductors in 90-nm CMOS, 2006 IEEE Compound Semiconductor Integrated Circuit Symposium, Nov. 12-15, 2006, 2 pages.
Ex. 1036 Kraemer, et al., "Architecture Considerations for 60 GhzPulse Transceiver Front-Ends," CAS 2007 Proceedings vol. 2, 2007, Int'l Semiconductor Conference (2007), 26 pages.
Ex. 1037—Varonen, et al., "V-band Balanced Resistive Mixer in 65-nm CMOS," Proceedings of the 33rd European Solid-State Circuits Conference, 2007, 22 pages.
Ex. 1038—AC Resistance of Planar Power Inductors and the Quasidistributed Gap Technique, IEEE Transactions on Power Electronics, vol. 16, Issue 4, Jul. 2001, 2 pages.
Ex. 1039—Lopera et al., "A Multiwinding Modeling Method for High Frequency Transformers and Inductors", IEEE Transactions on Power Electronics, vol. 18, No. 3, May 2003, 14 pages.
Ex. 1040—Leonavicius et al., "Comparison of Realization Techniques for PFC Inductor Operating in Discontinuous Conduction Mode," IEEE Transactions on Power Electronics, vol. 19, No. 2, Mar. 2004, 14 pages.
Ex. 1041—Roshen W.A., "Fringing Field Formulas and Winding Loss Due to an Air Gap," IEEE Transactions on Magnetics, vol. 43, No. 8, Aug. 2007, 12 pages.
Exhibit A-01: Invalidity Contentions: '960 Patent in View Jitsuo, *NuCurrent* v. *Samsung Electronics America, Inc. et al.*, Case No. 1:19-cv-00798-DLC (S.D.N.Y.), Invalidity of U.S. Pat. No. 8,680,960 ("The '960 Patent") by Japanese Patent Application Publication JP05082349A ("Jitsuo"), Apr. 12, 2019, 56 pages.
Exhibit A-02: Invalidity Contentions: '960Patent in View of Kurs '694, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2010/0219694 AI ("Kurs '694"), Apr. 12, 2019, 59 pages.
Exhibit A-03: Invalidity Contentions: '960 Patent in View of Sheng-Yuan, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2007/267718 A1 ("Sheng-Yuan"). Apr. 12, 2019, 86 pages.
Exhibit A-04: Invalidity Contentions: '960 Patent in View of Wotherspoon, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2007/0126544 A1 ("Wotherspoon"), Apr. 12, 2019, 51 pages.
Exhibit A-05: Invalidity Contentions: '960 Patent in View of Baarman 777, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2009/0230777A1 ("Baarman '777"), Apr. 12, 2019, 50 pages.
Exhibit A-06: Invalidity Contentions: '960 Patent in View of Bae, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Granted Publication 6,897,830 B2 ("Bae"), Apr. 12, 2019, 80 pages.
Exhibit A-07: Invalidity Contentions: '960 Patent in View of Ganem, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0235500 A1 ("Steven J. Ganem"), Apr. 12, 2019, 82 pages.
Exhibit A-08: Invalidity Contentions: '960 Patent in View of Gao, *NuCurrent* v. *Samsung Electronics America, Inc. et al.*, Case No. 1:19-cv-00798-DLC (S.D.N.Y.) Invalidity of U.S. Pat. No. 8,680,960

(56) References Cited

OTHER PUBLICATIONS ("The '960 Patent") by U.S. Patent Application Publication 20111084656 A1 ("Gao"), Apr. 12, 2019, 39 pages.
Exhibit A-09: Invalidity Contentions: '960 Patent in View of Burghartz &Rejaei, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by on the Design of RF Spiral Inductors on Silicon ("Burghartz Rejaei"), Apr. 12, 2019, 53 pages.
Exhibit A-10: Invalidity Contentions: '960 Patent in View of Hasegawa '215, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by Japanese Patent Application Publication 2008-205215 A ("Hasegawa Minoru"), Apr. 12, 2019, 46 pages.
Exhibit A-11: Invalidity Contentions: '960 Patent in View of Hasegawa '518, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by J.P. Patent Application Publication 01310518 A ("Hasegawa Michio '518"), Apr. 12, 2019, 82 pages.
Exhibit A-12: Invalidity Contentions: '960 Patent in View of Hasegawa Michio '631, *NuCurrent* v. *Samsung Electronics America, Inc. et al.*, Case No. 1:19-cv-00798-DLC (S.D.n. Y.) Invalidity of U.S. Pat. No. 3,680,960 ("The '960 Patent") by U.S. Patent Granted Publication 4,959,631 A ("Hasegawa Michio '631"), Apr. 12, 2019, 43 pages.
Exhibit A-13: Invalidity Contentions: '960 Patent in View of Ishihara, *NuCurrent* v. *Samsung Electronics America, Inc. et al.*, Case No. 1:19-cv-00798-DLC (S.D.n. Y.) Invalidity of U.S. Pat. No. 3,680,960 ("The '960 Patent") by JP Patent Application Publication 2008/294285 A ("Ishihara Keien"), Apr. 12, 2019, 37 pages.
Exhibit A-14: Invalidity Contentions: '960 Patent in View of Kato, *NuCurrent* v. *Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2008/164840 A1 ("Hiroshi Kato"), Apr. 12, 2019, 35 pages.
Exhibit A-15: Invalidity Contentions: '960 Patent in View of Kato, *NuCurrent* v. *Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2008/164844 A1 ("Hiroshi Kato"), Apr. 12, 2019, 40 pages.
Exhibit A-16: Invalidity Contentions: '960 Patent in View of Kimura, *NuCurrent* v. *Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2002/071003 A1 ("Isao Kimura"), Apr. 12, 2019, 59 pages.
Exhibit A-17: Invalidity Contentions: '960 Patent in View of Kurs '765, *NuCurrent* v. *Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2012/0280765 A1 ("Kurs '765"), Apr. 12, 2019, 57 pages.
Exhibit A-18: Invalidity Contentions: '960 Patent in View of Misumi, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by Japanese. Patent Application Publication JP 10255629 A ("Misumi Shuichi"), Apr. 12, 2019, 37 pages.
Exhibit A-19: Invalidity Contentions: '960 Patent in View of Nakatani, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2004/227608 A1 ("Toshifumi Nakatani"), Apr. 12, 2019, 58 pages.
Exhibit A-20: Invalidity Contentions: '960 Patent in View of Partovi '367, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2007/0182367 A1 ("Partovi '367"), Apr. 12, 2019, 49 pages.

Exhibit A-21: Invalidity Contentions: '960 Patent in View of Inventor Partovi '413, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S.Patent Application Publication 2009/0096413 A1 ("Afshin Partovi '413"), Apr. 12, 2019, 45 pages.
Exhibit A-22: Invalidity Contentions: '960 Patent in View of Partovi '636, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0235636 A1 ("Afshin Partovi '636"), Apr. 12, 2019, 64 pages.
Exhibit A-23: Invalidity Contentions: '960 Patent in View of QI 0.95, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by Qi System Description, Wireless Power Transfer, vol. 1: Low Power, Version 0.95 ("Qi 0.95"), Apr. 12, 2019, 26 pages.
Exhibit A-25: Invalidity Contentions: '960 Patent in View of Shima, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Pat. No. 5,808,587 A ("Hiroshi Shima"), Apr. 12, 2019, 87 pages.
Exhibit A-26: Invalidity Contentions: '960 Patent in View of Sun, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2011/0101788 A1 ("Sun"), Apr. 12, 2019, 65 pages.
Exhibit A-27: Invalidity Contentions: '960 Patent in View of Tseng, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Pat. No. 9,912,173 B2 ("Ryan Tseng"), Apr. 12, 2019, 67 pages.
Exhibit A-28: Invalidity Contentions: '960 Patent in View of Von Novak, III, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Pat. No. 9,559,526 B2 ("William H. Von Novak, III"), Apr. 12, 2019, 57 pages.
Exhibit A-29: Invalidity Contentions: '960 Patent in View of Yamakawa, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0217819 A1 ("Yamakawa"), Apr. 12, 2019, 40 pages.
Exhibit A-30: Invalidity Contentions: '960 Patent in View of Yoon & Allen, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by Embedded Conductor Technology for Micromachined Rf Elements ("Yoon & Allen"), Apr. 12, 2019, 13 pages.
Exhibit A-31: Invalidity Contentions: '960 Patent in View of the Blackberry Z30, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by the Blackberry Z30, Apr. 12, 2019, 154 pages.
Exhibit A-32: Invalidity Contentions: '960 Patent in View of the LG G2, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by the LG G2, Apr. 12, 2019, 462 pages.
Exhibit A-33: Invalidity Contentions: '960 Patent in View of the Lg G3, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by the LG G3, Apr. 12, 2019, 228 pages.
Exhibit A-34: Invalidity Contentions: '960 Patent in View of the LG Nexus 5, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by the LG Nexus 5, Apr. 12, 2019, 391 pages.
Exhibit B-01: Invalidity Contentions: '046 Patent in View of Jitsuo, *NuCurrent* v. *Samsung Electronics America, Inc. et al.*, Case No. 1:19-cv-00798-DLC (S.D.N.Y.) Invalidity of U.S. Pat. No. 9,300,046

(56) References Cited

OTHER PUBLICATIONS ("The '046 Patent") by Japanese Patent Application Publication JP05082349A ("Jitsuo"), Apr. 12, 2019, 50 pages.
Exhibit B-02: Invalidity Contentions: '046 Patent in View of Kurs '694, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2010/0219694 A1 ("Kurs '694"), Apr. 12, 2019, 51 pages.
Exhibit B-03: Invalidity Contentions: '046 Patent in View of Sheng-Yuan, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by U.S. Patent Application Publication 2007/267718 A1 ("Sheng-Yuan"), Apr. 12, 2019, 76 pages.
Exhibit B-04: Invalidity Contentions: '046 Patent in View of Wotherspoon, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2007/0126544 A1 ("Wotherspoon"), Apr. 12, 2019, 44 pages.
Exhibit B-05: Invalidity Contentions: '046 Patent in View of Baarman '777, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2009/0230777A1 ("Baarman '777"), Apr. 12, 2019, 42 pages.
Exhibit B-06: Invalidity Contentions: '046 Patent in View of Bae, *NuCurrent v. Samsung Electronics America, Inc. et al.*, Case No. 1:19-cv-00798-DLC (S.D.N.Y.) Invalidity of U.S. Pat. No. 9,300,046 ("The '046 3atent") by U.S. Patent Granted Publication 6,897,830 B2 ("Bae"), Apr. 12, 2019, 71 pages.
Exhibit B-07: Invalidity Contentions: '046 Patent in View of Burghartz &Rejaei, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by on the Design of RF Spiral Inductors on Silicon ("Burghartz & Rejaei"), Apr. 12, 2019, 45 pages.
Exhibit B-08: Invalidity Contentions: '046 Patent in View of Ganem, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2012/0235500 A1 ("Steven J. Ganem"), Apr. 12, 2019, 75 pages.
Exhibit B-09: Invalidity Contentions: '046 Patent in View of Gao, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2011/084656 A1 ("Gao"), Apr. 12, 2019, 33 pages.
Exhibit B-10: Invalidity Contentions: '046 Patent in View of Hasegawa '215, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Japanese Patent Application Publication 2008-205215 A ("Hasegawa Minoru"), Apr. 12, 2019, 42 pages.
PGR2019-0050—Ex. 1006 File History for U.S. Appl. No. 14/821,065, filed Aug. 7, 2015, Part 2, 430 pages.
PGR2019-0050—Ex. 1006 File History for U.S. Appl. No. 14/821,065, filed Aug. 7, 2015, Part 3, 230 pages.
PGR2019-0050—Ex. 1006 File History for U.S. Appl. No. 14/821,065, filed Aug. 7, 2015, Part 4, 299 pages.
PGR2019-0050—Ex. 1006 File History for U.S. Appl. No. 14/821,065, Part 1, filing date Aug. 7, 2015, 330 pages.
PGR2019-0050—Ex. 1002—Declaration of R. Jacob Baker, Ph.D., P.E. In Support of Petition for Post-Grant Review of U.S. Pat. No. 10,063, 100, *Samsung Electronics Co., Ltd. v. NuCurrent, Inc.*, May 27, 2019, 42 pages.
PGR2019-0050—Ex. 1005 U.S. Pat. No. 9,941,729 to Peralta et al., Apr. 10, 2018, 48 pages.
PGR2019-0050—Ex. 1008-First Amended Complaint for *NuCurrent, Inc. v. Samsung Electronics Co., Ltd.; Samsung Electronics America, Inc.*, Case. No. 6:18-cv-00051-JRG-KNM, Jun. 19, 2018, 62 pages.
PGR2019-0050—Ex. 1009—NuCurrent's Opening Claim Construction Brief, *NuCurrent, Inc. v. Samsung Electronics Co., Ltd.*, Case. No. 1:19-CV-00798-DLC, May 10, 2019, 31 pages.
PGR2019-0050—*Samsung Electronics Co., Ltd. v. NuCurrent, Inc.*, Petition for Post-Grant Review of U.S. Pat. No. 10,063,100, May 28, 2019, 73 pages.
QI 2009, "System Description Wireless Power Transfer", vol. 1, Low Power, Version 0.95, Jul. 2009, 76 pages.
QI 2010, "System Description Wireless Power Transfer", vol. 1, Low Power, Part 1: Interface Definition, Version 1.0.1, Oct. 2010, Wireless Power Consortium, 86 pages.
Relative Permativity—Dielectric Constant—Jul. 2011, 3 pages.
*Samsung Electronics Co., Ltd. v. NuCurrent, Inc.* Case IPR2019-00858, Decision Granting Institution of Inter Partes Review re U.S. Pat. No. 8,680,960, Sep. 25, 2019, 44 pages.
*Samsung Electronics Co., Ltd. v. NuCurrent, Inc.*, Case IPR2019-00861, Decision Denying Institution of Inter Partes Review re U.S. Pat. No. 9,300,046 B2, Sep. 25, 2019, 6 pages.
*Samsung Electronics Co., Ltd. v. NuCurrent, Inc.*, Case IPR2019-00862, Decision Granting of Inter Partes Review re U.S. Pat. No. 8,710,948 B2, Oct. 4, 2019, 41 pages.
Samsung Ex. 1002, *Samsung Electronics Co., Ltd., v. NuCurrent, Inc.*, U.S. Pat. No. 8,680,960, Declaration of Dr. Steven Leeb, Mar. 22, 2019, 115 pages.
Sun M., et al., "Apparatus for Wireless Power and Data Transfer over a Distance", University of Pittsburgh, Jun. 2009, 30 pages.
Yoon, Y., "Embedded Conductor Technology for Micromachined RF Elements", Journal of Micromechanics and Micro engineering, Jun. 2005, 11 pages.

\* cited by examiner

PRIOR ART

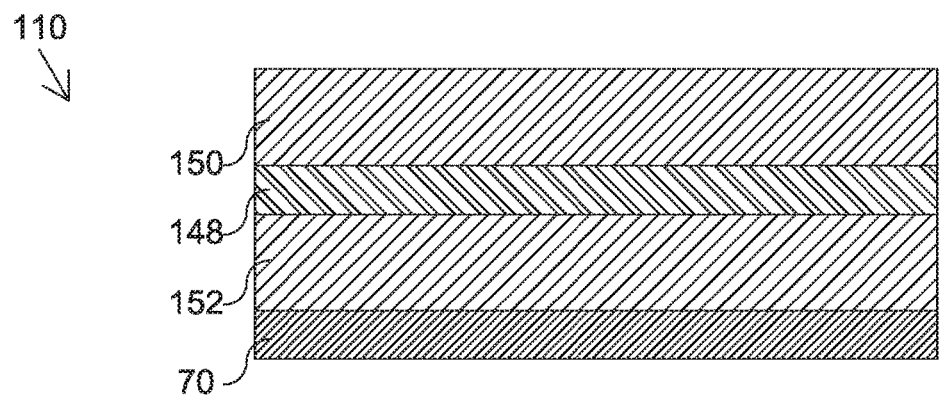
FIG. 29
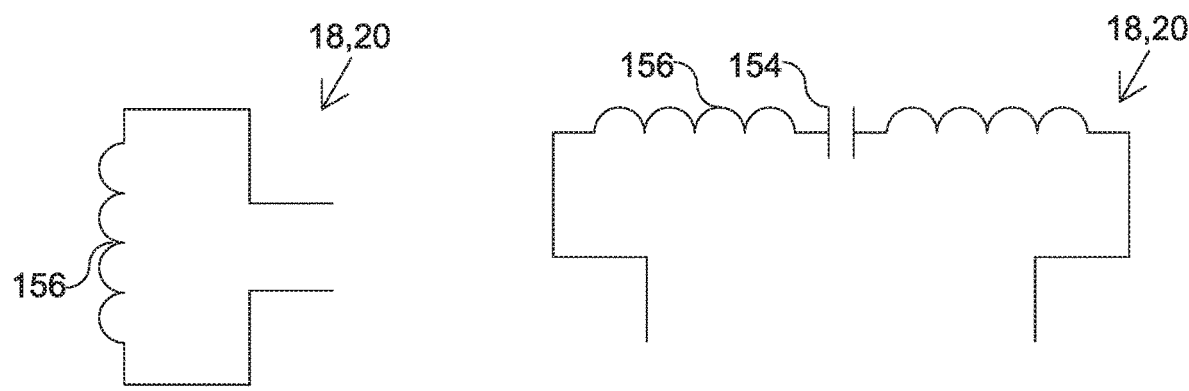
FIG. 30A
FIG. 30C
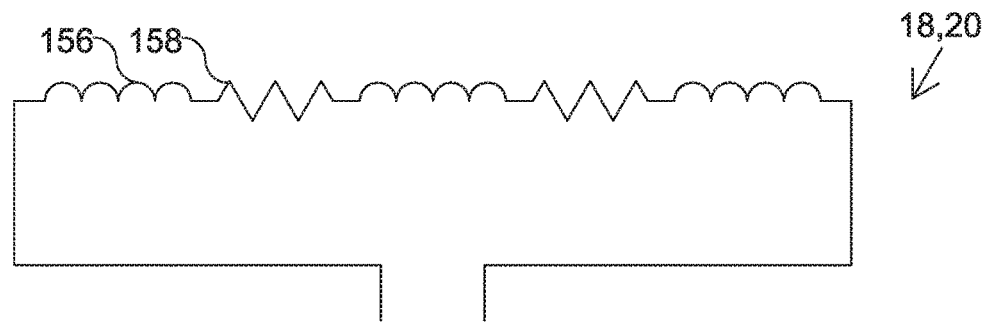
FIG. 30B

METHOD OF OPERATING A WIRELESS ELECTRICAL ENERGY TRANSMISSION SYSTEM

CROSS-REFERENCE TO RELATED APPLICATIONS

This application is a continuation of, and claims priority to, U.S. Non-Provisional application Ser. No. 17/896,832, filed on Aug. 26, 2022, and entitled "A METHOD OF OPERATING A WIRELESS ELECTRICAL ENERGY TRANSMISSION SYSTEM," which is a continuation of, and claims priority to U.S. Non-Provisional application Ser. No. 15/895,595, filed on Feb. 13, 2018, and entitled "A METHOD OF OPERATING A WIRELESS ELECTRICAL ENERGY TRANSMISSION SYSTEM," which claims priority to U.S. Provisional Application No. 62/458,261, filed on Feb. 13, 2017, each of which is herein incorporated by reference in its entirety.

TECHNICAL FIELD

The present disclosure generally relates to the wireless transmission of electrical energy and data. More specifically, this application relates to various embodiments which enable the transmission of wireless electrical energy by near-field magnetic coupling.

BACKGROUND

Near field magnetic coupling (NFMC) is a commonly employed technique to wirelessly transfer electrical energy. The electrical energy may be used to directly power a device, charge a battery or both.

In near field magnetic coupling (NFMC) an oscillating magnetic field generated by a transmitting antenna passes through a receiving antenna that is spaced from the transmitting antenna, thereby creating an alternating electrical current that is received by the receiving antenna.

However, the oscillating magnetic field radiates in multiple directions and at a relatively short distance from the transmitting antenna. Thus, electronic devices, such as a cellular phone, that are charged with prior art charging systems that utilize NFMC are required to be positioned directly in physical contact with the surface of the prior art transmitting base, such as a charging mat, that houses a prior art antenna. Because the electronic device is required to be in physical contact with the prior art charging base, the number of electronic devices that can be electrically charged is limited to one device. Furthermore, since the electronic device is required to be in physical contact with the prior art charging base, the device cannot be used while it is being electrically charged.

In contrast to the prior art, the present invention provides a wireless electrical power transmitting system that enables multiple electronic devices to be simultaneously electrically charged or powered. Furthermore, in contrast to the prior art, the wireless electrical power transmitting system enables multiple electronic devices to be electrically charged or powered by positioned one or more devices at a distance away from the wireless transmitting base of the present invention. Therefore, not only can multiple devices be electrically charged or powered simultaneously, they can also be utilized by a user.

SUMMARY

The present disclosure relates to the transfer of wireless electrical energy to and from electronic devices that are configured to utilize wirelessly transmitted electrical energy. Such electronic devices may include, but are not limited to, consumer electronics, medical devices, and devices used in industrial and military applications.

In one or more embodiments, a wireless electrical power transmission system is provided comprising an electrical power transmission base and a wireless electrical power receiving antenna that is incorporatable within an electronic device. In one or more embodiments, the electrical power transmission base comprises at least one wireless electrical power transmitting antenna that is housed therewithin. In one or more embodiments the wireless electrical power transmitting antenna is configured with one or more magnetic field shielding embodiments that increase the magnitude of the magnetic field that emanates from the antenna. In one or more embodiments the wireless electrical power transmitting antenna is configured with one or more magnetic field shielding embodiments that control the direction in which the magnetic field emanates from the antenna. Furthermore, the transmitting and/or the receiving antenna is configured with one or more embodiments that increase the efficiency, reduces form factor and minimizes cost in which electrical energy and/or data is wirelessly transmitted. As a result, the present invention provides a wireless electrical energy transmission system comprising a wireless electrical energy transmission base that enables wireless electrical charging and powering of electronic devices that are positioned at a distance from the wireless transmission base.

BRIEF DESCRIPTION OF THE DRAWINGS

FIG. 29 illustrates a cross-sectional view of an embodiment of a transmitting or receiving antenna having an interdigitated capacitor.

FIGS. 30A, 30B, and 30C are electrical schematic diagrams of embodiments of a transmitting or a receiving antenna comprising a lumped circuit elements.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various embodiments illustrated in the present disclosure provide for the wireless transfer of electrical energy and/or data. More specifically, the various embodiments of the present disclosure provide for the wireless transfer of electrical energy and/or data via near field magnetic coupling between a transmitting base and a receiving antenna positioned within an electronic device.

Figure 1:
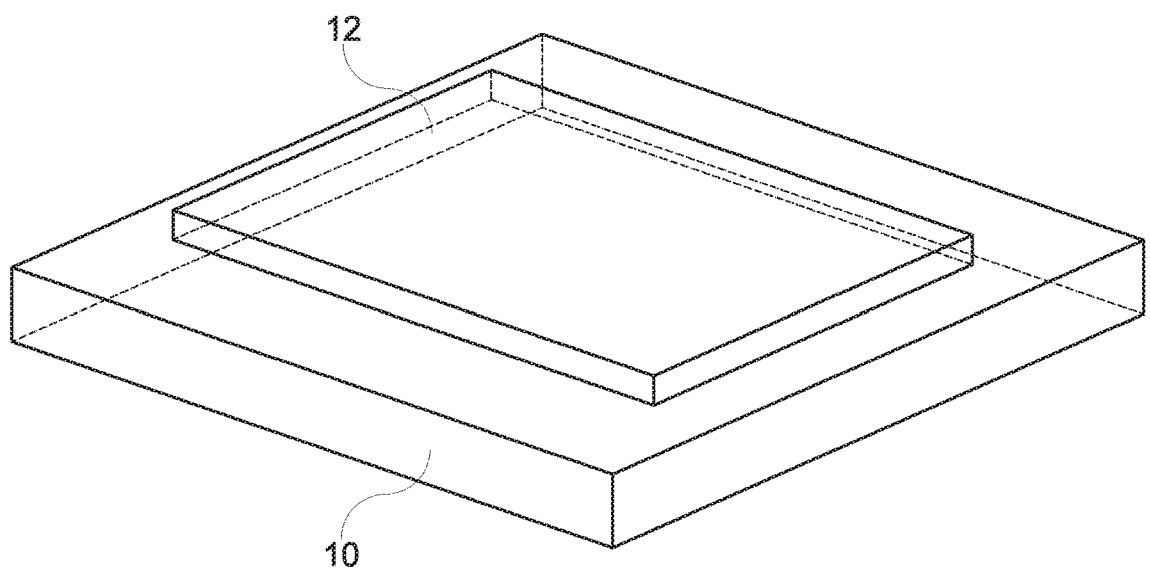
FIG. 1 illustrates an embodiment of an electronic device positioned directly on a surface of a prior art wireless transmitting base.

Now turning to the figures, FIG. 1 illustrates an example of a prior art wireless electrical charging device 10, such as a charging mat. As shown, the prior art wireless charging device 10 is configured such that an electronic device 12 intended to be charged, must be placed in physical contact with a surface of the charging device. This is because of a number of factors. First, the wireless signal emitted by prior art charging devices 10 is generally too weak to travel any significant distances. Second, the respective prior art transmitting and receiving antennas are of poor efficiency such that a large portion of the signal is lost and not received by the device. Thus, a result, prior art wireless charging devices 10, such as the example shown in FIG. 1, require that an electronic device 12 intended to be charged be positioned as close to the charging device 10 as possible, hence the need to position the electronic device 12 directly on an exterior surface of the prior art wireless charging device 10.

Since prior art wireless electrical charging devices 10 require physical contact with an electronic device 12 to enable charging or powering of the electronic device 12, the number of devices able to be simultaneously charged or powered is significantly limited. In many cases, the relatively weak signal and relatively small surface area of prior art wireless charging devices 10 limit the number of electronic devices 12 being charged or powered to one. Furthermore, requiring the electronic device 12 be in physical contact with the prior art wireless charging device 10 limits the use of the electronic device 12 while being charged. For example, in many cases, one cannot use an electronic device 12 while it is being charged by a prior art wireless charging device 10 since it is in physical contact with the charging device which thus does not allow the electronic device 12 to be held and manipulated.

As will be described in detail, the present invention in contrast to prior art wireless charging devices 10, addresses these problems by providing a wireless electrical energy transmitting system 14 comprising a wireless transmitting base 16 that allows for multiple electronic devices to be electrically charged or powered wirelessly simultaneously. Furthermore, unlike the prior art, the transmitting base 16 of the present invention allows for wireless electrical charging and/or electrical powering of at least one electronic device 12 that is positioned at a distance away from the transmitting base 16. In contrast to prior art wireless charging devices 10, the wireless electrical energy transmitting system 14 of the present invention utilizes near field magnetic coupling (NFMC) in which magnetic fields 15 (FIG. 12) that emanate from within the transmitting base 16 are magnified and are able to be steered to emanate at a specific direction or directions. The wireless transmitting base 16 of the present invention is further configured so that electric fields are suppressed. As a result, transmitted magnetic fields travel further distances thereby allowing for multiple devices to be charged or powered at longer distances from the wireless transmitting base 16.

In this application, the inventive concepts particularly pertain to near-field magnetic coupling (NFMC). NFMC enables the transfer of electrical energy and/or data wirelessly through magnetic induction between a transmitting antenna 18 and a corresponding receiving antenna 20. The NFMC standard, based on near-field communication interface and protocol modes, is defined by ISO/IEC standard 18092. Furthermore, as defined herein "inductive charging" is a wireless charging technique that utilizes an alternating electromagnetic field to transfer electrical energy between two antennas. "Resonant inductive coupling" is defined herein as the near field wireless transmission of electrical energy between two magnetically coupled coils that are tuned to resonate at a similar frequency. As defined herein, "mutual inductance" is the production of an electromotive force in a circuit by a change in current in a second circuit magnetically coupled to the first circuit.

As defined herein a "shielding material" is a material that captures a magnetic field. Examples of shielding material include, but are not limited to ferrite materials such as zinc comprising ferrite materials such as manganese-zinc, nickel-zinc, copper-zinc, magnesium-zinc, and combinations thereof. A shielding material thus may be used to direct a magnetic field to or away from an object, such as a parasitic metal, depending on the position of the shielding material within or nearby an electrical circuit. Furthermore, a shielding material can be used to modify the shape and directionality of a magnetic field. As defined herein a parasitic material, such as a parasitic metal, is a material that induces eddy current losses in the inductor antenna. This is typically characterized by a decrease in inductance and an increase in resistance of the antenna, i.e., a decrease in the quality factor. An "antenna" is defined herein as a structure that wirelessly receives or transmits electrical energy or data. An antenna comprises a resonator that may comprise an inductor coil or a structure of alternating electrical conductors and electrical insulators. Inductor coils are preferably composed of an electrically conductive material such as a wire, which may include, but is not limited to, a conductive trace, a filar, a filament, a wire, or combinations thereof.

It is noted that throughout this specification the terms, "wire", "trace", "filament" and "filar" may be used interchangeably. As defined herein, the word "wire" is a length of electrically conductive material that may either be of a two dimensional conductive line or track that may extend along a surface or alternatively, a wire may be of a three dimensional conductive line or track that is contactable to a surface. A wire may comprise a trace, a filar, a filament or combinations thereof. These elements may be a single element or a multitude of elements such as a multifilar element or a multifilament element. Further, the multitude of wires, traces, filars, and filaments may be woven, twisted or coiled together such as in a cable form. The wire as defined herein may comprise a bare metallic surface or alternatively, may comprise a layer of electrically insulating material, such as a dielectric material that contacts and surrounds the metallic surface of the wire. A "trace" is an electrically conductive line or track that may extend along a surface of a substrate. The trace may be of a two dimensional line that may extend along a surface or alternatively, the trace may be of a three dimensional conductive line that is contactable to a surface. A "filar" is an electrically conductive line or track that extends along a surface of a substrate. A filar may be of a two dimensional line that may extend along a surface or alternatively, the filar may be a three dimensional conductive line that is contactable to a surface. A "filament" is an electrically conductive thread or threadlike structure that is contactable to a surface. "Operating frequency" is defined as the frequency at which the receiving and transmitting antennas operate. "Self-resonating frequency" is the frequency at which the resonator of the transmitting or receiving antenna resonates.

In one or more embodiments, the wireless transmitting base 16 is a component of the wireless electrical energy transmitting system 14. The electrical energy transmitting system 14 comprises the transmitting base 16 and a receiving antenna 20 configured to receive the wirelessly transmitted electrical energy. In one or more embodiments, the wireless electrical energy transmitting system 14 may comprise at least one electronic device 12 having the receiving antenna 20 configured to receive wireless electrical energy and/or data transmitted from the base 16. In one or more embodiments, the at least one electronic device 12 acts as a receiving device that receives and conditions the wirelessly transmitted electrical energy so that it can be used to electrically power the device or store the wirelessly received electrical energy. In one or more embodiments, the at least one electronic device 12 configured to receive the wirelessly transmitted electrical energy may also comprise an electrical energy storage device (not shown) such as an electrochemical cell or battery pack configured to store the received wirelessly transmitted electrical energy.

In one or more embodiments, the wireless transmitting base 16 comprises at least one transmitting antenna 18 that is electrically connected to a transmitting electronic circuit 22 configured to condition electrical energy to be wirelessly transmitted by the transmitting antenna 18. In one or more embodiments, the at least one transmitting antenna 18 and the transmitting electronic circuit 22 reside within a housing 24 of the wireless transmitting base 16. In one or more embodiments the electronic device 12 comprises the receiving antenna 20 and a receiving electrical circuit (not shown) configured to condition the received wireless electrical energy to be used to either electrically power the electronic device 12 and/or store the wireless electrical energy within an electrical energy storage device within the electronic device 12.

Figure 2:
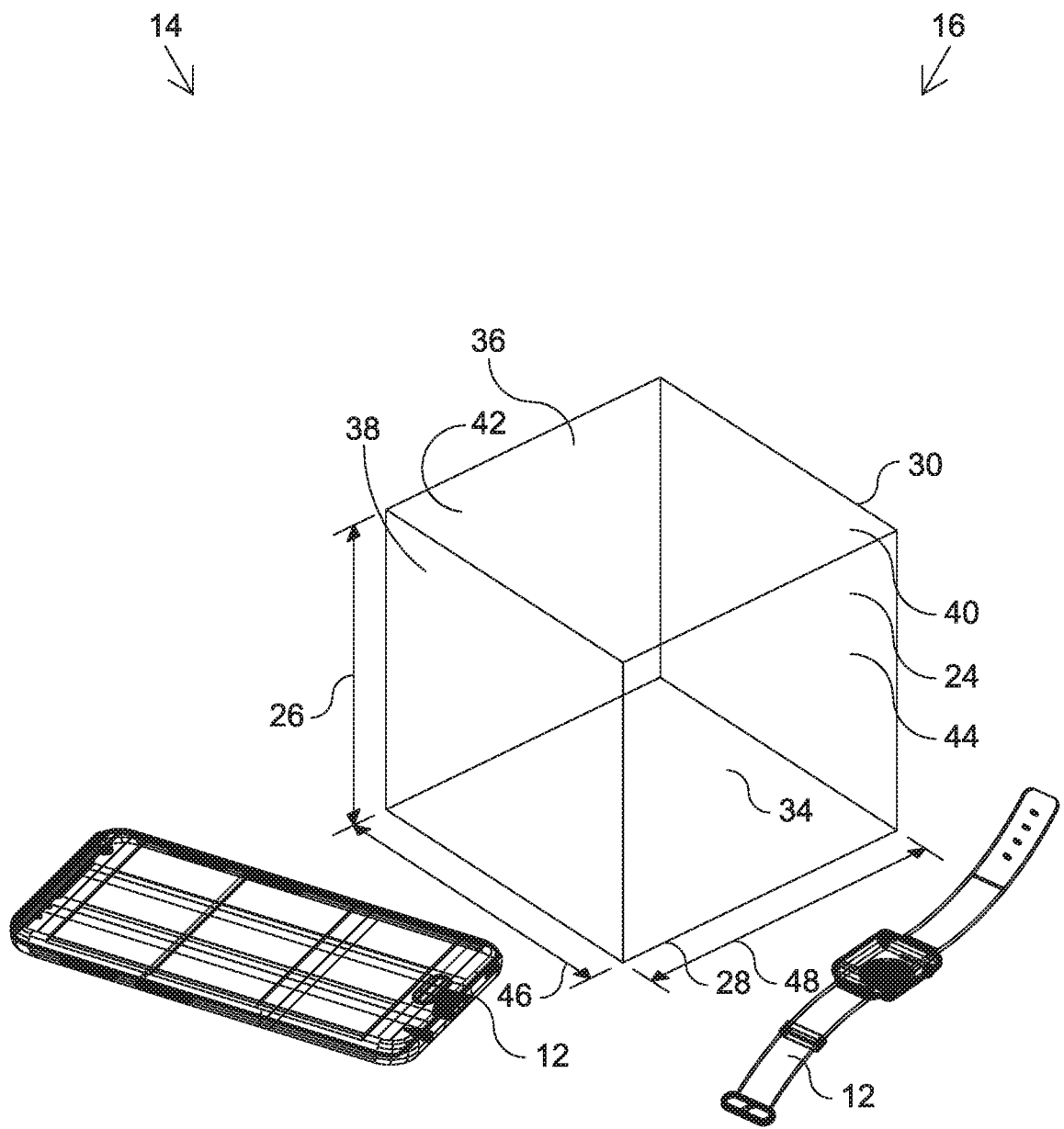
FIG. 2 shows an embodiment of multiple electronic devices being charged by positioning them adjacent to the wireless electrical transmission base of the present invention.

FIG. 2 illustrates an embodiment of the wireless electrical energy transmitting system 14 of the present invention. As shown, the wireless electrical transmitting system 14 comprises the wireless transmitting base 16 and at least one electronic device 12 configured to receive the wireless electrical energy. As illustrated, in an embodiment, the transmitting base 16 has a length 26 that extends from a base proximal end 28 to a base distal end 30. In one or more embodiments, the base proximal end 28 may be positioned directly adjacent or in contact with a supporting structure such as a table, desk or floor.

In one or more embodiments, the transmitting base housing 24 comprises an enclosure having a sidewall within which the at least one transmitting antenna 18 and the transmitting electronic circuit 22 are positioned. Alternatively, the transmitting electronic circuit 22 may be positioned external of the base housing 24.

In addition, in one or more embodiments, the transmitting base 16 may be configured with at least one repeater 32 (FIG. 13) positioned therewithin. As defined herein a repeater is an antenna that is configured to relay magnetic fields emanating between a transmitting antenna 18 and a receiving antenna 20 or another repeater 32, thus the repeater 32 is configured to relay electrical energy via NMFC from between a transmitting antenna 18 and a receiving antenna 20. In one or more embodiments, the repeater 32 comprises an inductor coil capable of resonating at a frequency that is about the same as the resonating frequency of the transmitting and receiving antennas 18, 20.

As shown in the embodiment, illustrated in FIG. 2, the transmitting base housing 24 comprises six sidewalls. As shown, the housing 24 comprises a bottom sidewall 34 positioned at the base proximal end 28, a top sidewall 36 opposed from the bottom sidewall 34 positioned at the base distal end 30, opposed front and back sidewalls 38, 40 oriented perpendicular to the bottom and top sidewalls 34, 36 and opposed left and right sidewalls 42, 44 that join and meet the front and back sidewalls 38, 40 oriented perpendicular to the bottom and top sidewalls 34, 36. In one or more embodiments the transmitting base 16 comprises a base width 46 that extends between the left and right sidewalls 42, 44 and a base depth 48 oriented perpendicular to the width 46 that extends between the front and back sidewalls 38, 40. In one or more embodiments, the transmitting base length 26, width 46 and depth 48 are dependent on the operating frequency, distance between the transmitting and receiving antennas 18, 20, the amount of electrical power being wirelessly transmitted and any electrically conductive surfaces that may be positioned in the vicinity of the transmitting base 16.

In one or more embodiments, the physical dimensions of the transmitter base 16 may affect electrical performance as the dimensions of the transmitting base 16 may dictate the dimensions and/or positioning of the transmitting antenna 18 therewithin. For example, given a cylindrical shaped transmitting base having a diameter, in order to wirelessly transmit electrical energy to the same location, away from the base 16, the transmitting antenna 18 therewithin must be constructed having an increased inductance in comparison to a transmitting antenna positioned within a cylindrically shaped transmitting base having a larger diameter. In one or more embodiments, the inductance of a transmitting antenna 18 constructed having a transmitting inductor coil 50 may be increased by constructing the transmitting inductor coil 50 with an increased number of coil turns. Thus, in this example, by increasing the number of coil turns of the transmitting coil 50 and/or decreasing the size of the transmitting antenna 18 such that it fits within a transmitting base 16 having a decreased diameter or volume, the equivalent series resistance (ESR) of the transmitting antenna 18 generally increases due to the increased proximity effect due to the increased number of coils and reduced spacing between coil turns. Thus, as a result, the efficiency of the wireless transmission of the electrical energy and/or data from the transmitting antenna 18 decreases. Furthermore, in general, as the diameter or width 46 and depth 48 of the transmitting base 16 decreases, the distance away from the base 16 at which electrical energy and/or data can be transmitted decreases as there is a maximum inductance with which the transmitting antenna 18 can be constructed to maintain transmitting distance. Similarly, as the length 26 of the transmitting base 16 decreases the inductance of the transmitting antenna 18 should be increased to maintain wireless transmission distance. However, the extent to which the inductance of the transmitting antenna 18 can be increased is generally limited by the antenna's self-resonant frequency. Therefore, decreasing the length 26 of the wireless transmitting base 16 could reduce the wireless transmission distance if the length 26 of the base 16 is reduced more than can be compensated by increasing the inductance of the transmitting antenna 18.

In one or more embodiments the transmitting base sidewalls have a thickness 52 (FIG. 12A) that extends between an interior sidewall surface 54 and an exterior sidewall surface 56. In one or more embodiments, the interior sidewall surfaces 54 face toward the interior of the wireless transmitting base housing 24. In one or more embodiments, the sidewall thickness 52 may affect the coupling between the transmitting and receiving antennas 18, 20. In general, coupling and efficiency between the transmitting and receiving antennas 18, 20 is increased by constructing the housing sidewalls as thin as possible. In one or more embodiments, the wireless transmitting base housing 24 can be constructed having a multitude of sidewall thicknesses. In one or more embodiments, the sidewall thickness 52 may range from about 0.1 mm to about 5 mm. As shown, multiple electronic devices 12, configured to receive wireless electrical energy such as a cellular phone and a watch are positioned about the wireless transmitting base housing 24. However, it is noted that the electronic device 12 or multiple electronic devices 12 may include any electronic device configured to receive wireless electrical energy emanating from the wireless transmitting base 16. Examples of other such devices include but are limited to a computer, a radio, or a wearable electronic device. In one or more embodiments, the wireless transmitting base 16 of the present application is configured to wirelessly transmit electrical power ranging from about 1 mW to about 500 W over a transmission distance ranging from about 0 mm to about 50 mm.

It is further noted that while the embodiment of the wireless transmitting base 16 as illustrated in FIG. 2, is configured in a rectangular cube shape, the wireless transmitting base 16 of the present invention may comprise a variety of non-liming three-dimensional shapes and configurations among which may include, but are not limited to, a triangular pyramid, a cylinder, or other three dimensional polygon shaped configuration. An example of such a cylindrical housing configuration includes a length 26 ranging from about 50 mm to about 100 mm and a diameter 58 that ranges from about 50 mm to about 100 mm. In addition, in one or more embodiments, the transmitting base housing 24 may comprise an electrically non-conductive material. Examples of such materials may include a polymer, a ceramic, a glass or combinations thereof.

Figure 3:
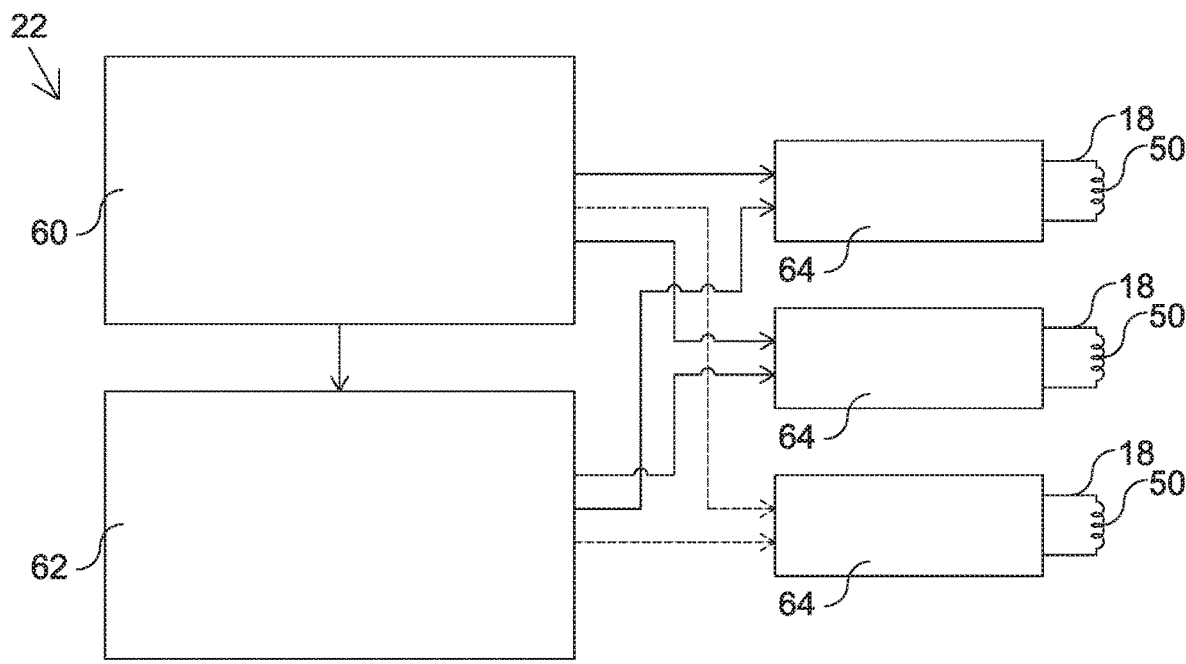
FIGS. 3 and 4 illustrate embodiments of a block diagram of an electrical circuit configured to condition electrical energy to be transmitted wirelessly.
Figure 4:
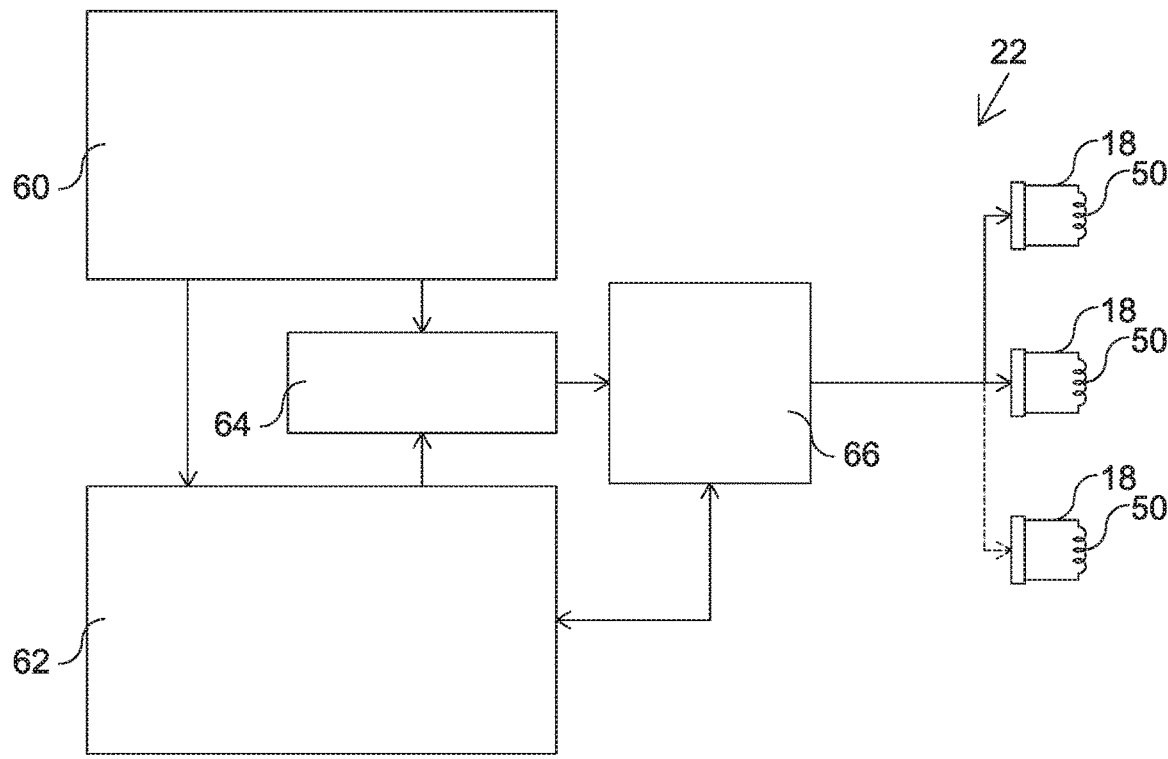

FIGS. 3 and 4 are electrical block diagrams that illustrate embodiments of the transmitting electronic circuit 22 that may be housed within the housing 24 of the transmitting base 16. Alternatively, the transmitting electrical circuit 22 may reside external of the transmitting base 16. As shown, a power supply sub-circuit 60 is electrically connected to a communication and control sub-circuit 62. In one or more embodiments, the power supply sub-circuit 60 may be electrically connectable to an external power supply 61 (FIG. 13) such as an electrical wall outlet (not shown). In one or more embodiments, the communication and control sub-circuit 62 comprises a master control unit that controls the operation of the transmitting base 16 and transmission of wireless electrical energy. As shown in FIG. 3, the communication and control sub-circuit 62 is electrically connected to at least one inverter 64 that converts direct current electrical energy to alternating current electrical energy. The at least one inverter 64 is electrically connected to the transmitting antenna 18 that resides within the housing 24 of the wireless transmitting base 16. As shown in FIG. 3, the transmitting electronic circuit 22 comprises three inverters 64, each inverter 64 is electrically connected to a transmitting antenna 18 comprising a transmitting inductor coil 50 within the housing 24 of the transmitting base 16.

Figure 4A:
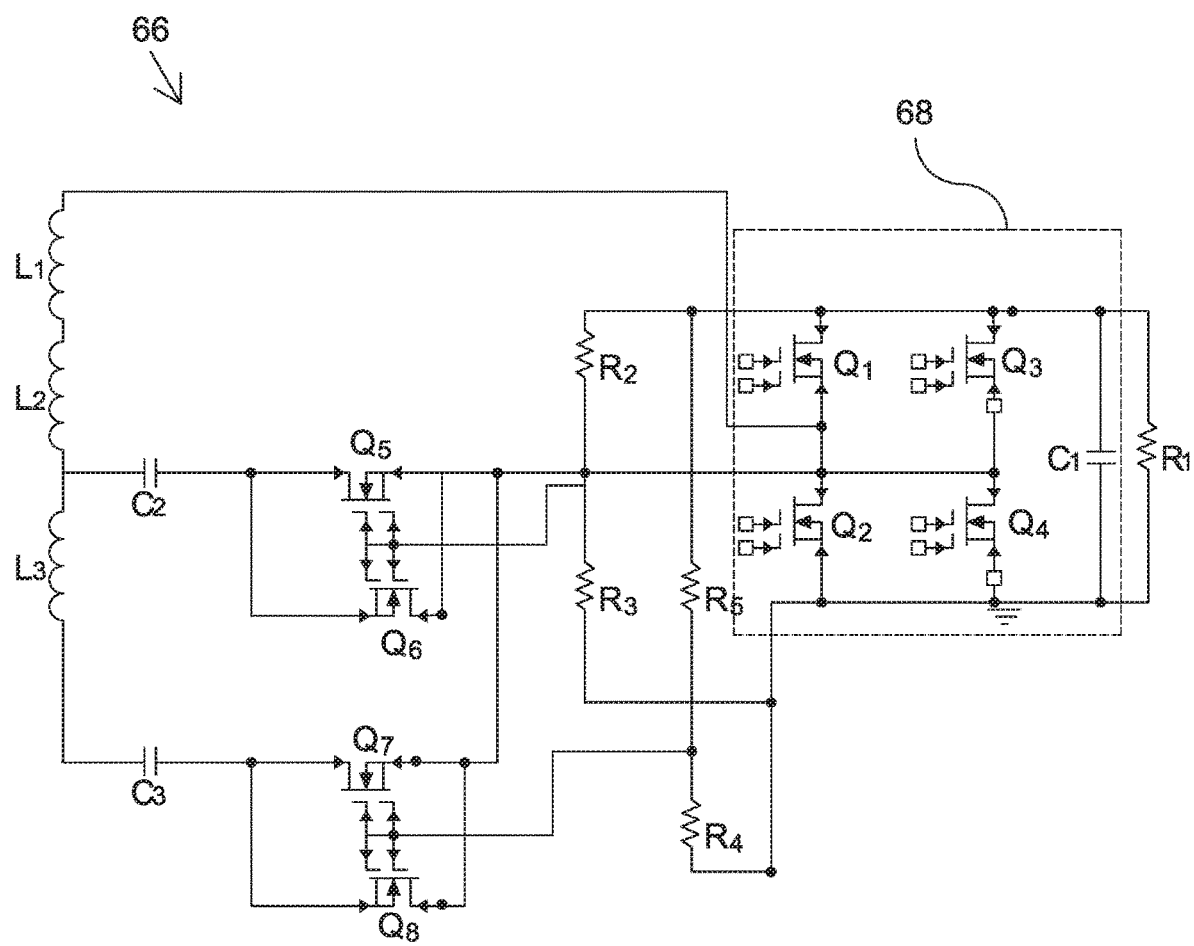
FIG. 4A is an electrical schematic diagram of an embodiment of a transmitting antenna selector sub-circuit.

Alternatively, as shown in FIG. 4, the transmitting circuit 22 may comprise a transmitting antenna selector sub-circuit 66. In one or more embodiments, the transmitting antenna selector sub-circuit 66 illustrated in FIG. 4A is configured with an integrated circuit rectifier 68 comprising field effect transistors $Q_1$-$Q_4$ and capacitor $C_1$. In addition, the transmitting antenna selector sub-circuit 66 comprises electrical resistors $R_1$-$R_5$, capacitors $C_2$-$C_3$, inductors $L_1$-$L_3$ and field effect transistors $Q_5$-$Q_8$. In an embodiment, as shown in FIGS. 4 and 4A, the transmitting antenna selector sub-circuit 66 is configured to select at least one transmitting antenna 18 that resides within the housing 24 of the transmitting base 16. In an embodiment, the transmitting antenna selector sub-circuit 66 dynamically communicates with the communication and control sub-circuit 62 to actively select which transmitting antenna or antennas 18 are used to wirelessly transmit electrical energy. In one or more embodiments, field effect transistors $Q_5$-$Q_8$ are configured to implement the antenna selector sub-circuit 66 and are set by a pair of voltage dividers.

As shown in the block diagram of FIG. 4, the power supply sub-circuit 60 is electrically connected to the inverter 64 and the communication and control sub-circuit 62. In one or more embodiments, the power supply sub-circuit 60 may be electrically connectable to an external electrical power supply 61 (FIG. 13), such as an electrical outlet (not shown). As in the block diagram of FIG. 3, the inverter 64 converts electrical power from direct electrical current to alternating electrical current. The communication and control sub-circuit 62 comprising a master control unit, controls the operation of the transmitting base 16 and flow of the transmitted wireless electrical energy.

Figure 5:
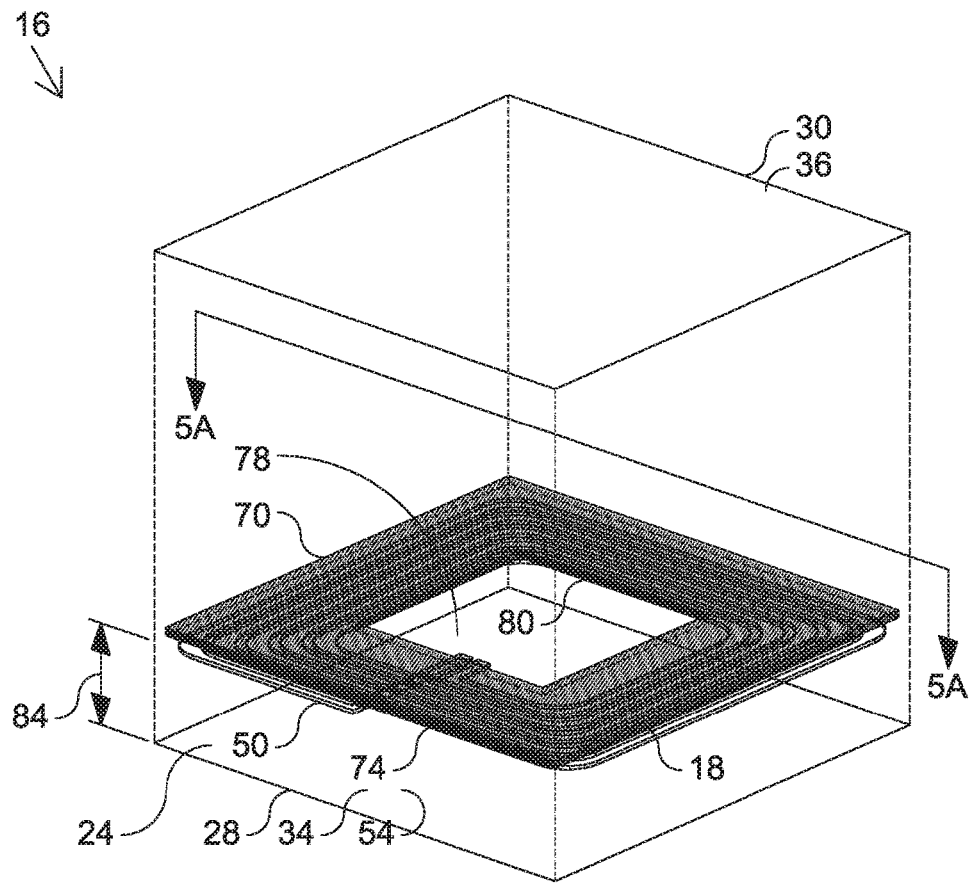
FIG. 5 illustrates an embodiment of a transmitting antenna positioned within the wireless electrical transmission base of the present invention.

FIG. 5 illustrates an embodiment of a transmitting antenna 18 positioned within the housing 24 of the transmitting base 16. As shown, the transmitting antenna 18 comprises a transmitting inductor coil 50 positioned in contact with a magnetic field shielding material 70 such as a ferrite material. In one or more embodiments, the transmitting inductor coil 50 may be positioned adjacent to the magnetic field shielding material 70. In one or more embodiments a transmitting antenna thickness 72 extends between opposing exterior surfaces of the transmitting inductor coil 50 and shielding material 70. In an embodiment, as shown in FIG. 5, the transmitting antenna 18 is of a rectangular shape having a transmitting antenna outer perimeter 74 defined by an outer edge 76. An opening 78 extends through the thickness 72 of the transmitting antenna 18 within the outer perimeter 74. The opening 78 thus defines a transmitting antenna inner perimeter 80. A width 82 extends between the antenna inner perimeter 80 and the antenna outer perimeter 74. In one or more embodiments, the transmitting antenna 18 is positioned within the housing 24 of the transmitting base 16 such that the outer edge 76 along the antenna outer perimeter 74 is in physical contact with an interior surface 54 of the transmitting base housing 24.

In one or more embodiments, the transmitting antenna 18 or repeater 32 may be positioned having a gap 84 that extends between the transmitting antenna 18 or repeater 32 and the proximal end 28 of the transmitting base 16. As defined herein, the gap 84 extends from the interior surface 54 of the bottom sidewall 34 at the proximal end 28 of the transmitting base 16 to a surface of the transmitting antenna 18 or repeater 32 that faces the transmitting base proximal end 28. In an embodiment, the gap 84 may range from about 0 cm such that the transmitting antenna 18 or repeater 32 is in physical contact with the interior surface 54 of the bottom sidewall 34 at the proximal base end 28 to about 10 cm distal of the bottom sidewall 34. Alternatively, the gap 84 may range from about 0 percent of the base length 26, such that the transmitting antenna 18 or repeater 32 is in physical contact with the interior surface 54 of the bottom sidewall 34 at the base proximal end 28 to about 90 percent of the base length 26. Furthermore, at least one transmitting antenna 18 or repeater 32 may be positioned within the transmitting base housing 24 such that the at least one transmitting antenna 18 and repeater 32 are in physical contact with the interior surface 54 of the top sidewall 36 at the base distal end 30. In one or more embodiments modifying the gap 84 typically changes the distance between the transmitting and receiving antennas 18, 20. Generally, as the gap 84 increases, the range within which electrical energy is able to be transmitted is increased. For example, in an embodiment the transmitting base 16 may be constructed with a transmitting antenna 18 with a gap 84 of about 45 mm, thus the range within which electrical energy is able to be wirelessly transmitted typically extends from about 10 to about 30 mm between the transmitting and receiving antennas 18, 20. In this particular example, increasing the gap 84 to about 70 mm increases the range within which electrical energy is able to be wirelessly transmitted from about 30 mm to about 60 mm between the transmitting and receiving antennas 18, 20. In one or more embodiments modifying the gap 84 may change transfer impedance. As defined herein, "transfer impedance" is an electrical impedance that is created by the current flowing within spaced apart transmitting and receiving antennas. In general as the separation distance between the transmitting and receiving antennas 18, 20 decrease, transfer impedance increases. Transfer impedance is defined by the following mathematical equation:

$$Z'_T = \frac{\omega^2 k^2 L_1 L_2}{R_2 + j\omega L_2 + Z_2}$$

where:
$Z'_T$ is the transfer impedance between the transmitting and receiving antennas
k is the coupling between the transmitting and receiving antennas
$\omega$ is the angular frequency
$R_1$ is the electrical resistance of the transmitting antenna
$R_2$ is the electrical resistance of the receiving antenna
$L_1$ is the inductance of the transmitting antenna
$L_2$ is the inductance of the receiving antenna
$Z_2$ is the electrical impedance of the electrical load of the wireless transmission system In one or more embodiments as the gap 84 approaches 0 mm, coupling between the transmitting antenna 18 positioned within the housing and the receiving antenna 20, and coupling between the transmitting antenna 18 and the repeater 32, both positioned within the base housing 24, increases. It is also noted that as the gap 84 approaches 0 mm, the range within which electrical energy is able to be transmitted generally decreases because magnetic fields emanating from an antenna, such as a repeater 32 positioned about perpendicular to the transmitting antenna 18 along the bottom housing sidewall 34 is relatively close to the plane of the transmitting antenna 18. In one or more embodiments, coupling between the transmitting antenna 18 and the repeater 32 within the housing 24 of the transmitting base 16 is optimally between about 0.15 to about 0.85. In one or more embodiments, the transmitting base 16 is configured such that the coupling between the transmitting antenna 18 and the repeater 32 within the base housing 24 is enough such that magnetic fields generated by the transmitting antenna 18 are picked up and amplified by the repeater 32 so that the receiving antenna 20 can convert the received magnetic fields into electrical current and voltage. However, coupling between the transmitting antenna 18 and the repeater 32 within the transmitting base housing 24 should be of a relatively low value to maintain an acceptable transfer impedance such that the amplifier (not shown) of the receiving circuit (not shown) can operate efficiently.

In one or more embodiments, as shown in FIG. 5, the outer edge 76 along the transmitter antenna outer perimeter 74 is in physical contact with the interior surface of all the sidewalls that comprise the transmitting base 16. As a result, the transmitting antenna 18 is capable of transmitting magnetic waves and thus transmit wireless electrical power from the transmitting base 16 about the entire circumference of the base 16. Thus, wireless electrical power is capable of being transmitted about a 360° radius around the transmitting base 16. Furthermore, since the transmitting antenna 18 is positioned in physical contact with the interior surface 54 of the transmitting base housing 24 magnetic fields transmitted from the transmitting antenna 18 are capable of traveling further distances from the base 16. In one or more embodiments, the transmitting antenna thickness 72 may range from about 0.2 mm to about 5 mm. In an embodiment, the width of the transmitting antenna 18 may range from about 20 mm to about 300 mm.

Figure 5A:
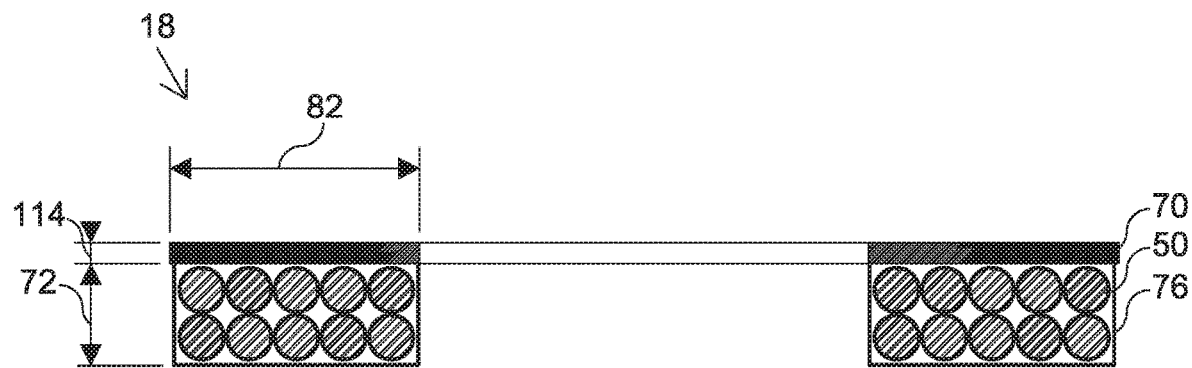
FIG. 5A illustrates a cross-sectional view of a transmitting antenna positioned within the wireless electrical transmission base of the present invention.

In one or more embodiments as illustrated in FIG. 5A, the transmitting antenna 18 may be positioned within the housing 24 of the transmitting base 16 so that the magnetic field shielding material 70, such as the ferrite material is positioned facing towards the wireless transmitting base distal end 30 and the transmitting inductor coil 50 is positioned facing towards the transmitting base proximal end 28. In this embodiment, the shielding material 70 helps to direct the magnetic fields emanating from the transmitting antenna 18 towards the transmitting base proximal end 28. For example, such a configuration may be used to help direct magnetic fields emanating from the transmitting antenna 18 through a surface, such a table supporting the transmitting base 16 and an adjacently positioned electronic device 12 that is intended to be electrically charged or powered. Such a configuration thus allows for an increased amount of magnetic field emanating from the transmitting antenna 18 to be received by the electric device 12 configured with a receiving antenna 20. As a result, an increased amount of electrical energy is able to be wirelessly transferred between the transmitting base 16 and the electronic device 12.

Furthermore, in one or more embodiments the wireless transmitting base 16 may be constructed so that the transmitting inductor coil 50 of the transmitting antenna 18 within the transmitting base 16 is positioned directly adjacent and facing an interior sidewall surface 54 of the transmitting base housing 24. The magnetic field shielding material 70 positioned distal the transmitting inductor coil 50 faces away from the interior sidewall surface 54 and towards the interior of the transmitting base 16. In one or more embodiments, the transmitting antenna 18 may be positioned within the housing 24 of the transmitting base 16 so that the exterior surface of the transmitting inductor coil 50 is in physical contact with the interior sidewall surface 54 of the transmitting base housing 24. This embodiment allows for increasing the magnitude of the transmitted magnetic field. Therefore, as a result, the transmission distance of the magnetic field and, thus, the wireless electric energy is increased. In one or more embodiments, the transmission distance of the magnetic field 15 may be equal to about three times the greater of the length 26, width 46, depth 48, or diameter 58 of the transmitting base 16. In one or more embodiments, the transmission distance of the magnetic field 15 may be equal to about five times the greater of the length 26, width 46, depth 48, or diameter 58 of the transmitting base 16.

In one or more embodiments, the magnetic field shielding material 70 may be a ferrite material with a loss tangent as low as possible. In one or more embodiments, the loss tangent of the ferrite material may be equal to or less than 0.70 at the antenna operating frequency. Such shielding materials may include, but are not limited to, zinc comprising ferrite materials such as manganese-zinc, nickel-zinc, copper-zinc, magnesium-zinc, and combinations thereof. These and other ferrite material formulations may be incorporated within a polymeric material matrix so as to form a flexible ferrite substrate. Examples of such materials may include but are not limited to, FFSR and FFSX series ferrite materials manufactured by Kitagawa Industries America, Inc. of San Jose, Calif. and Flux Field Directional RFIC material, manufactured by 3M™ Corporation of Minneapolis, Minn. In one or more embodiments, the transmitting antenna 18 incorporated with the shielding material 70, such as a ferrite material, should have a self-resonance frequency (SRF)>1.5 times the operating frequency, preferably an SRF>3 times the operating frequency. For example, if the operating frequency is 6.78 MHz, then the SRF of the antenna should be greater than 10 MHz.

Other desired properties of a ferrite shielding material include:
  Real permeability (reflective of magnetic flux absorbing capabilities), $\mu'$: should be as HIGH as possible
  Imaginary permeability (reflective of resistive loss), $\mu''$: should be as LOW as possible
  Ratio: $\mu'/\mu''$: Should be as HIGH as possible
  The Saturation flux density should be as high as possible. This is an important factor especially when the system is operating at relatively high power levels In general, ferrite or other magnetic materials may be employed for the purposes of increasing Mutual inductance between the transmitting and receiving antennas 18, 20 and to magnetically insulate the metallic components (e.g., PCB, battery) of a device from the magnetic fields of the wireless electrical energy transmitting system 14.

In one or more embodiments, the magnetic field shielding material 70 may comprise a single sheet, or it may comprise a plurality of sheets of magnetic shielding material 70 having a gap positioned between the magnetic field shielding material and the inductor coil of the repeater 32, the transmitting antenna 18, or the receiving antenna 20 to reduce eddy current losses within the respective antenna. Alternatively, the magnetic field shielding material 70 may be placed flush with the inductor coil of the repeater 32, the transmitting antenna 18, or the receiving antenna 20. In one or more embodiments, the magnetic field shielding material 70 may comprise a magnetic material, a metallic material, or a combination thereof.

In one or more embodiments, the receiving antenna 20 may be shielded from surrounding electronic components within an electronic device 12 as well as from a metal enclosure or enclosures that comprise the electronic device 12. In one or more embodiments, a receiving inductor coil 86 of the receiving antenna 20 may be shielded from surrounding electronic components within an electronic device 12 as well as from a metal enclosure or enclosures that comprise the electronic device 12. The electronic components within an electronic device 12 may be shielded from magnetic fields coupling with the receiving antenna 20. For example, shielding a receiving antenna 20 from a battery (not shown) placed directly behind the receiving antenna 20 within an electronic device 12. Magnetic fields may couple with the battery thereby inducing electrical current in the battery and thus causing the battery to heat which may degrade the life of the battery. Other metallic parts of the device may need to be shielded from the antenna to prevent eddy currents from being induced within the antenna and device which cause undesirable heating.

Thus, as will described in more detail, the embodiments of magnetic field shielding disclosed herein provide shielding of the transmitting and receiving antennas 18, 20 from such components as an electrochemical cell (not shown) or other electronic components such that the quality factor of the antenna is sustained. Thus, the various magnetic field shielding embodiments provide for an increased quality factor and self-resonant frequency of the transmitting or receiving antennas 18, 20. In addition, the magnetic field shielding embodiments provide for increased coupling efficiency and end to end DC to DC efficiency. Furthermore, the magnetic field shielding embodiments provide for increased power handling capability.

In one or more embodiments, the repeater 32, transmitting antenna 18 or receiving antenna 18 may comprise at least one inductor coil such as the non-limiting examples disclosed in U.S. Pat. App. Nos. 2017/0040690, 2017/0040692, 2017/0040107, 2017/0040105, 2017/0040696, and 2017/0040688 all to Peralta et al., 2017/0040691, 2017/0040694 to Singh et al., 2017/0040693 to Luzinski and 2017/0040695 to Rajagopalan et al., all of which are assigned to the assignee of the present application and incorporated fully herein. In addition, the repeater 32, the transmitting antenna 18 or the receiving antenna 20 may be configured in a multi-layer-multi-turn (MLMT) construction in which at least one insulator is positioned between a plurality of conductors. Non-limiting examples of antennas having an MLMT construction that may be incorporated with the present disclosure may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, 9,300,046, all to Singh et al., and assigned to the assignee of the present application are incorporated fully herein. It is also noted that other antennas such as, but not limited to, an antenna configured to send and receive signals in the UHF radio wave frequency such IEEE standard 802.15.1 may be incorporated within the present disclosure.

In one or more embodiments, the inductor coils of either the repeater, the transmitting antenna 18, or the receiving antenna 20 are strategically positioned to facilitate reception and/or transmission of wirelessly transferred electrical power or data through near field magnetic induction. Antenna operating frequencies may comprise all operating frequency ranges, examples of which may include, but are not limited to, about 100 kHz to about 200 kHz (Qi interface standard), 100 kHz to about 350 kHz (PMA interface standard), 6.78 MHz (Rezence interface standard), or alternatively at an operating frequency of a proprietary operating mode. In addition, the repeater 32 the transmitting antenna 18 and/or the receiving antenna 20 of the present disclosure may be designed to transmit or receive, respectively, over a wide range of operating frequencies on the order of about 1 kHz to about 1 GHz or greater, in addition to the Qi and Rezence interfaces standards. In addition, the repeater 32, the transmitting antenna 18 and the receiving antenna 20 of the present disclosure may be configured to transmit and/or receive electrical power having a magnitude that ranges from about 100 mW to about 1,000 mW. In one or more embodiments the transmitting inductor coil 50 of the transmitting antenna 18 is configured to resonate at a transmitting antenna resonant frequency or within a transmitting antenna resonant frequency band. In one or more embodiments the transmitting antenna resonant frequency is at least 1 kHz. In one or more embodiments the transmitting antenna resonant frequency band extends from about 1 kHz to about 100 MHz. In one or more embodiments the repeater inductor coil 98 of the repeater 32 is configured to resonate at a repeater resonant frequency or within a repeater resonant frequency band. In one or more embodiments the repeater resonant frequency is at least 1 kHz. In one or more embodiments the repeater resonant frequency band extends from about 1 kHz to about 100 MHz. In one or more embodiments the receiving inductor coil 86 of the receiving antenna 20 is configured to resonate at a receiving antenna resonant frequency or within a receiving antenna resonant frequency band. In one or more embodiments the receiving antenna resonant frequency is at least 1 kHz. In one or more embodiments the receiving antenna resonant frequency band extends from about 1 kHz to about 100 MHz.

Figure 6:
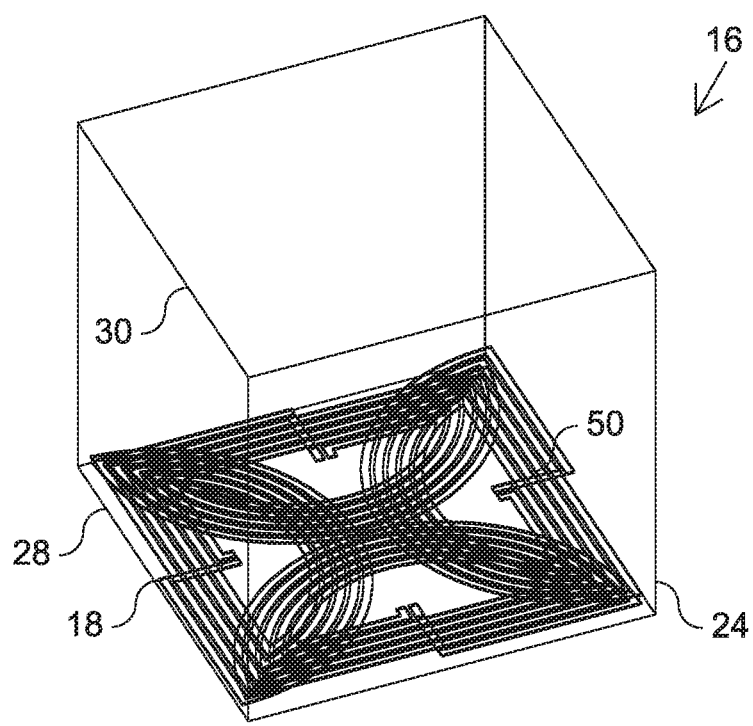
FIGS. 6-8 illustrate embodiments of configurations of transmitting antennas that may be positioned within the wireless electrical transmission base of the present invention.
Figure 7:
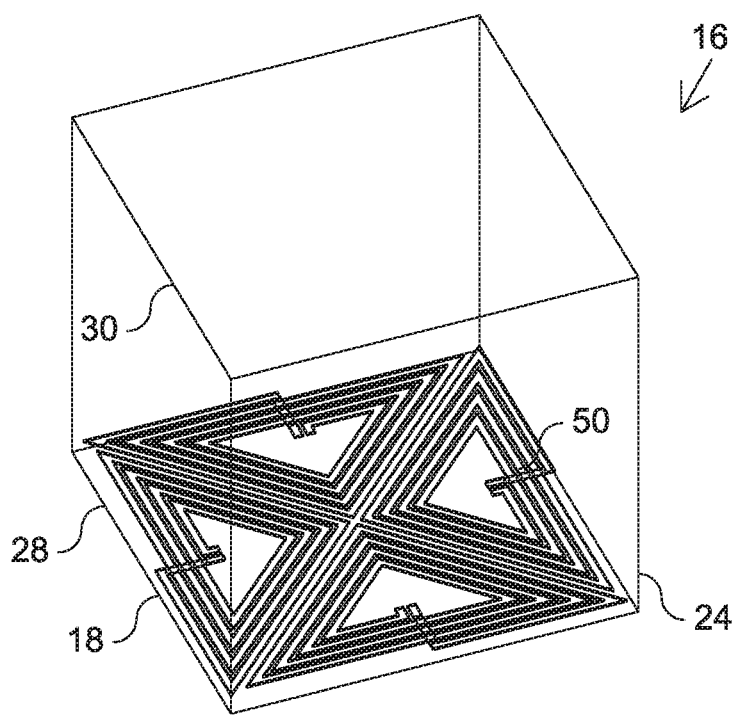
Figure 8:
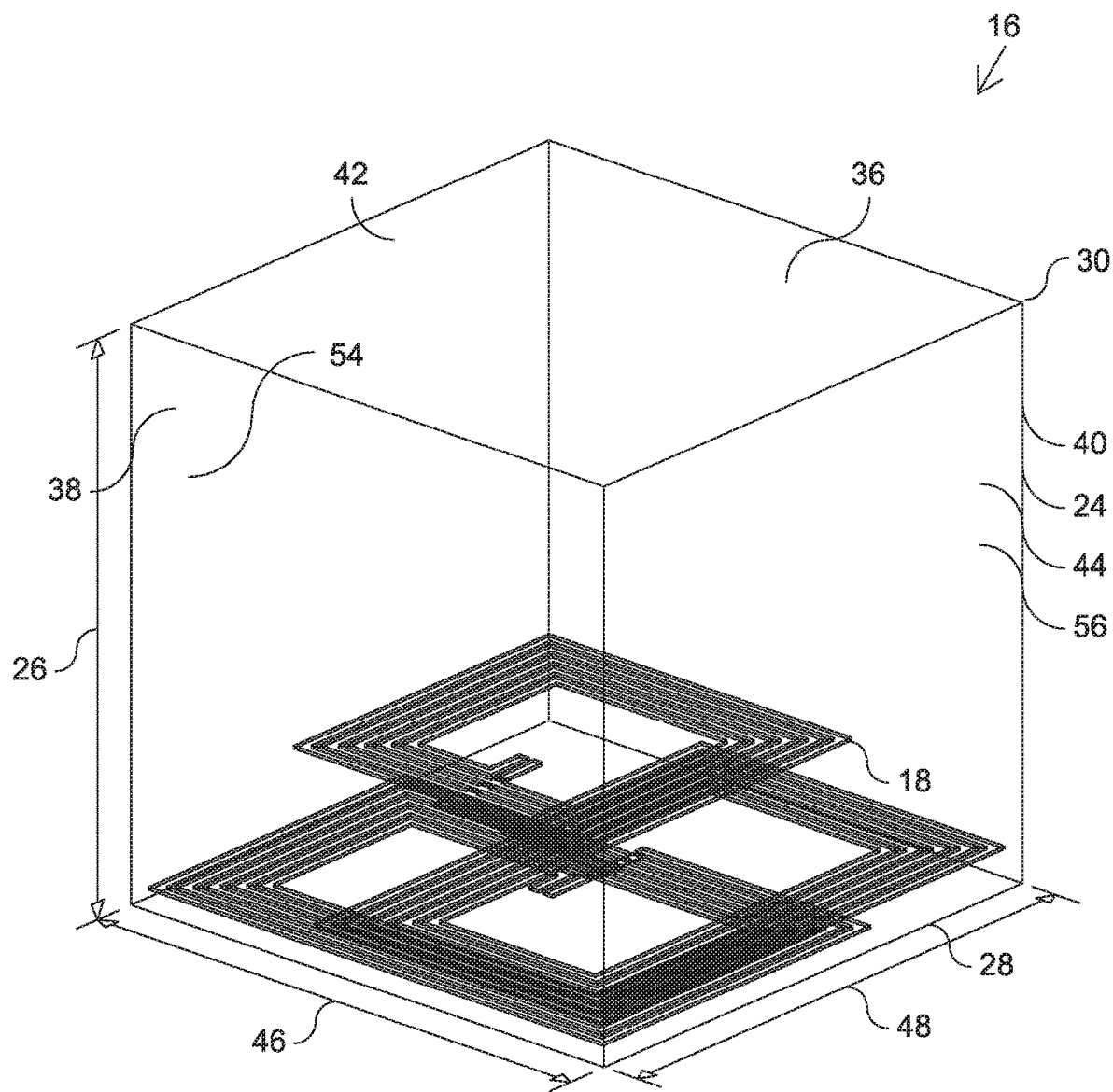

FIGS. 6-8 through illustrate one or more embodiments of various configurations of the transmitting inductor coil 50 of the transmitting antenna 18. As shown in FIG. 6, the transmitting coil 50 may be of a curved shaped, such as of a semi-circle, a triangular shape as shown in FIG. 7 or a rectangular shape as shown in FIG. 8. In one or more embodiments the transmitting inductor coil 50 may be configured in a variety of unlimited shapes. Such shapes are particularly designed to conform to the shape of the interior surface of the housing 24 of the transmitting base 16.

Figure 9:
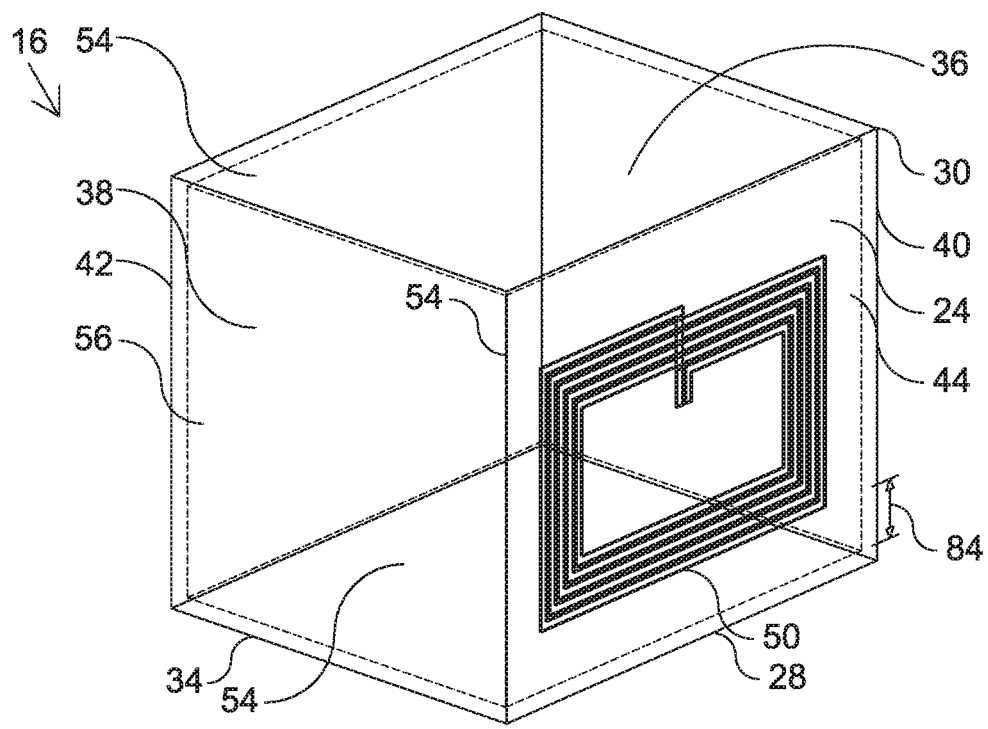
FIGS. 9 and 9A illustrate embodiments of a transmitting antenna positioned along an interior surface of the housing and the wireless electrical transmission base of the present invention.
Figure 9A:
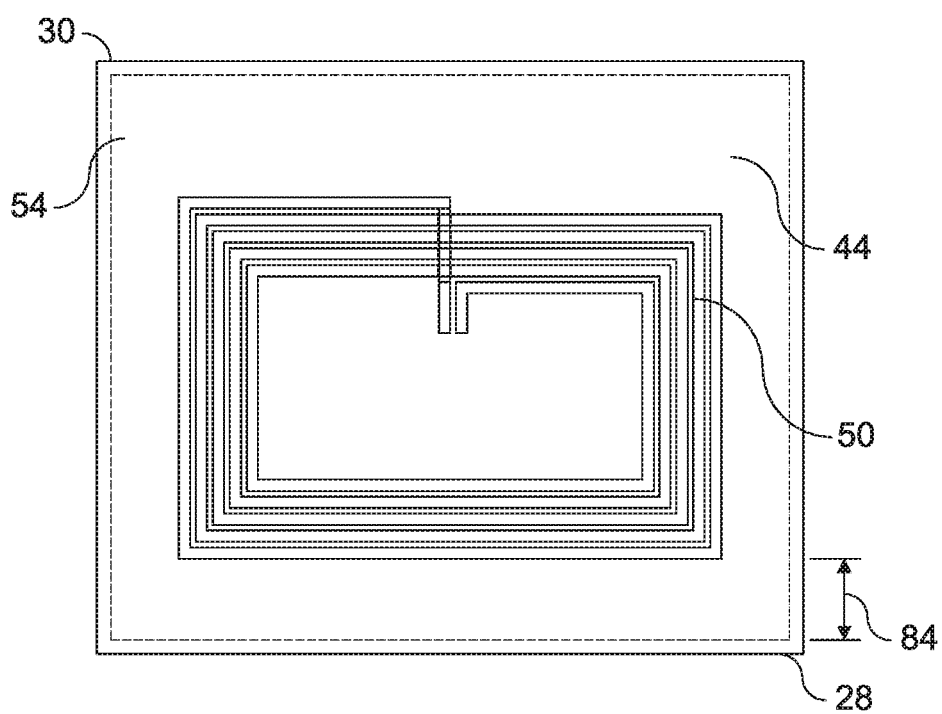

FIGS. 9 and 9A illustrate one or more embodiments in which the transmitting inductor coil 50 is positioned in contact with the interior sidewall surface 54 of the housing 24 of the wireless transmitting base 16. As shown in FIGS. 9 and 9A, the transmitting inductor coil 50 is positioned in physical contact with the interior surface 54 of the right sidewall 44. FIG. 9A illustrates the transmitting coil 50 positioned on the interior sidewall surface 54. In one or more embodiments, as shown, the transmitting inductor coil 50 may be positioned so that it is positioned to be co-planar with the interior surface 54 of the transmitting base sidewall. In the embodiment shown, the transmitting inductor coil 50 is positioned about co-planar with the interior surface 54 of the left sidewall 42 and about perpendicular to the interior surface of the bottom sidewall 34 at the base proximal end 28. In one or more embodiments, the gap 84 is shown extending from the interior surface 54 of the bottom sidewall 34 at the proximal end 28 to the surface of the transmitting antenna 18 that faces towards the transmitting base proximal end 28.

Figure 10:
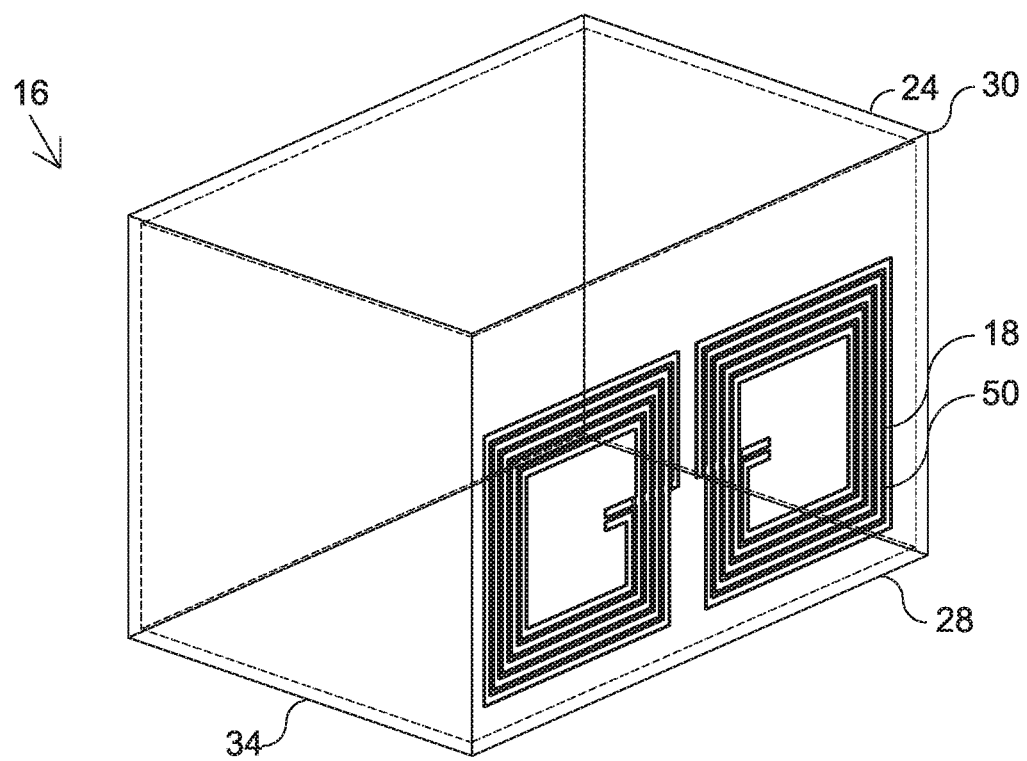
FIGS. 10 and 11 illustrate embodiments of configurations of a transmitting antenna positioned along an interior surface of the housing and the wireless electrical transmission base of the present invention.
Figure 11:
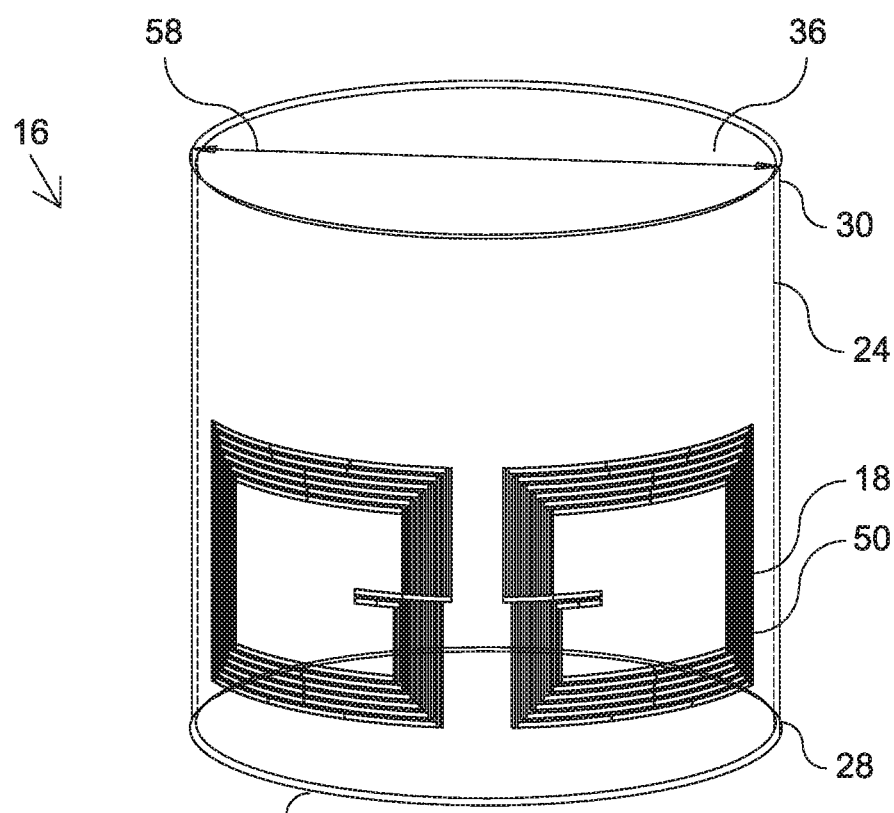

FIGS. 10 and 11 illustrate one or more embodiments in which the transmitting inductor coil 50 is shaped to conform to the interior surface of the transmitting base housing sidewall. As illustrated in FIG. 10, the transmitting inductor coil 50 is configured in a rectangular shape. As illustrated in FIG. 11, the transmitting inductor coil 50 is configured having a curved shape. In one or more embodiments the various configurations of the transmitting inductor coil 50 shown in FIGS. 10 and 11 show how the shape of the transmitting inductor coil 50 is designed to conform to the shape of the sidewall of the housing 24 of the wireless transmitting base 16. For example, the rectangular shaped transmitting inductor coil 50 illustrated in FIG. 10 is shown positioned on the interior surface of a transmitting base housing 24 having a rectangular shaped sidewall. The curved shaped transmitting inductor coil 50 illustrated in FIG. 11 is shown positioned on the interior surface of a transmitting base housing 24 having a curved shaped sidewall.

Figure 12:
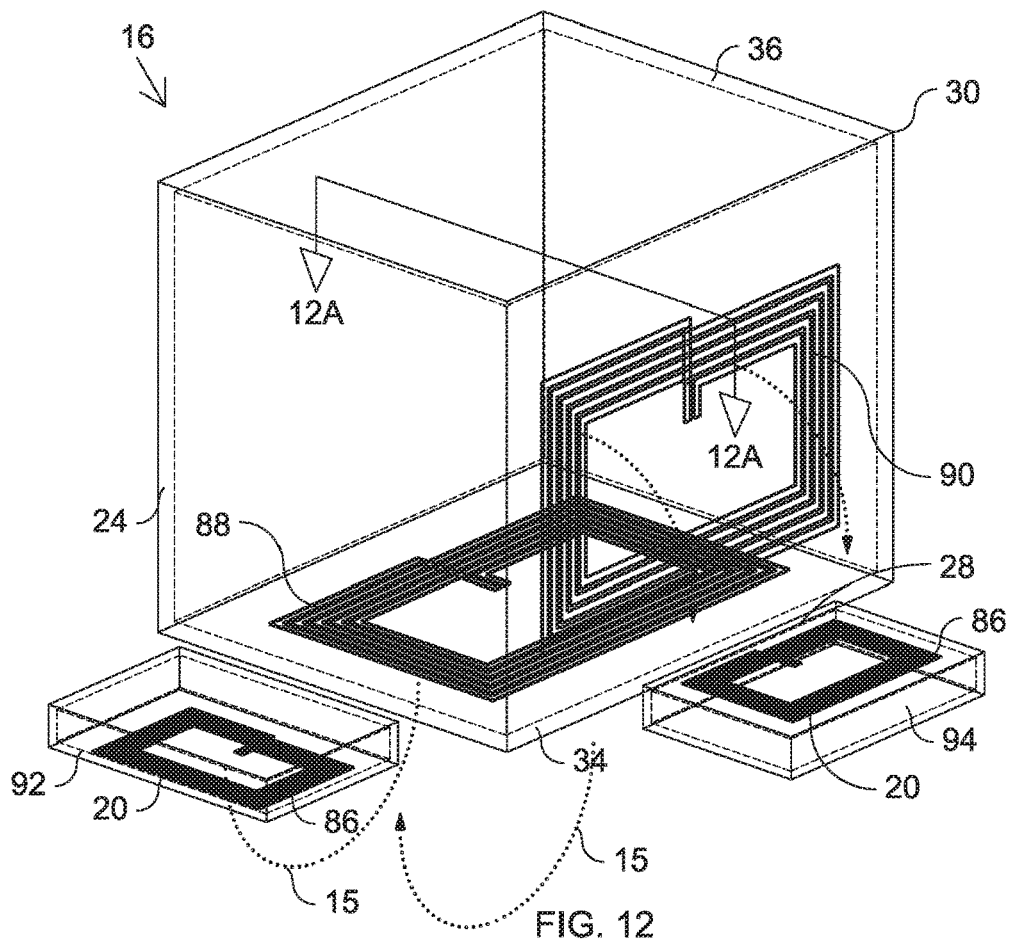
FIG. 12 illustrates an embodiment showing two transmitting antennas positioned within the wireless electrical transmission base in relation to two electronic devices positioned external and adjacent to the base.
Figure 12A:
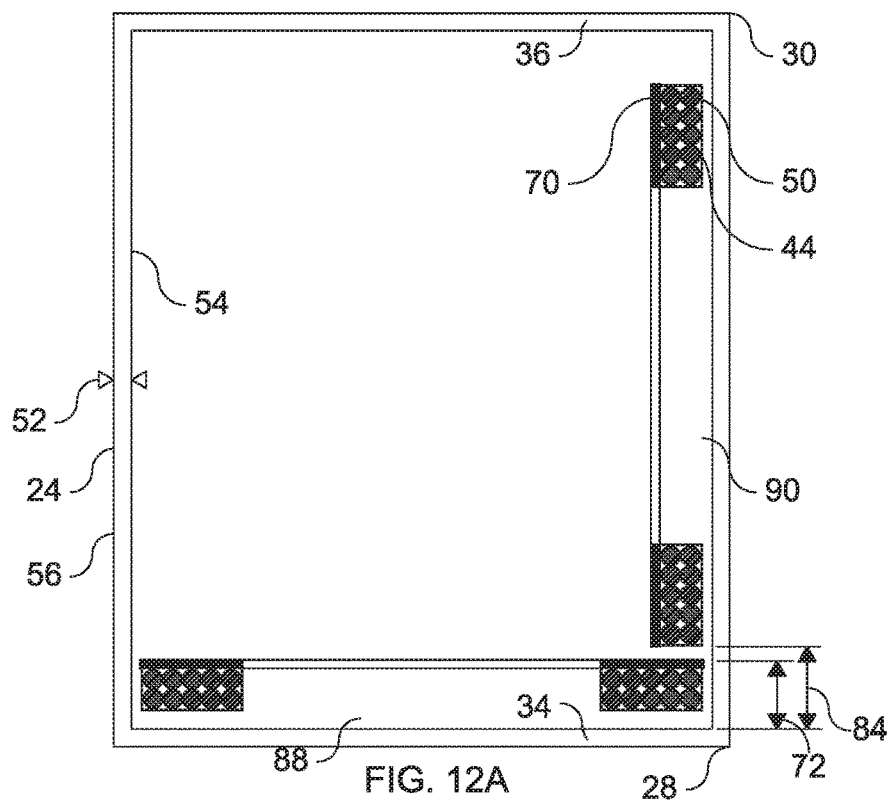
FIG. 12A is a cross-sectional view of the two transmitting antennas positioned within the wireless electrical transmission base as illustrated in the embodiment of FIG. 12.

FIGS. 12 and 12A illustrate one or more embodiments in which the wireless transmitting base 16 may comprise multiple transmitting antennas 18 within its housing 24. As shown, the transmitting base 16 comprises a first transmitting antenna 88 positioned along the interior surface of the bottom sidewall 34 at the transmitting base proximal end 28 and a second transmitting antenna 90 positioned along the interior surface of the right sidewall 44 of the transmitting base 16. As shown, the transmitting inductor coil 50 of each of the first and second transmitting antennas 88, 90 is positioned in physical contact with the interior surface of their respective housing sidewalls. In one or more embodiments the magnetic field shielding material 70 may be positioned behind and in contact with the transmitting inductor coil 50 of either or both of the first and second transmitting antennas 88, 90. In one or more embodiments the first and second transmitting antennas 88, 90 may be electrically connected to the transmitting electronic circuit 22 such that the respective first and second transmitting antennas 88, 90 may be individually controlled. In addition, in one or more embodiments the first and second transmitting antennas 88, 90 may be electrically connected to the transmitting electronic circuit 22 so that electrical energy may be wirelessly transmitted simultaneously or individually from the first and second transmitting antennas 88, 90. In one or more embodiments the transmitting electronic circuit 22 may control the selection and/or operation of a repeater 32. FIG. 12 illustrates one or more embodiments in which multiple electronic devices 12 are simultaneously charged by positioning them adjacent to the wireless transmitting base 16. As shown in FIG. 12, a first electronic device 92 is being charged by the first transmitting antenna 88 and a second electronic device 94 is being charged by the second transmitting antenna 90. It is contemplated that the wireless transmitting base 16 is not limited to two transmitting antennas 18. In one or more embodiments multiple transmitting antennas 18 and/or repeaters 32 may be positioned along the interior surface of any sidewall within the transmitting base housing 24. Thus, by configuring the wireless transmitting base 16 with multiple repeaters 32 and/or transmitting antennas 18, the area of wireless electrical energy transmission can be extended about the transmitting base 16. Furthermore, since each of the multitude of repeaters 32 and/or transmitting antennas 18 can be individually controlled, the transmission of electrical energy can be tuned or steered in a particular direction or area segment.

Figure 13:
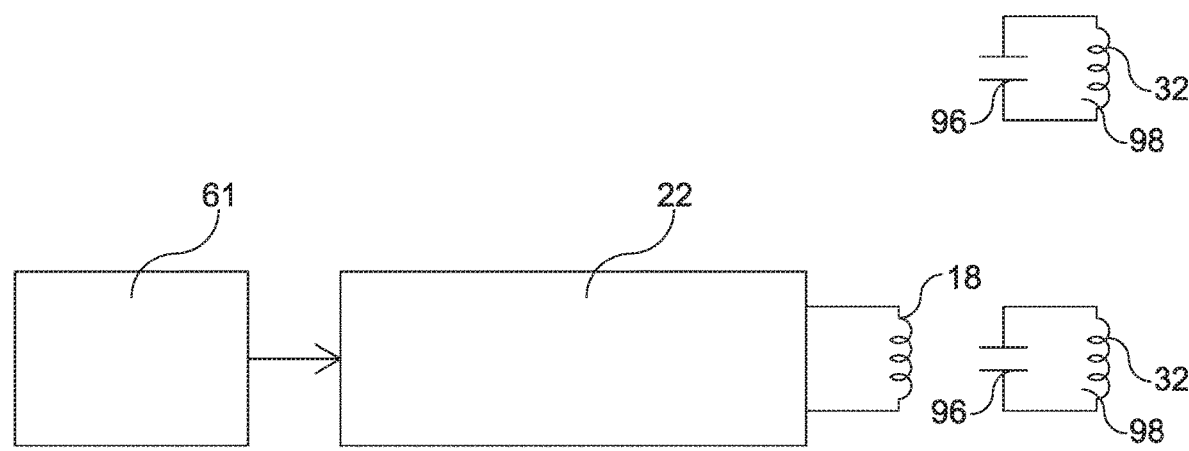
FIG. 13 shows an embodiment of a block diagram of an electrical circuit configured to condition electrical energy to be transmitted wirelessly comprising a repeater antenna.
Figure 13:
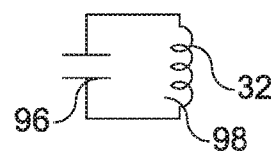

FIG. 13 illustrates one or more embodiments of a block diagram of the transmitting electronic circuit 22 comprising at least one repeater 32. As shown in the block diagram of FIG. 13, the external power supply 61 is electrically connected to the transmitting electronic circuit 22 (shown in the embodiments of FIG. 3 or 4) comprising at least one transmitting antenna 18. As illustrated in FIG. 13, three repeaters 32 are positioned away from the transmitting antenna 18. In the embodiment, each repeater 32 comprises a capacitor 96 that is electrically connected to a repeater inductor coil 98.

Figure 14:
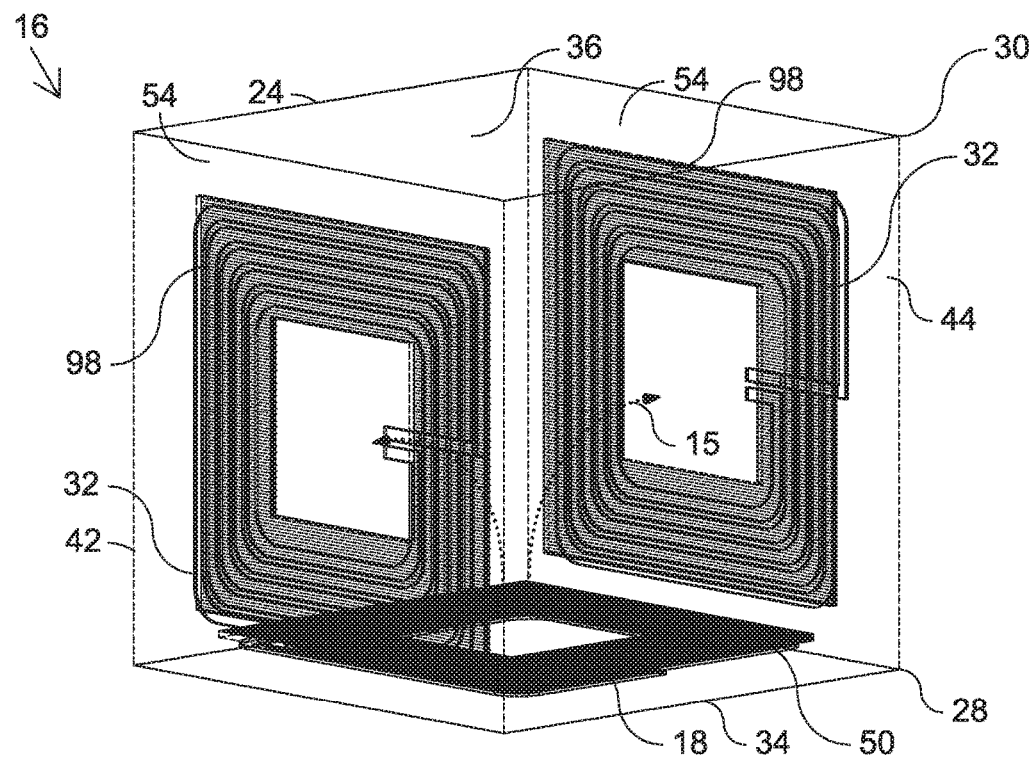
FIG. 14 illustrates an embodiment showing two repeater antennas in relationship to a transmitting antenna positioned within the wireless electrical transmission base and in relation to two electronic devices positioned external and adjacent to the base.

FIG. 14 illustrates one or more embodiments in which the at least one repeater 32 is positioned along the interior surface 54 of the wireless transmitting base housing 24. As shown, two repeaters 32 are positioned along the interior surface of the left and right sidewalls 42, 44 respectively of the transmitting base housing 24. The transmitting antenna 18 is positioned along the bottom sidewall 34 at the base proximal end 28. In one or more embodiments the transmitting antenna 18 wirelessly transmits electrical energy and/or data by emitting magnetic fields. The two repeaters 32 each receive the wirelessly transmitted electrical energy through the magnetic fields and further transmit the electrical energy by emitting magnetic fields from their respective repeater inductor coil 98.

Figure 15:
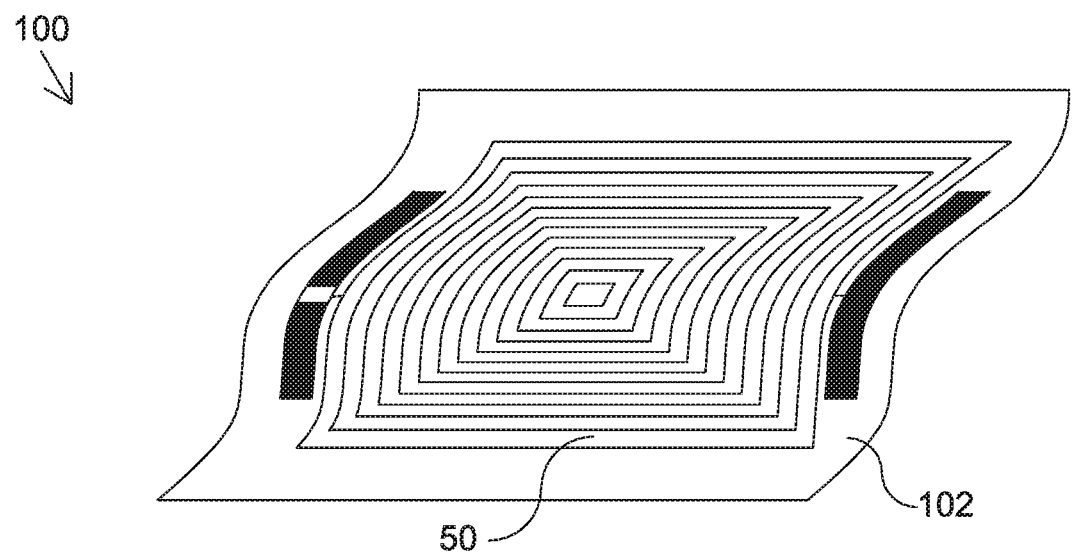
FIGS. 15 and 16 illustrate embodiments of a flexible transmitting antenna that may be incorporated within the wireless electrical energy transmission system of the present invention.
Figure 16:
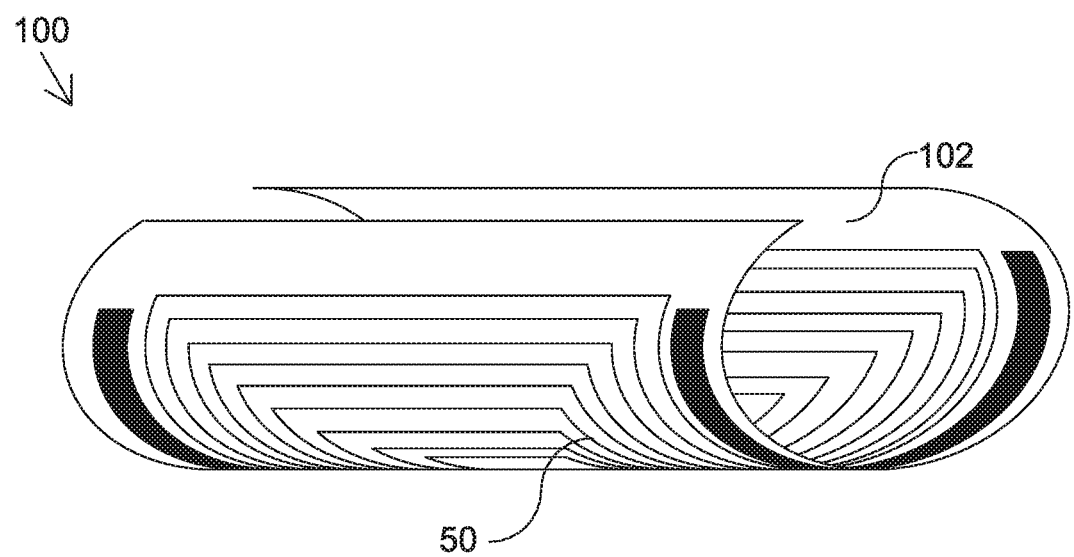

FIGS. 15 and 16 illustrate one or more embodiments of a flexible transmitting antenna 100. In one or more embodiments the flexible transmitting antenna 100 is designed to conform to the interior surface of the housing 24 of the wireless transmitting base 16. As shown, the flexible transmitting antenna 100 comprises at least one transmitting inductor coil 50 positioned on or within a substrate 102 that is mechanically flexible. In one or more embodiments, the substrate 102 is composed of a material such as a polymer that is capable of mechanical bending or stretching. In one or more embodiments, the substrate 102 may be composed of a composite material comprising a polymer, a ceramic, a glass, a metal, or a combination thereof. The polymeric material may include polydimethylsiloxanes (PDMS), polyethyleneterephthalate (PET), Teflon, Teflon doped with a dielectric material, polytetrafluoroethylene (PTFE), ethylenetetrafluoroethylene (ETFE), parylenes, polyether block amide (PEBAX), polyetheretherketone (PEEK), polystyrenes, polysulfones, polypropylenes, polycarbonates, polyvinyl chloride (PVC), polyxylylene polymers, polyamides, polyimides, nylon, epoxies, and other such suitable polymers, elastomers and gels, including combinations thereof. Ceramic materials may include alumina (or aluminum oxide), barium titanate, zirconia-based ceramics such as YSZ (yttria-stabilized zirconia), alumina based composites, glass ceramics such as alumina-silica, and the like. Additionally, these ceramic materials may be used in conjunction with flexible polymer materials to create hybrid receiving/transmitting antennas, components, resonators, and subassemblies.

In addition, the substrate 102 is constructed of a relatively thin thickness that helps enable the flexibility of the substrate 102. In one or more embodiments, the thickness of the substrate 102 may range from about 0.01 cm to about 0.5 cm. In one or more embodiments, the flexible mechanical properties enable the transmitting antenna 100 to conform to the interior surface or surfaces within the wireless transmitting base 16. For example, the flexible transmitting antenna 100 may be positioned along a curved surface within the transmitting base 16 or may be positioned along and/or over a junction of two sidewalls of the transmitting base housing 24.

Figure 17:
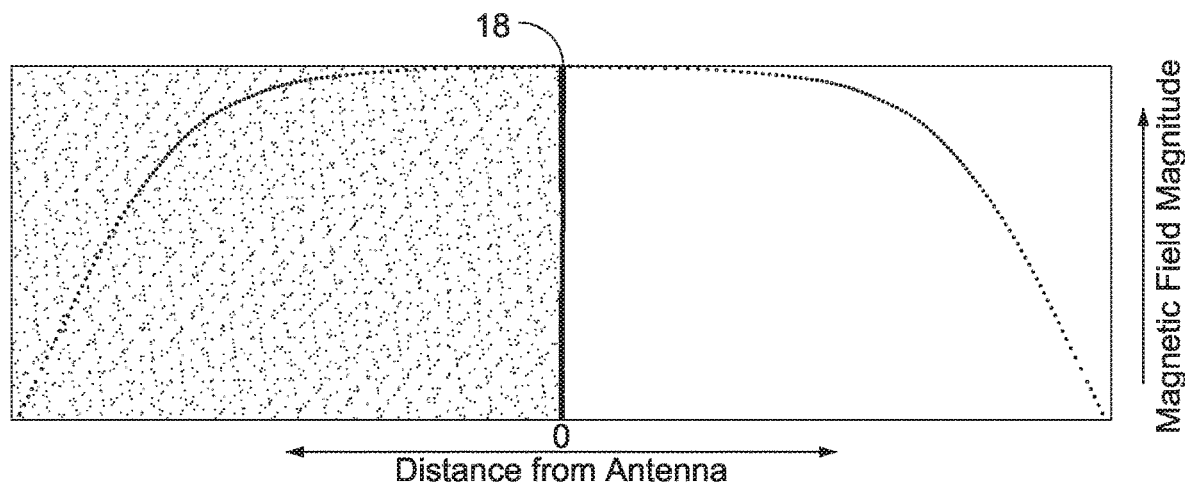
FIG. 17 is a graph that illustrates an embodiment of the direction and magnitude of a magnetic field emanating from a transmitting antenna as a function of distance.

FIG. 17 illustrates a graph that shows magnetic field strength as a function of distance from a transmitting antenna 18. As shown, as the magnetic field travels in opposite directions from the transmitting antenna 18, the strength of the magnetic field decreases. As illustrated, the magnetic field travels away from the transmitting antenna in opposing directions having an initial maximum magnitude. For example, as illustrated in FIG. 17, in front and in back of the transmitting antenna 18. The magnetic field travels to a distance away from the transmitting antenna 18 at which the magnitude of the field decays to zero. Thus, in one or more embodiments, in order to increase the magnitude and distance of travel of the magnetic field, the magnetic shielding material 70 is utilized. Thus, by shielding the magnetic field from one side of the antenna, the magnitude and direction of travel of the magnetic field can be increased in one direction.

Figure 18:
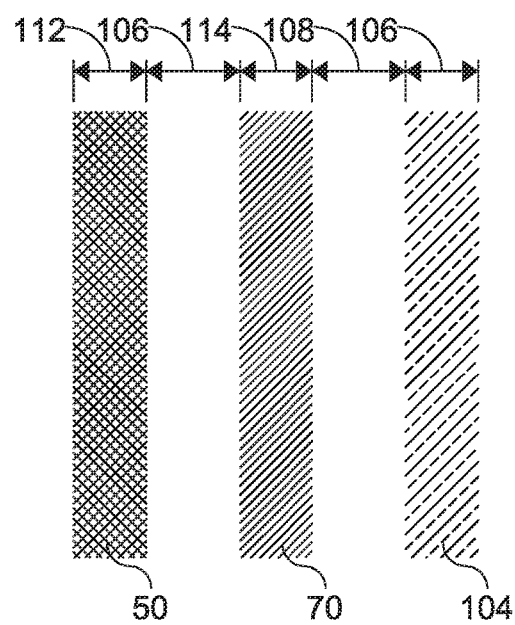
FIG. 18 is a cross-sectional view of an embodiment of a construction of a transmitting or receiving antenna that may be used within the wireless transmission system of the present invention.

FIG. 18 illustrates one or more embodiments of the construction of the transmitting antenna 18 that may be used within the transmitting base 16 of the present invention. As shown in the embodiment, the transmitting antenna 18 comprises a transmitting inductor coil 50 positioned proximal to the magnetic field shielding material 70. A conductive material 104, such as a sheet of copper, may be positioned distal the magnetic field shielding material 70. In one or more embodiments, the inclusion of the conductive material 104 within the antenna construction minimizes electromagnetic interference (EMI). Thus, the transmitting antenna 18 comprises a composite structure in which the magnetic shielding material 70 is sandwiched between the transmitting inductor coil 50 and the conductive material 104. In one or more embodiments, a first gap 106 may reside between the transmitting inductor coil 50 and the magnetic field shielding material 70. In one or more embodiments, a second gap 108 may reside between the magnetic field shielding material 70 and the conductive material 104. In one or more embodiments, the first and second gaps 106, 108 may range from about 0 mm to about 10 mm. In a further embodiment, the transmitting inductor coil 50 may be positioned on a substrate 110 such that the substrate 110 is positioned between the transmitting inductor coil 50 and the magnetic field shielding material 70. In one or more embodiments, the transmitting inductor coil 50 may have a transmitting inductor coil thickness 112 that ranges from about 0.1 mm to about 2 mm. In one or more embodiments, the magnetic field shielding material 70 may have a magnetic field shielding material thickness 114 that ranges from about 0.1 to about 3 mm. In one or more embodiments, the conductive material 104 may have a conductive material thickness 116 that ranges from about 0.05 mm to about 0.5 mm. In one or more embodiments, the conductive material may comprise an electrically conductive material, non-limiting examples include, but are not limited to copper, nickel, aluminum, or a combination thereof.

Thus, by constructing the transmitting antenna 18 having at least one of the magnetic field shielding material 70 and the conductive material 104, the emanating magnetic field is restricted from traveling into undesired areas. In one or more embodiments, constructing the transmitting antenna 18 having at least one of the magnetic field shielding material 70 and the conductive material 104, ensures that the emanating magnetic field travels in one direction, away from the magnetic field shielding material 70 and/or the conductive material 104 thereby increasing the efficiency of the transmitting antenna 18. As a result, magnetic fields and thus wireless electrical energy travel further distances before the magnitude of the magnetic fields decays to zero. As a result, the transmitting base 16 of the present invention is capable of wirelessly transmitting an increased amount of electrical energy and transmit the electrical energy further away from the base 16 thereby enabling multiple electronic devices 12 to be charged or electrically powered at distances away from the wireless transmitting base 16.

Figure 19:
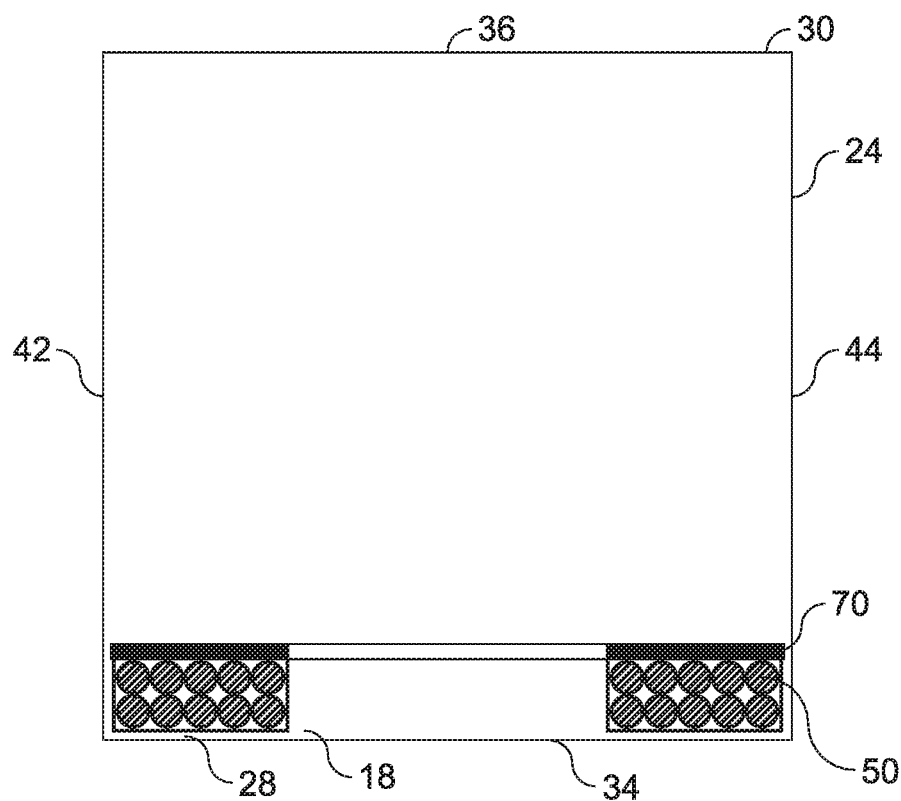
FIG. 19 is a cross-sectional view of an embodiment of a transmitting antenna positioned within the wireless electrical transmission base.
Figure 19A:
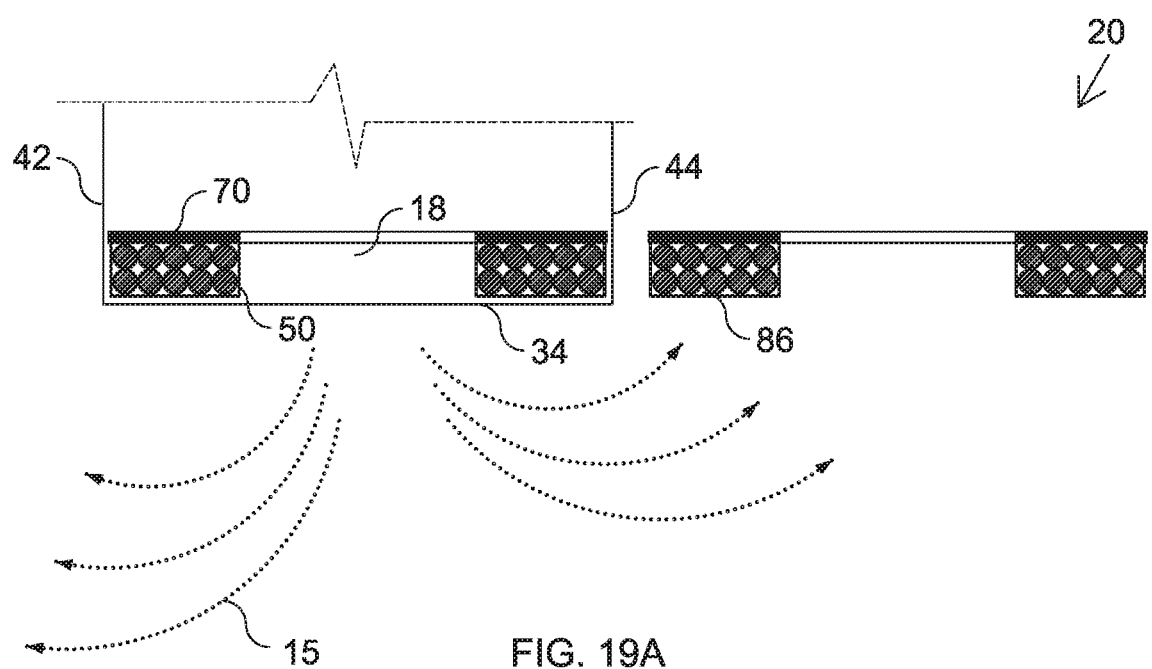
FIG. 19A is a cross-sectional view of an embodiment of a transmitting antenna positioned within the wireless electrical transmission base in relation to a receiving antenna positioned within an electronic device positioned external of the base.

FIGS. 19 and 19A illustrate one or more embodiments of the transmitting antenna 18 positioned along an interior surface of the housing 24 at the transmitting base proximal end 28 in relation to a receiving antenna 20 positioned within an electronic device 12. As shown in FIG. 19, by positioning the transmitting antenna 18 comprising a transmitting inductor coil 50 in contact with the interior surface of the housing sidewall at the proximal end 28 and having magnetic field shielding material 70 positioned distal the transmitting inductor coil 50, magnetic fields emanate in a proximal direction from the transmitting antenna 18 through the base proximal end 28. Thus, emanating magnetic fields that facilitate wireless transmission of electrical energy are positioned closer to an electronic device 12 equipped with a receiving antenna 20 positioned on the same supporting surface as the transmitting base 16, such as a table or desk. As a result, the magnitude of the emanating magnetic fields and thus the magnitude of wirelessly transmitted electrical energy is increased about the base proximal end 28 which electronic devices 12 to be charged or powered are typically positioned. In the embodiment illustrated in FIG. 19A, magnetic fields that are shown emanating from the transmitting antenna 18 through the base proximal end 28 are received by an electronic device 12 equipped with a receiving antenna 20 positioned adjacent to the transmitting base proximal end 28. Therefore, wireless electrical energy and/or data is transmitted more efficiently. In one or more embodiments, as illustrated in FIG. 19A, the transmitting inductor coil 50 and the receiving inductor coil 86 are positioned so that they are coplanar to each other. This orientation helps facilitate efficient wireless electrical energy transfer between the wireless transmitting base 16 and an electronic device 12 that is positioned adjacent to the wireless transmitting base 16.

Figure 20:
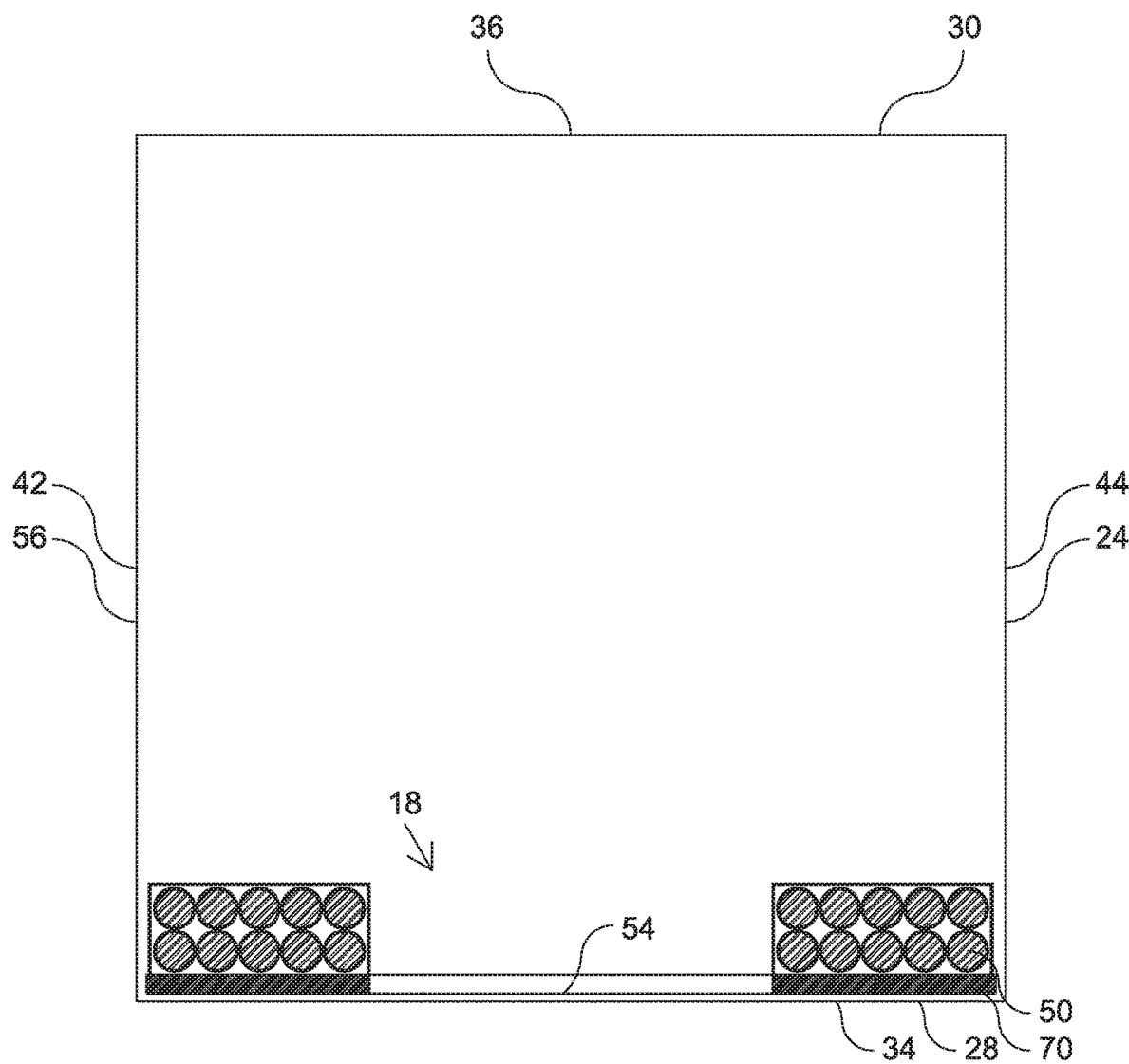
FIG. 20 is a cross-sectional view of an embodiment of a transmitting antenna positioned within the wireless electrical transmission base.

Alternatively, as illustrated in FIG. 20 in one or more embodiments, the transmitting antenna 18 may be positioned within the housing 24 of the wireless transmitting base 16 such that the magnetic field shielding material 70 is in physical contact with the interior surface of at least one housing sidewall. Furthermore, it is contemplated that the transmitting antenna 18 may be positioned within the housing 24 of the wireless transmitting base 16 such that the conductive material 104 is in physical contact with an interior surface of at least one housing sidewall. In one or more embodiments, the wireless transmitting base 16 may be constructed having a variety of transmitting antennas 20 and/or repeaters 32 therewithin. These transmitting antennas 20 and/or repeaters 32 may be positioned in a variety of unlimited orientations to manipulate the direction and magnitude of the emanating magnetic fields that enable wireless transmission of electrical energy and/or data.

Figure 21:
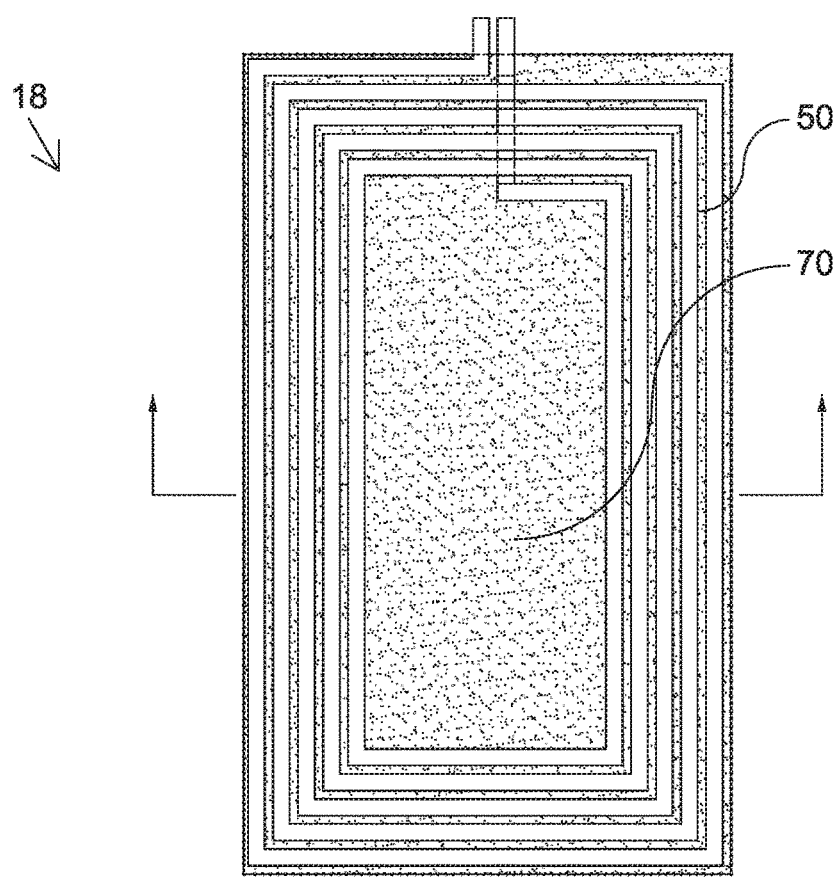
FIG. 21 illustrates an embodiment of a transmitting or receiving antenna that may be incorporated within the wireless transmission system of the present invention.
Figure 21A:
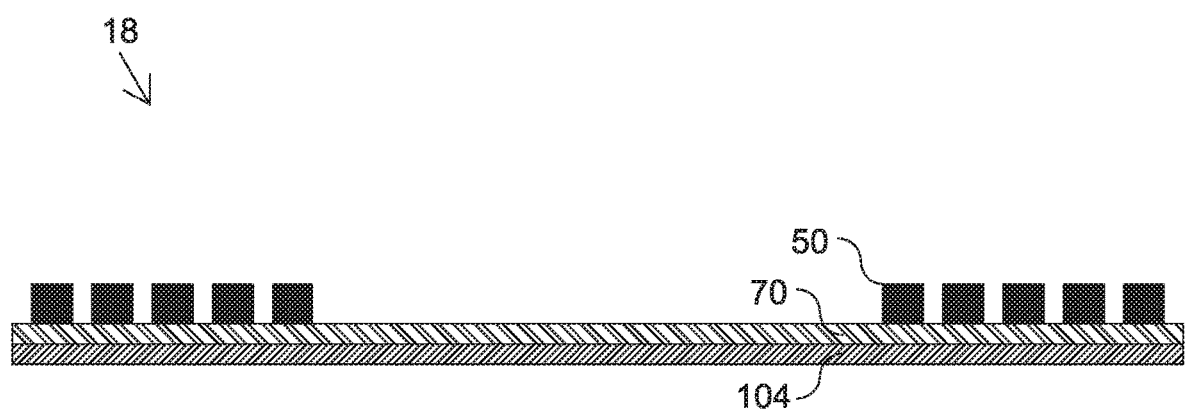
FIG. 21A is a cross-sectional view of the transmitting or receiving antenna shown in FIG. 20.

FIG. 21 illustrates one or more embodiments of a transmitting antenna 18 comprising a transmitting inductor coil 50 positioned on a magnetic field shielding material 70, such as a ferrite material. FIG. 21A illustrates a cross-sectional view of the antenna shown in FIG. 21. As illustrated, a sheet of conductive material 104 is positioned distal and in contact with the magnetic field shielding material 70.

Figure 22:
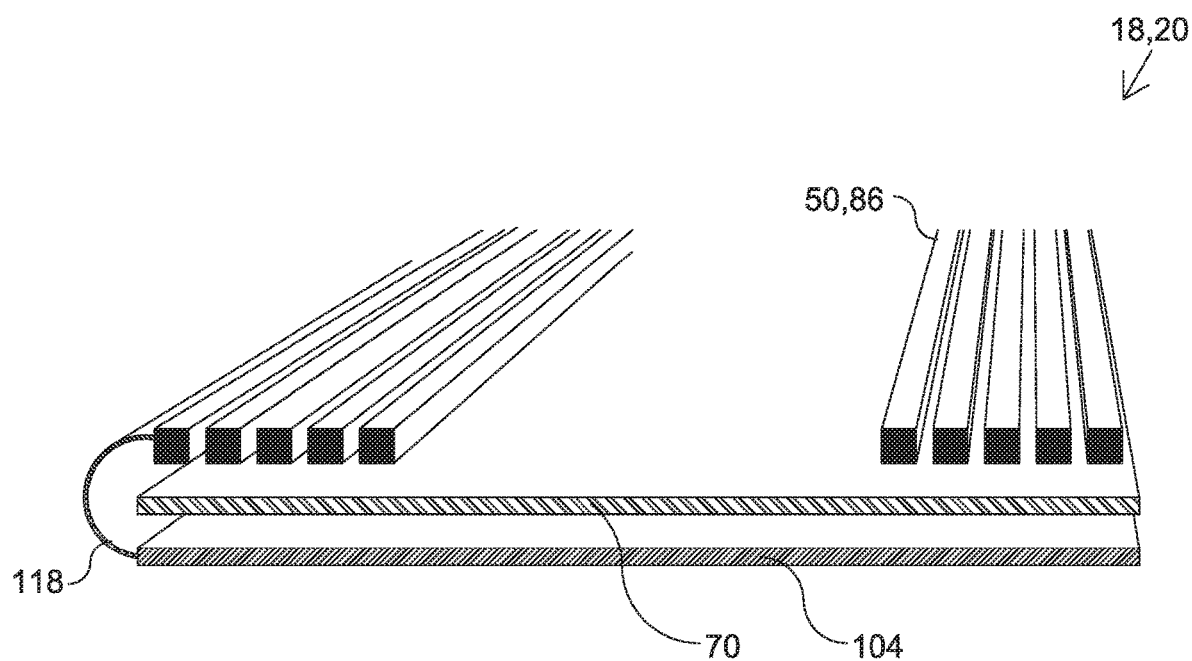
FIG. 22 is a cross-sectional view of an embodiment of a transmitting or receiving antenna that may be incorporated within the wireless transmission system of the present invention.

FIG. 22. Illustrates one or more embodiments of a transmitting or receiving antenna 18, 20 having a flexible connection 118 connecting the respective inductor coil 50, 86 with the conductive material 104. As shown, the magnetic field shielding material 70 is positioned therebetween. This embodiment thus allows for a flexible connection between the inductor coil 50, 86 and the conductive material 104 within the respective transmitting or receiving antenna 18, 20.

Figure 23:
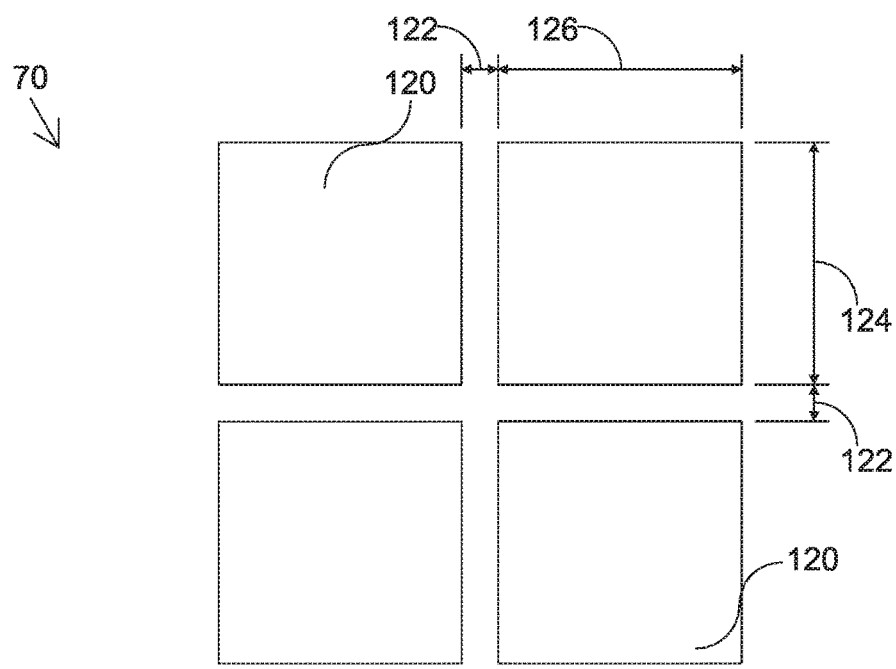
FIGS. 23 and 24 show embodiments of magnetic field shielding material that may be used with a transmitting or receiving antenna of the wireless transmission system of the present invention.
Figure 24:
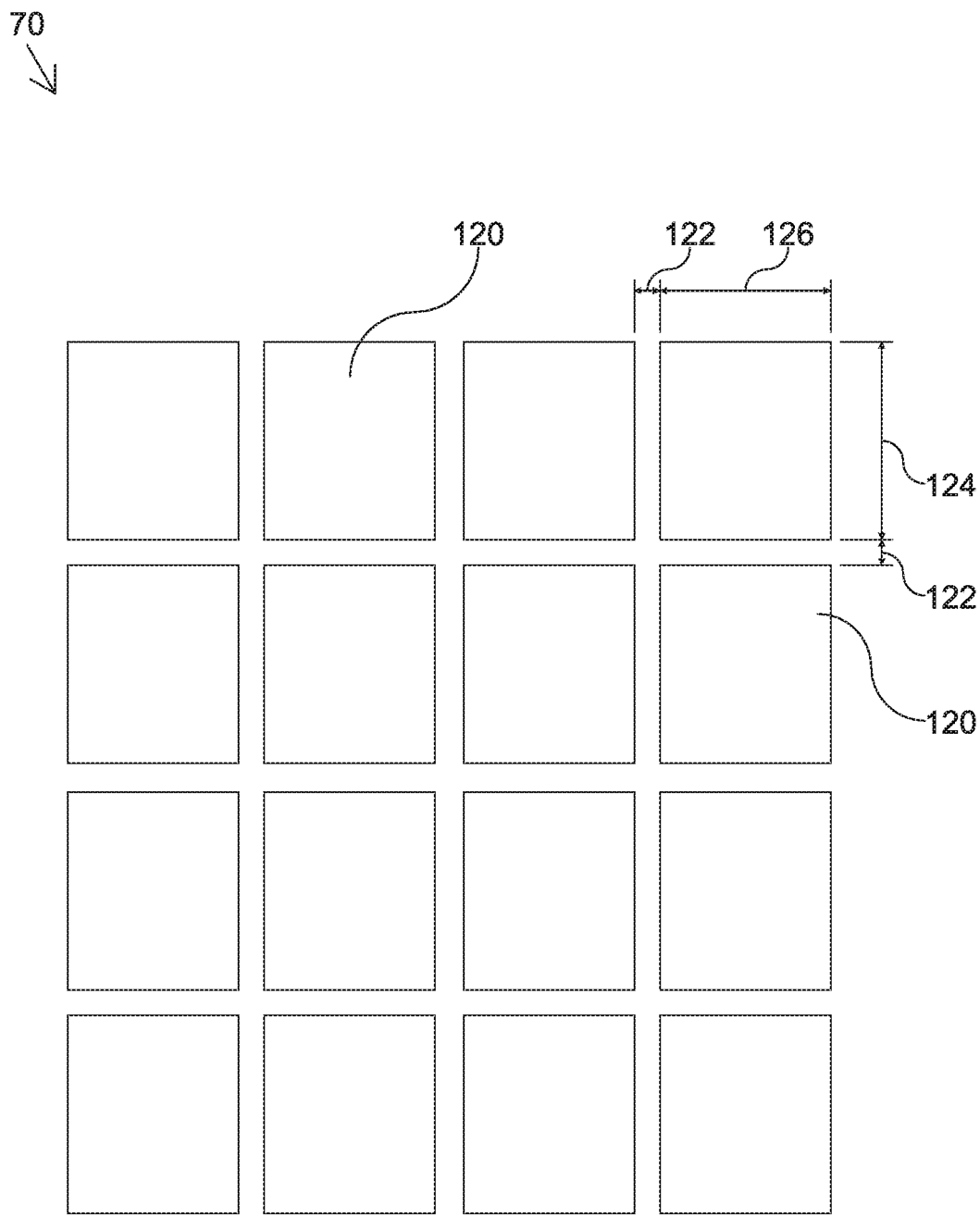

FIGS. 23 and 24 illustrate one or more embodiments in which the magnetic field shielding material 70 comprises a plurality of separate panes 120 of magnetic field shielding material. As shown, the plurality of magnetic field shielding panes 120 are positioned behind the inductor coil 50, 86 of the antenna such as the transmitting or receiving antenna 18, 20. In one or more embodiments, the plurality of magnetic field shielding panes 120 are positioned such that they are co-planar with respect to each other. In addition, in one or more embodiments, a magnetic field shielding gap 122 may be positioned between adjacent panes 120 of the shielding material 70. In an embodiment, the magnetic field shielding gap 122 may range from about 0.1 mm to about 10.0 mm. In one or more embodiments, constructing the transmitting or receiving antenna 18, 20 having a plurality of magnetic field shielding material panes 120 with the gap 122 therebetween increases the quality factor, self-resonant frequency (SRF) and decreases the effective series resistance (ESR) of the respective antenna 18, 20. In one or more embodiments, each pane 120 may have a pane length 124 that ranges from about 20 mm to about 40 mm, and a pane width 126 oriented about perpendicular to the pane length 124 that ranges from about 10 mm to about 25 mm.

Figure 25A:
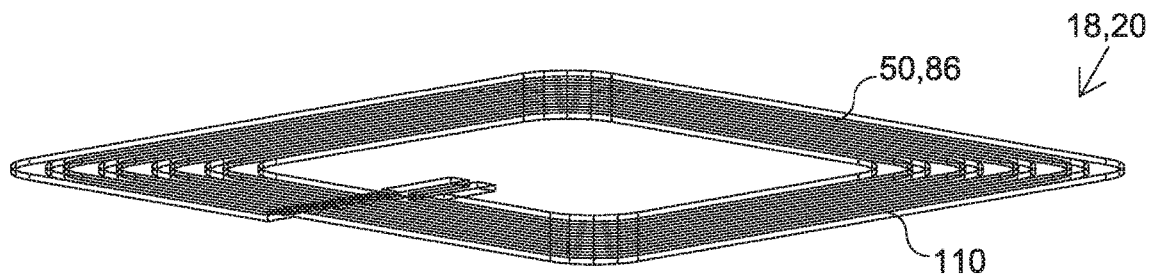
FIG. 25A illustrates an embodiment of a transmitting or receiving antenna that may be used with the wireless transmission system of the present invention.
Figure 25B:
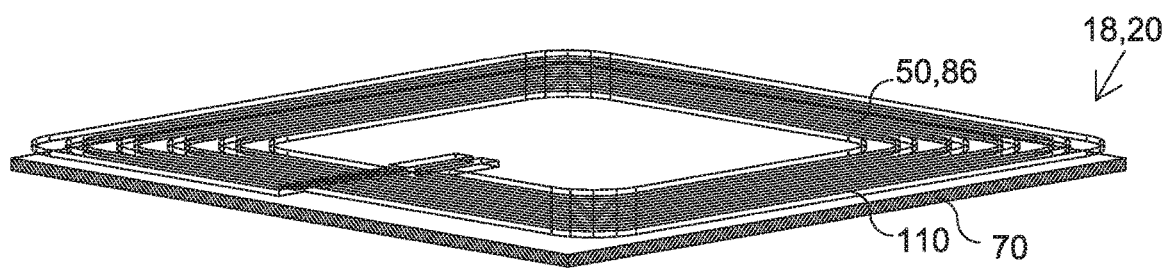
FIG. 25B illustrates an embodiment of a transmitting or receiving antenna comprising magnetic field shielding material that may be used with the wireless transmission system of the present invention.
Figure 25C:
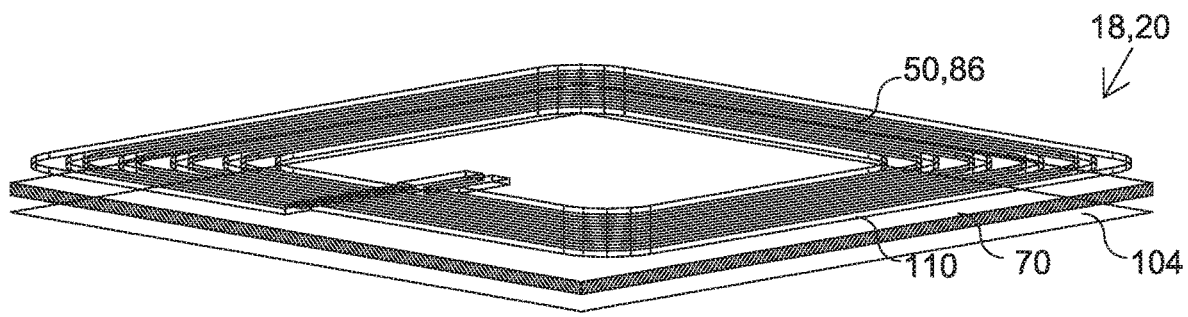
FIG. 25C illustrates an embodiment of a transmitting or receiving antenna comprising magnetic field shielding material and a layer of a conductive material that may be used with the wireless transmission system of the present invention.

FIGS. 25A-25C illustrate one or more embodiments of various configurations of a transmitting or receiving antenna 18, 20 configured with the magnetic field shielding material 70 and conductive material 104. As shown, in the example of FIG. 25A, the antenna 18, 20 comprises an inductor coil 50, 86 positioned on a substrate 110. Example of substrates may include but are not limited to an insulating material such as FR4, a polymeric material, or a ceramic material. FIG. 25B illustrates an embodiment in which the magnetic field shielding material 70, such as FFSX is positioned in contact with the substrate 110 of the respective transmitting or receiving antenna 18, 20. FIG. 25C illustrates an embodiment of the respective transmitting or receiving antenna 18, 20 comprising the magnetic field shielding material 70 and the conductive material 104. As shown, a layer of the conductive material 104 comprising copper is positioned in physical contact with the magnetic field shielding material 70 such that the shielding material is sandwiched between the inductor coil 50, 86 and the conductive material 104. The combination of the shielding material 70 and the conductive material 104 thus provides a magnetic field shielding structure that minimizes travel of undesirable magnetic fields, thereby improving the overall efficiency of the transmitting or receiving antenna 18, 20 and thus, the wireless electrical energy transmitting system 14 of the present application.

In one or more embodiments, various electrical performance parameters of the wireless electrical energy transmitting system 14 of the present application were measured. One electrical parameter is quality factor (Q) defined below.

The quality factor of a coil defined as:

$$Q = \frac{\omega \star L}{R}$$

Where:
Q is the quality factor of the coil
L is the inductance of the coil
ω is the operating frequency of the coil in radians/s. Alternatively, the operating frequency (Hz) may be ω divided by 2π
R is the equivalent series resistance at the operating frequency Another performance parameter is resistance of receiving antenna efficiency (RCE) which is coil to coil efficiency. RCE is defined as:

$$RCE = \frac{k^2 \ast Q_{Rx} \ast Q_{Tx}}{\left(1 + \sqrt{(1 + k^2 \ast Q_{rx} \ast Q_{tx})}\right)^2}$$

Where:
RCE is the coil to coil efficiency of the system
k is the coupling of the system
$Q_{rx}$ is the quality factor of the receiver
$Q_{tx}$ is the quality factor of the transmitter Another performance parameter is mutual induction (M). "M" is the mutual inductance between two opposing inductor coils of a transmitting and receiving antenna, respectively. Mutual induction (M) is defined as:

$$M = \frac{V_{induced}}{j \star \omega \star I_{Tx}}$$

Where:
$V_{induced}$ is induced voltage on the receiver coil
$I_{tx}$ is the AC current flowing through the transmitter coil
ω is the operating frequency multiplied by 2π

Mutual inductance can be calculated by the following relationship:

$$M = k \ast \sqrt{L_{Tx} \ast L_{Rx}}$$

Where:
M is the mutual inductance of the system
k is the coupling of the system
$L_{Tx}$ is the inductance of the transmitter coil
$L_{Rx}$ is the inductance of the receiver coil

TABLE I

| Conf. No. | Inductance (μH) | ESR (Ω) | Quality Factor | SRF (MHz) | Mutual Inductance (nH) | RCE (%) |
|---|---|---|---|---|---|---|
| 1 | 1.94 | 1.0 | 82 | 55.19 | 510 | 77 |
| 2 | 1.9 | 0.83 | 98.5 | 71.3 | 516 | 78 |
| 3 | 1.98 | 0.90 | 94.3 | 66.8 | — | — |

Table I above details various measured performance parameters of an NFMC system comprising a transmitting antenna 18 and a receiving antenna 20. The transmitting antenna 18 comprising an NC-2B Airfuel certified resonant transmitting inductor coil was used in the performance testing as detailed in configurations 1-3 of Table I. The transmitting antenna 18 was configured having an inductor coil with a length of 170 mm and a width of 100 mm and 6 turns. The receiving antenna 20 comprised a receiving inductor coil 86 having 5 number of turns. The receiving inductor coil 86 was configured having a length of 55 mm and a width of 48 mm. Test configuration 1 comprised the receiving antenna 20 with the receiving inductor coil 86 positioned on a single sheet of FFSX ferrite material having a length of 55 mm and a width of 43 mm and a thickness of 0.3 mm. The receiving antenna 20 in test configuration 1 further comprised an aluminum sheet having a thickness of 0.5 mm positioned behind the ferrite shielding material. Test configuration 2 comprised the receiving antenna 20 with the receiving inductor coil 86 of configuration 1 positioned on a plurality of 4 spaced apart ferrite material panes 120. Each pane was constructed having a length of 26.5 mm, a width of 22.5 mm, and a thickness of 0.3 mm. The receiving antenna 20 was constructed such that a magnetic field shielding gap 122 of about 3.0 mm extended between each pane 120. The receiving antenna 20 in test configuration 2 further comprised an aluminum sheet having a thickness of 0.1 mm positioned behind the panes 120 of ferrite shielding material. Test configuration 3 comprised the receiving antenna 20 with the receiving inductor coil 86 of configuration 1 positioned on a plurality of 4 spaced apart ferrite material panes 120. Each pane 120 was constructed having a length of 26.5 mm, a width of 22.5 mm, and a thickness of 0.3 mm. The receiving antenna 20 was constructed having a magnetic field shielding gap 122 of about 2.0 mm extending between each pane 120 of magnetic field shielding material 70. The receiving antenna 20 in test configuration 3 further comprised an aluminum sheet having a thickness of 0.1 mm positioned behind the panes 120 of ferrite shielding material. As detailed in Table I shown above, constructing the receiving antenna 20 having a plurality of separate panes 120 of magnetic field shielding material 70 increased the quality factor, self-resonant frequency, and resonator coupling efficiency (RCE). In one or more embodiments, constructing the receiving antenna 20 having a plurality of separate panes 120 of magnetic field shielding material 70 decreases eddy current circulation within the antenna which improves electrical performance. Eddy currents are generally known in the art to cause undesirable heat and degrade the inductive properties of a coil antenna which lead to a decreased wireless power transfer efficiency. It is noted that the symbol "-" indicates that a measurement was not taken.

TABLE II

| Configuration No. | Receiving Antenna Attenuation of Mutual Inductance (dB) | Transmitting Antenna Attenuation of Mutual Inductance (dB) |
|---|---|---|
| 1 | 0.8 | 11.05 |
| 2 | 2.24 | 11.05 |
| 3 | 2.7 | 11.88 |
| 4 | 5.62 | 13.82 |

Figure 26:
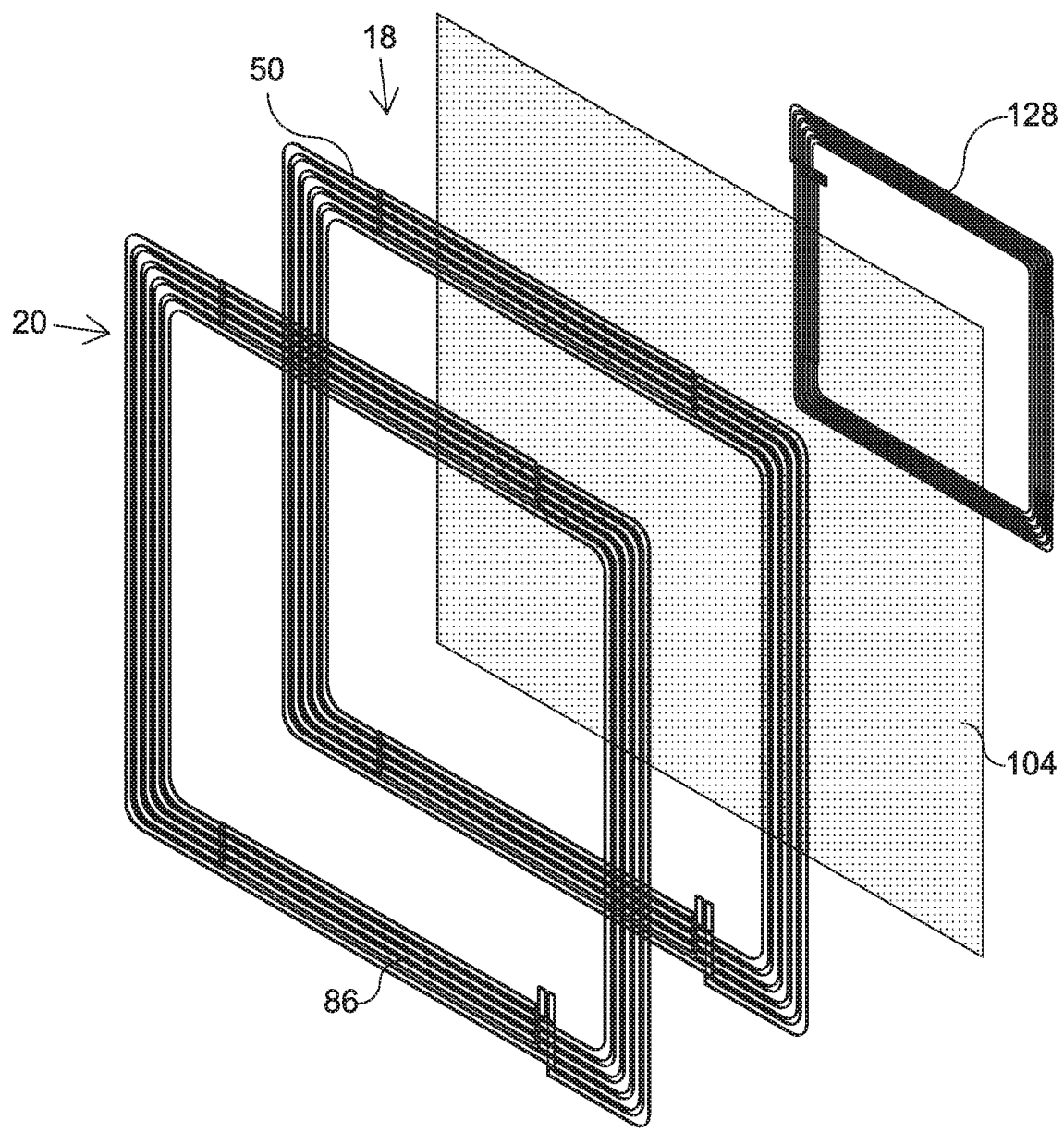
FIG. 26 shows an embodiment of a wireless electrical energy transmission test configuration comprising a receiving antenna and a transmitting antenna.

Table II above details various measured performance parameters of an NFMC system operating at 13.56 MHz comprising a transmitting antenna 18 and a receiving antenna 20. The transmitting antenna 18 was configured having an inductor coil with a length of 5 cm and a width of 5 cm and 4 turns. The receiving antenna 20 comprised a receiving inductor coil 86 having 4 number of turns. The receiving inductor coil 86 was configured having a length of 5 cm and a width of 5 cm. The receiving antenna 20 was positioned about 4 cm from the transmitting antenna 18. A conductive metal sheet composed of aluminum was positioned between the transmitting inductor coil 50 and a transmitting pick up loop 128 (FIG. 26). The pick up loop 128 comprised 2 number of turns having a length of 40 mm and a width of 40 mm. The metal sheet which comprised a length of 5.2 cm a width of 5.2 cm and a thickness of 0.1 mm. An embodiment of the test configuration for the results shown in Table II is provided in FIG. 26.

Test configuration 1 comprised the conductive metal sheet being positioned at about 2 cm from the transmitting inductor coil 50. Test configuration 2 comprised the conductive metal sheet positioned about 1 cm from the transmitting inductor coil 50. Test configuration 3 comprised the conductive metal sheet positioned about 0.75 mm from the transmitting inductor coil. Test configuration 4 comprised the conductive metal sheet positioned about 0.5 cm from the transmitting inductor coil 50. As detailed in Table II, test configuration 1 in which the conductive metal sheet was placed about 2 cm from the transmitting inductor coil exhibited the lowest attenuation at the receiving antenna at about 0.8 dB. Test configuration 4 in which the conductive metal sheet was placed about 0.5 cm from the transmitting coil exhibited the greatest attenuation of 13.82 dB at the pick up loop. The results detailed in Table II illustrate that the conductive metal sheet is an effective shield of magnetic fields, however incorporating the metal shield in this example reduced the Mutual inductance between the transmitting and receiving antennas 18, 20. Furthermore, the results detailed in Table II illustrate how coupling efficiency is optimized by the positioning of the magnetic field shielding material 70, particularly in the embodiments shown in FIGS. 5A and 12A. In one or more embodiments, one should take into consideration the location of electrically conductive material and objects in the vicinity of the transmitting or receiving antenna 18, 20 and the intended direction of the magnetic field when positioning the magnetic field shielding material 70 with respect to the transmitting or receiving inductor coil 50, 86. For example, in the embodiment shown in FIG. 5A, since the intended direction of the emanating magnetic fields from the transmitting inductor coil 50 is in the proximal direction, i.e., through a supporting surface, and the transmitting antenna 18 within the transmitting base 16 is constructed with the magnetic field shielding material 70 distal the transmitting coil 50 to shield the transmitting antenna 18 from various conductive materials such as circuit boards and electrochemical cells positioned within the transmitting base 16 and distal the transmitting antenna 18. In one or more embodiments, the various conductive materials such as circuit boards and electrochemical cells may be positioned distal and in contact with the transmitting antenna 18, thus the magnetic field shielding material 70 is positioned therebetween. In addition, in the embodiment shown in 12A, the magnetic field shielding material 70 is positioned on the proximal side of the transmitting coil 50 since the intended direction of the magnetic field is in a distal direction through the transmitting base 16. In the example shown in FIG. 12A, while magnetic field shielding material 70 is not positioned between the transmitting inductor coil 50 and an electrically conductive object, the boost of the repeater 32 is large enough that coupling between the transmitting antenna 18 and the repeater 32 is increased.

TABLE III

| Config. No. | M (µH) 3 mm | K 3 mm | M (µH) 5 mm | K 5 mm | M (µH) 7 mm | K 7 mm |
|---|---|---|---|---|---|---|
| 1 | 0.109 | 0.22 | 0.0717 | 0.1445 | 0.049 | 0.098 |
| 2 | 0.124 | 0.23 | 0.0790 | 0.1488 | 0.0536 | 0.101 |
| 3 | 0.113 | 0.217 | 0.0736 | 0.1410 | 0.0524 | 0.100 |

Table III above details measured Mutual inductance (M) and antenna coupling coefficient (k) performance parameters of an NFMC system comprising a transmitting antenna 18 and a receiving antenna 20 at three separation distances, 3 mm, 5 mm and 7 mm. The transmitting antenna 18 comprising a transmitting inductor coil 50 supported on a substrate composed of FR4 was used in the performance testing as detailed in configurations 1-3 shown in Table III. The transmitting antenna 18 was configured having an inductor coil with a length of 60 mm and a width of 9.5 mm and 5 turns. The receiving antenna 20 comprised a receiving inductor coil 86 having 2 number of turns supported on a substrate comprising FR4. The receiving inductor coil 86 was configured having a length of 60 mm and a width of 6 mm.

Test configuration 1 comprised the receiving antenna configured with the receiving coil supported on the substrate comprising FR4. Test configuration 2 comprised the receiving antenna constructed with the receiving coil positioned directly in contact with FFSX3 ferrite material configured having the same dimensions as the receiving inductor coil 86. The ferrite material had a thickness of about 0.3 mm. Test configuration 3 comprised test configuration 2 with the addition of a sheet of copper metal positioned in contact with the ferrite material. In test configuration 3, the ferrite material was sandwiched between the receiving inductor coil and the copper metal sheet. The copper metal sheet had a thickness of about 0.1 mm.

As detailed in Table III, the addition of the ferrite material with the receiving antenna 20 improved Mutual induction in comparison to test configuration 1 comprising only the receiving inductor coil 86. In addition, as shown by the experimental results, detailed in Table III, the addition of the copper sheet generally degrades Mutual inductance.

TABLE IV

| Configuration No. | Inductance (μH) | Electrical Resistance (Ω) | Quality Factor |
|---|---|---|---|
| 1—Transmitting Antenna | 1.292 | 1.01 | 80.37 |
| 2—Transmitting Antenna | 1.524 | 1.18 | 81.15 |
| 3—Transmitting Antenna | 1.4127 | 1.33 | 66.74 |
| 4—Receiving Antenna | 0.189 | 0.121 | 94.99 |
| 5—Receiving Antenna | 0.207 | 0.178 | 99.03 |
| 6—Receiving Antenna | 0.199 | 0.19 | 89.19 |

Table IV above details the electrical performance factors of inductance, electrical resistance, and quality factor of embodiments of transmitting and receiving antennas at a measured frequency of 10 MHz in various configurations. The transmitting antenna 18 comprised a transmitting inductor coil 50 configured having a length of 5 cm, a width of 5 cm and 4 turns. The receiving antenna 20 comprised a receiving inductor coil 86 having a length of 5 cm, a width of 5 cm, and 4 number of turns.

Test configuration 1 comprised only the transmitting coil. Test configuration 2 comprised the transmitting coil in contact with the FFSX3 ferrite material. The ferrite material having a thickness of about 0.3 mm. Test configuration 3 comprised test configuration 2 with the addition of an aluminum metal sheet that was positioned in contact with the ferrite material. Test configuration 3 comprised the ferrite material positioned between the transmitting inductor coil 50 and the aluminum metal sheet. The aluminum metal sheet had a thickness of about 0.1 mm.

Test configuration 4 comprised only the receiving inductor coil 81246. Test configuration 5 comprised the receiving inductor coil 86 in contact with FFSX3 ferrite material. The ferrite material had a thickness of about 0.3 mm. Test configuration 6 comprised test configuration 5 with the addition of an aluminum metal sheet that was positioned in contact with the ferrite material. Test configuration 6 comprised the ferrite material positioned between the receiving coil and the aluminum metal sheet. The aluminum metal sheet had a thickness of about 0.1 mm.

As detailed in Table IV above, the inductance and electrical resistance of both the transmitting and receiving antennas 18, 20 increased with the addition of the ferrite material. It was also observed that the inductance increased at a greater rate than the electrical resistance at the measured frequency of 10 MHz. This resulted in an increase in the quality factor when the ferrite material was added to the antenna structure. It was also observed that the addition of the copper metal sheet degraded the quality factor.

TABLE V

| Receiver Config. No. | $V_{loop}$ (V) at 3 mm | $V_{loop}$ (V) at 5 mm | $V_{loop}$ (V) at 7 mm |
|---|---|---|---|
| 1 | 0.482 | 0.555 | 0.525 |
| 2 | 0.39 | 0.411 | — |
| 3 | 0.212 | 0.22 | — |

Table V above details the induced voltage in which a one-turn loop antenna comprising a length of 1.6 cm and a width of 0.9 cm positioned about 1.5 mm from the receiving inductor coil 86 was used to detect the efficiency of the shielding of the receiving antenna 20. An NFMC system comprising a transmitting antenna 18 and a receiving antenna 20 at three separation distances, 3 mm, 5 mm and 7 mm were utilized for the experiment.

The transmitting antenna 18 used in the performance testing as detailed in configurations 1-3 shown in Table V comprised a resonant transmitting inductor coil 50 supported on a substrate comprising FR4. The transmitting inductor coil 50 had a length of 5 cm and a width of 5 cm and 4 turns. The receiving antenna 20 comprised a receiving inductor coil 86 supported on a substrate comprising FR4. The receiving inductor coil was configured having a length of 5 cm, a width of 5 cm, and 4 turns.

Test configuration 1 comprised only the receiving antenna 20 comprising the receiving inductor coil 86 supported on the FR4 substrate. Test configuration 2 comprised the FR4 substrate in contact with FFSX3 ferrite material. The ferrite material having a thickness of about 0.3 mm. Test configuration 3 comprised test configuration 2 with the addition of a copper metal sheet that was positioned in contact with the ferrite material. Test configuration 3 comprised the ferrite material positioned between the receiving inductor coil 86 and the copper metal sheet. The copper metal sheet had a thickness of about 0.5 mm.

The results in Table V indicate that for about the same amount of current in a DC load, the induced voltage in the loop dropped about 19% by adding the ferrite to the receiving coil, and dropped about 56% when the copper metal sheet and ferrite were added to the receiving coil. It is noted that the symbol "-" indicates that a measurement was not taken.

TABLE VI

| Config. No. | Inductance (μH) | Resistance (Ω) | Quality Factor |
|---|---|---|---|
| 1 | 0.205 | 0.196 | 89.07 |
| 2 | 0.198 | 0.201 | 83.89 |

Table VI above details the inductance, electrical resistance and quality factor measurements of embodiments of a receiving antenna 20 that was electrically connected to a cellular phone. The transmitting antenna 18 comprised a transmitting inductor coil 50 configured having a length of 60 mm, a width of 9.5 mm and 5 turns. The receiving antenna 20 comprised a receiving inductor coil 86 having a length of 60 mm cm, a width of 6 mm, and 2 number of turns.

Test configuration 1 comprised the receiving coil in contact with FFSX ferrite material. The ferrite material having a thickness of about 0.3 mm. Test configuration 2 comprised test configuration 2 with the addition of an aluminum metal sheet that was positioned in contact with the ferrite material. Test configuration 2 comprised the ferrite material positioned between the receiving coil and the copper metal sheet. The aluminum metal sheet had a thickness of about 0.1 mm.

It was observed that adding the cellular phone to the receiving inductor coil 86 and ferrite configuration degraded the quality factor by about 10 percent. In addition, adding the cellular phone to the receiving coil 86, ferrite and copper metal sheet configuration degraded the quality factor by about 6 percent.

It is noted that in one or more embodiments, a high inductance inductor coil may be required to achieve sufficient wireless transmission of electrical energy. For example, in instances where the distance between the transmitting antenna 18 and the receiving antenna 20 is relatively large, i.e., greater than about half the length of the transmitting antenna, or the respective transmitting and receiving antennas 18, 20 are not oriented directly facing each. Furthermore, when the respective transmitting and receiving antennas 18, 20 are oriented such that they are tilted, shifted, or rotated with respect to each other a high inductance inductor coil may be required to achieve sufficient wireless transmission of electrical energy. It is noted that coupling is generally at a maximum when the respective transmitting and receiving antennas 18, 20 are directly facing each other.

In one or more embodiments, as a first-order approximation, the voltage induced in the receiving inductor coil 50 due to current flowing in a transmitting antenna 20 is about proportional to the number of turns of the transmitting inductor coil 50 of the transmitting antenna ($N_{TX}$), the amount of current flowing through the transmitting antenna ($I_{TX}$), and the number of turns of the receiving inductor coil ($N_{RX}$). Thus, the induced voltage can be calculated using the following equation: $V_{induced} = f(N_{TX} \times N_{RX} \times I_{TX})$. Furthermore, in this embodiment, it is assumed that $N_{RX}$ is fixed and is not a design variable. In addition, in this example, it is assumed that $I_{tx}$ is maximized and the $N_{TX} \times I_{TX}$ product is not capable of inducing a sufficient voltage on the receiving inductor coil. Therefore, in one or more embodiments, to increase induced voltage in the receiving antenna 20, the number of turns of the transmitting inductor coil 50 of the transmitting antenna ($N_{TX}$) should be increased.

It is generally noted that as the number of turns of the transmitting or receiving antenna 18, 20 is increased, the self-resonant frequency (SRF) of the respective antenna structure typically becomes too small for the amount of current in the coil to be assumed as quasi-static. In other words, the phase difference of the current becomes too large. In addition, other spurious effects may include the respective transmitting or receiving antenna 18, 20 becoming increasingly sensitive and lossy in the presence of extraneous objects, such as a metallic object. In addition, a high inductance may result due to the large number of turns of the inductor coil. This, therefore requires the addition of a capacitance for tuning the inductance of the respective transmitting or receiving antenna 18, 20, particularly at the operating frequency. It is further noted that the required capacitance value required to tune the inductance may be of the order of the parasitic capacitance of the respective inductor coil.

Therefore, in one or more embodiments, capacitive components may be introduced within the transmitting and/or receiving antenna 18, 20 in order to achieve the required number of inductor coil turns while reducing sensitivity of the antenna to electrical loads and the presence of metallic objects. Thus, relatively small inductor coils 50, 86 may be connected in series with capacitors 96. In one or more embodiments, the inductor coils 50, 86 may be connected in series with capacitors 96 that are electrically connected within a circuit such as a printed circuit board (PCB) or flexible circuit board (FCB).

Figure 27:
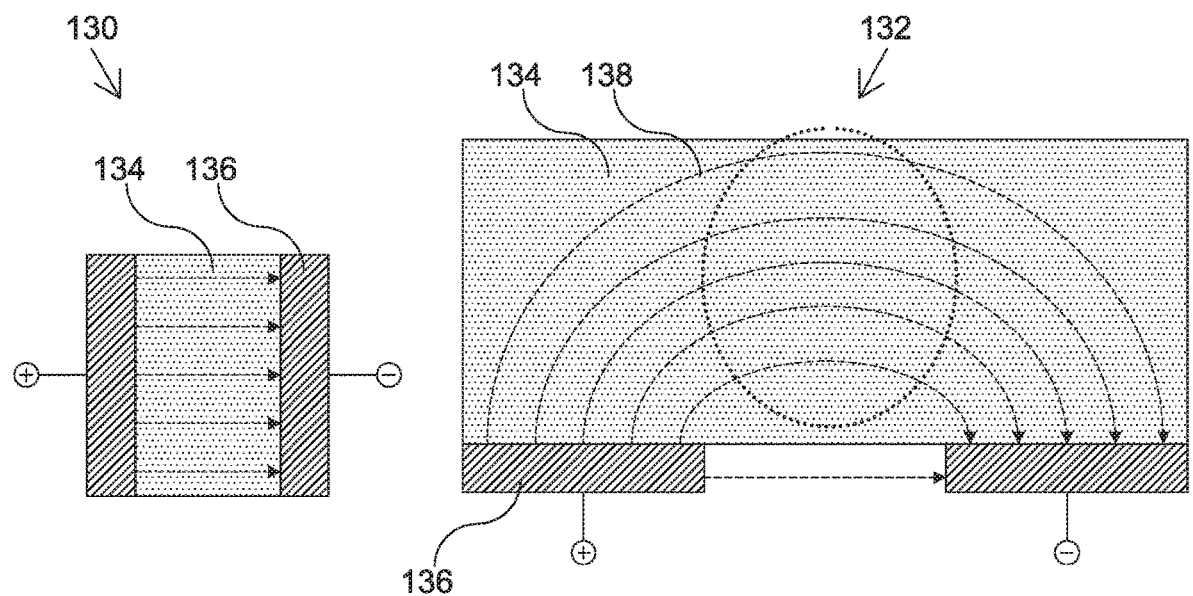
FIG. 27 illustrates an embodiment of a parallel plate capacitor and an interdigitated capacitor that may be incorporated within either or both a transmitting or receiving antenna.

In one or more embodiments surface mount capacitors may be soldered on a PCB or FCB. Alternatively, to surface mount capacitors, a parallel plate capacitor 130 and/or an unt capacitor 132 may be fabricated on or within the PCB or FPC to impart a desired capacitance to the transmitting or receiving antenna 18, 20. FIG. 27 illustrates examples of a parallel plate capacitor 130 and an interdigitated capacitor 132. The benefit of utilizing a parallel plate capacitor 130 or an interdigitated capacitor 132 configuration is that they provide a robust thinner design that is generally of a lower cost.

In one or more embodiments, the parallel plate capacitor 130, as shown in FIG. 27, comprises a dielectric material 134 positioned between two opposing electrically conducting plates 136 positioned in parallel to each other.

Figure 28A:
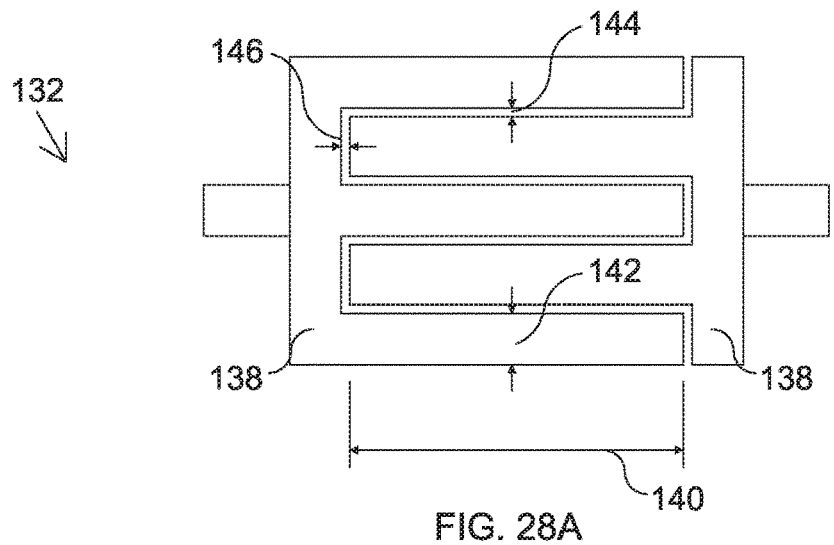
FIGS. 28A-28C illustrate embodiments of configurations of interdigitated capacitors that may be incorporated within either or both a transmitting or receiving antenna.
Figure 28B:
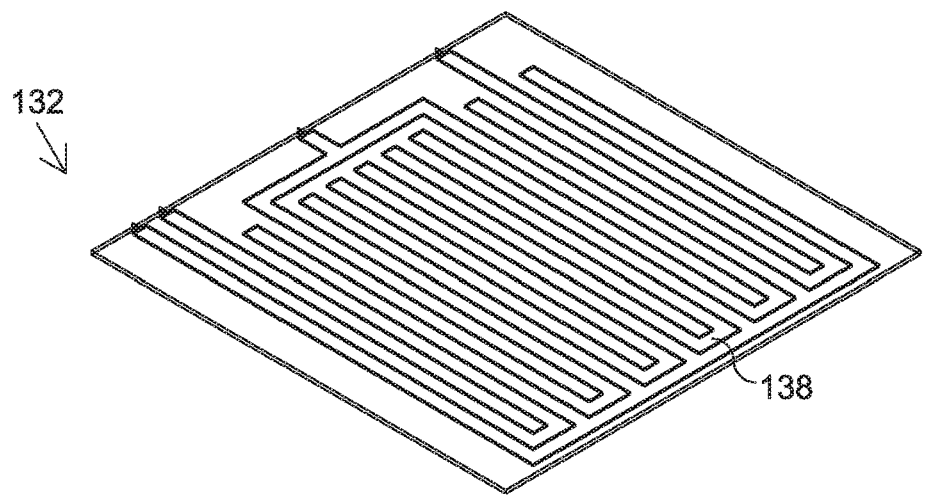
Figure 28C:
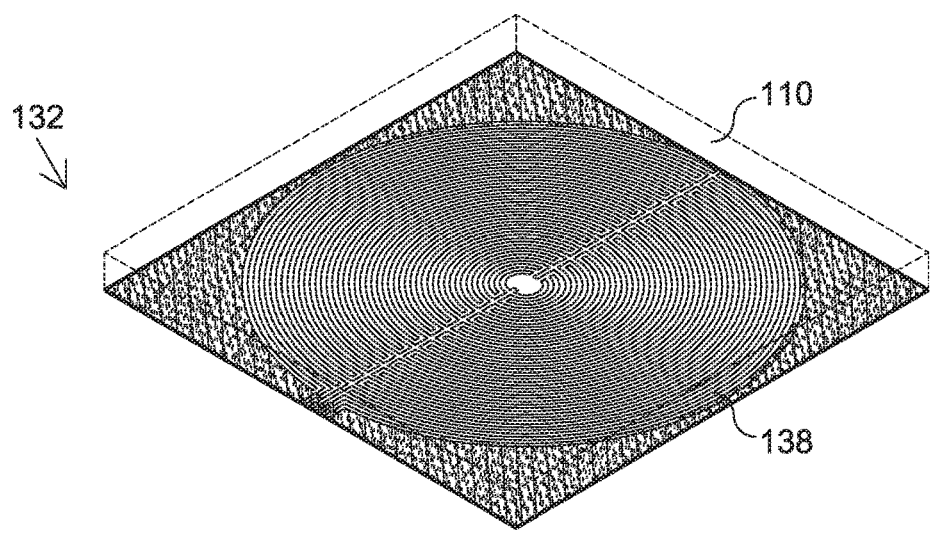

Non-limiting examples of an interdigitated capacitor 132 are shown in FIGS. 27 and 28A-28C. In one or more embodiments, as illustrated in FIGS. 27 and 28A-28C interdigitated capacitors 132 typically have a finger-like shape. In one or more embodiments, the interdigitated capacitor 132 comprises a plurality of micro-strip lines 138 that produce high pass characteristics. The value of the capacitance produced by the interdigitated capacitor 132 generally depends on various construction parameters. These include, a length 140 of the micro-strip line 138, a width 142 of the micro-strip line 138, a horizontal gap 144 between two adjacent micro-strip lines 138, and a vertical gap 146 between two adjacent micro-strip lines 138 (FIG. 28A). In one or more embodiments, the length 140 and width 142 of the micro-strip line 138 can be from about 10 mm to about 600 mm, the horizontal gap 144 can be between about 0.1 mm to about 100 mm, and the vertical gap 146 can be between about 0.0001 mm to about 2 mm.

In one or more embodiments, the inter-digitated capacitor 132 can be integrated within a substrate 110 such as a PCB shown in FIG. 29. In the cross-sectional view of the embodiment shown FIG. 29, an insulative material 148 of the PCB, such as FR4 is positioned between a first interdigitated capacitor 150 and a second interdigitated capacitor 152. In addition, magnetic field shielding material 70, such as a ferrite material may also be incorporated within the structure. As shown in the embodiment of FIG. 29 the ferrite layer comprises the bottom layer of the respective structure. Thus, the interdigitated capacitor 132 provides a means to add capacitance to the transmitting or the receiving antenna 18, 20 in a small compact design. In one or more embodiments, the transmitting or receiving inductor coil 50, 86 may be positioned on the surface of the interdigitated capacitor 132. Alternatively, the transmitting or receiving inductor coil 50, 86 may be positioned surrounding the interdigitated capacitor 132. In one or more embodiments, the interdigitated capacitor 132 may be positioned within an opening or cavity within the substrate 110 supporting the transmitting or receiving inductor coil 50, 86. In one or more embodiments, the interdigitated capacitor 132 provides a cost-effective means to add capacitance to an inductor coil 50, 86. In addition, the interdigitated capacitor 132 is mechanically durable and may be used to connect a tuned inductor coil 50, 86 directly to a circuit board. In one or more embodiments, interdigitated capacitors 132 can also be useful in applications where relatively thin form factors are preferred. For example, in the embodiment shown in FIG. 12A, the repeater inductor coil 98 is positioned along an outer edge of the transmitting base 16. In this embodiment, an interdigitated capacitors 132 may be used to tune the repeater inductor coil 98 in lieu of a surface mount capacitor because of the mechanical robustness, relatively thin design, and reduced cost of the interdigitated capacitor 132. For similar reasons, an interdigitated capacitor 132 can be used to tune a transmitting or receiving inductor coil 50, 86.

Prior art magnetically coupled transmitting antennas cannot wirelessly transmit electrical energy over long distance, typically on the order of about 0 mm to about 60 mm. Generally, for increased wireless transmission distances, the inductance of the antenna is increased to achieve target coupling required to induce a desired voltage within the receiving inductor coil 86 of the receiving antenna 20. Increasing the inductance of the transmitting inductor coil 50 however, typically leads to a decrease in the self-resonance frequency (SRF) of the transmitting antenna 18. Thus, if the inductance is too high, the SRF of the transmitting antenna 18 may be reduced, for example, less than approximately four times the operating frequency, which may lead to increased sensitivity of the transmitting inductor coil 50 to variations in electrical load and the presence of metallic objects. In addition, if the inductance of the transmitting antenna 18 is too high, the equivalent series resistance (ESR) of the transmitting antenna 18 at the operating frequency, may result in reduced efficiency of the transfer of wireless electrical energy. In one or more embodiments, interdigitated capacitors 132 are not only useful for tuning the transmitting inductor coil 50 and/or the receiving inductor coil 86 but can also be used to minimize sensitivity of the respective coil 50, 86 between coil traces. In this embodiment, shifts in current phase are created by the interdigitated capacitor 132 itself without the need for additional electronic components. In one or more embodiments, interdigitated capacitors 132 can be used in lieu of surface mount capacitors to tune transmitting and receiving inductor coils 50, 86 as well as for minimizing sensitivity of respective transmitting and receiving inductor coils 50, 86 to metallic surfaces that may be positioned in the vicinity of the coil.

In one or more embodiments, the inventive concepts of the present application outlined herein enable the design of the transmitting antenna 18 that is capable of transmitting wireless electrical energy and data over increased distances at relatively low amounts of transmitting antenna current (ITx) while maintaining a relatively low inductance. Thus, the wireless electrical energy transmitting system 14 of the present application is more efficient and less sensitive to variations in electrical loads and the presence of metallic objects. The wireless electrical energy transmitting system 14 of the present application, therefore, comprises a transmitting antenna 18 having increased self-resonant frequencies, an increased quality factor and an increased receiving coupling efficiency (RCE).

In one or more embodiments, capacitance such as lumped capacitive elements 154 (FIG. 30C) may be electrically connected to the transmitting inductor coil 50, receiving inductor coil 86, or repeater inductor coil 98 to reduce reflected impedance of the respective antenna. In one or more embodiments, lumped capacitive elements 154 may be electrically connected between traces of the transmitting, receiving, or repeater inductor coils 50, 86, 98. Or alternatively, in one or more embodiments, lumped capacitive elements 154 may also be electrically connected between inductor coils 50, 86, 98 of the respective antenna, both embodiments reduce the overall electrical impedance of the antenna 18, 20, or the repeater 32. Thus, as a result, the inductor coil 50, 86, 98 becomes less sensitive to changes in electrical load and the presence of metallic objects.

It is noted that antennas with low inductance and low coupling generally require higher current from an amplifier (not shown) to feed the required electrical power. High inductance/coupling designs, requiring less current are characterized by a relatively large impedance shift, high ESR, and low SRF.

An example of such a high inductance/coupling transmitting antenna 18 is a "High Range" AIR-Fuel transmitter. In one or more embodiments, a "High Range" AIR-Fuel transmitter is a transmitting antenna 18 configured to wirelessly transmit electrical energy in a "z-axis" direction over a transmission distance of between about 25 mm to about 40 mm. Such "High Range" AIR-Fuel transmitters require inductances, on the order of between about 8 µH to about 12 µH, to achieve target coupling over the "z-axis" transmission distance.

In one or more embodiments, the transmitting or receiving inductor coil 50, 86 is configured having an increased number of turns that increase the inductance of the respective inductor coil. As inductance of the transmitting or receiving coil 50, 86 increases, the inductor coil's self-resonant frequency approaches the operating frequency. Furthermore, the electrical impedance of the inductor coil may change in the presence of metallic surfaces and non-conductive bodies having a relative permittivity greater than 1. Thus, the presence of metallic surfaces and/or non-conductive bodies having a relative permittivity greater than 1 may lead to detuning of the respective inductor coil 50, 86 and/or a decrease in the efficiency of the transmission of wireless electrical energy. In addition, this condition may result in an increased temperature of either or both the transmitting and receiving antennas 18, 20, which may potentially damage the power amplifier or other antenna circuitry.

In one or more embodiments, capacitors 96, such as lumped capacitive elements 154, a parallel plate capacitor 130, an interdigitated capacitor 132, a surface mount capacitor (not shown), or a combination thereof may be used to minimize de-tuning and potentially over heating of the transmitting antenna 18, receiving antenna 20, or repeater 32. In one or more embodiments, capacitors 96, such as lumped capacitive elements 154, a parallel plate capacitor 130, an interdigitated capacitor 132, a surface mount capacitor (not shown), or a combination thereof are electrically connected at appropriate locations on the respective transmitting inductor coil 50, receiving inductor coil 86 or repeater inductor coil 98 to decrease electrical impedance of the respective inductor coil. As a result, the inductance of the respective coil is increased which increases coupling between either of the transmitting antenna 18, the receiving antenna 20, the repeater 32, and combinations thereof, particularly over relatively large transmission distances on the order of about 30 mm. In addition, the distributed capacitors help to reduce phase difference across the length of the respective inductor coil 50, 86, 98. Reduction of phase differences results in a more even electrical current distribution which reduces impedance shift and decreases the impedance of the respective transmitting antenna 18, receiving antenna 20 or repeater 32. It is noted that the transmitting inductor coil 50 most efficiently transfers electrical power when it is perfectly tuned. Impedance shifts are generally due to the presence of metallic objects that couple with the transmitting inductor coil 50. The presence of a metallic object may change the imaginary impedance of the transmitting inductor coil 50, which generally results in the de-tuning of the wireless electrical energy transmitting system 14.

As illustrated in FIG. 30C, a lumped capacitive element 154 is added to a transmitting or receiving antenna 18, 20 which is represented by the electrically connected inductors 156 and resistors 158. In one or more embodiments, the electrical circuit illustrated in FIG. 30A represents a transmitting or receiving antenna 18, 20 configured without a capacitor. As shown in the circuit of FIG. 30A, the transmitting or receiving antenna 18, 20 is represented by the inductor 156. The configuration shown in FIG. 30A is identified as $D_\infty pF$. FIG. 30B illustrates an electrical circuit embodiment of a transmitting or receiving antenna 18, 20 comprising electrically connected inductors 156 and resistors 158.

TABLE VII

| Antenna | Capacitance (pF) | Inductance (µH) | ESR (Ω) | SRF (MHZ) |
|---|---|---|---|---|
| $D_\infty pF$ | n/a | 20.02 | 6.00 | 20.71 |
| D680pF | 680 | 17.92 | 5.04 | 21.57 |
| D200pF | 200 | 13.54 | 4.01 | 21.60 |
| D96pF | 96 | 7.44 | 3.40 | 21.70 |
| D68pf | 68 | 3.14 | 3.70 | 22.60 |

Table VII shown above details the measured inductance, equivalent series resistance (ESR) and self-resonant frequency (SRF) of various receiving antennas 20 configured with capacitors 96 having various capacitances. In the experiment, a receiving antenna 20 comprising a receiving inductor coil 86 having a length of 100 mm and a width of 100 mm with 12 turns was used. In the configurations listed in Table VII, shown above, two capacitors, each having the capacitance as detailed in the second column of Table VII were electrically connected to the receiving antenna 20. For example, the receiving antenna identified as D200 pF was configured with two capacitors, each having a capacitance of 200 pF that were electrically connected to the receiving inductor coil 86. It is noted that the receiving antenna identified as $D_\infty pF$ was not configured with a capacitor and therefore only comprised the receiving inductor coil 86.

As shown in Table VII, adding capacitors 96 to the receiving coil 86 reduced impedance shifts, increased resonator coupling efficiency and lowered the sensitivity of the receiving inductor coil 86 by decreasing the electrical impedance of the receiving antenna 20. As detailed in Table VII above, receiving antenna $D_\infty pF$ that was not configured with a capacitor, exhibited the greatest inductance, ESR, and lowest SRF. In contrast, receiving antenna D68 pf, which comprised two 68 pF capacitors, exhibited the lowest inductance, a reduced ESR and increased SRF. This electrical performance can be explained because as capacitance decreases, imaginary impedance increases. As a result, the overall impedance of the receiving inductor coil 86 decreases, and the inductor coil becomes closer to in phase, thus SRF and ESR are reduced.

In one or more embodiments, the inductance of the transmitting inductor coil 50, the receiving inductor coil 86 and the repeater inductor coil 98, may be reduced by electrically connecting lumped capacitors 154 along the length of the respective inductor coil 50, 86, 98. If, for example, the inductance is reduced to 4 µH from 16 µH the impedance variation comes out to be between [−21 j to 13 j], a variation of ~34 j, which is equivalent to an inductance of 0.8 µH. In one or more embodiments, the efficiency of the wireless transmission of electrical energy is increased by tuning the transmitting and receiving inductor coils 50, 86 to a specific operating frequency using capacitance that is electrically connected to the inductor coil. In the embodiment disclosed above, an inductor coil 50, 86 having an inductance of about 4 µH generally requires a tuning capacitance of between about 400 pf to about 600 pf. An inductor coil 50, 86 with an inductance of about 16 µH generally requires a tuning capacitance of between about 50 pF to 150 pF. It is noted however that using a tuning capacitance of a relatively low value may reduce the transmission distance of the transmitting antenna 18 as the tolerance of the tuning capacitance may de-tune the antenna. Furthermore, an inductor coil 50, 86 with an increased inductance of 16 µH typically generates a magnetic field having an increased magnitude which could undesirably couple with a metallic object. As a result, the impedance sensitivity of the inductor coil 50, 86 may increase. Thus, for these reasons outlined in this example, it is beneficial to reduce the inductance of the inductor coil 50, 86 using the addition of lumped capacitive elements 154 and/or surface mount capacitors to tailor the inductance of the inductor coil 50, 86 that utilizes an optimal tuning capacitance.

TABLE VIII

| Transmitting Antenna Config | Capacitance (pF) | Quality Factor | RCE (%) | M (nH) | Impedance Shift (Ω) |
|---|---|---|---|---|---|
| $D_\infty pF$ | N/A | 85.97 | 79.57% | 652 | −65j |
| D680pF | 680 | 112.65 | 81.02% | 630 | −60j |
| D200pF | 200 | 151.82 | 83.63% | 584 | −52j |
| D96pF | 96 | 205.42 | 85.58% | 526 | −38j |
| D68pF | 68 | 185.66 | 84.90% | 501 | −31j |

Table VIII summaries the measured values of quality factor, coil-to-coil efficiency (RCE), Mutual inductance and impedance shift for various antenna configurations. In this experiment, coil-to-coil efficiency (RCE), Mutual inductance (M), and impedance shift measurements were performed using an RIT3-1 certified Resonator Interface Tester (RIT) from AIR-FUEL Rezence specification. The instrument is intended to simulate impedance shift, coupling and voltage range of a cellular phone antenna with an embedded wireless power resonator. The RIT3-1 device comprises an inductor coil having a length of 78 mm and a width of 52 mm that is supported by a magnetic field shielding material comprising Panasonic's KNZNCR ferrite material having a thickness of 0.7 mm. During the testing, the RIT3-1 instrument was electrically connected to various capacitors having a capacitance as detailed in the "Capacitance" column of Table VIII.

Various antenna electrical performance parameters including quality factor, coil-to-coil efficiency (RCE), Mutual inductance (M), and impedance shift were measured with the RIT3-1 instrument connected to capacitors having various capacitance values as detailed in Table VIII. It is noted that configuration $D_\infty pF$ did not comprise a capacitor. In one or more embodiments, coil-to-coil efficiency (RCE) was calculated by deriving the optimal efficiency at an optimal electrical load on the receiving antenna. Mutual Inductance was measured directly from scattering parameters (S-parameters) that summarize the electrical parameters of the 2 port network that comprised the transmitting and receiving inductor coils.

It is noted that the D96 pF antenna, as detailed in Table VIII above, measured the highest quality factor. This correlates with Impedance analyzer measurements that also showed the D96 pF antenna having the lowest ESR (Table VII) and also increased RCE measurement where it measured a significant improvement of 6.01% over the D0 pF antenna. The $D_\infty pF$ antenna measured the highest Mutual Inductance at about 650 nH which decreased by about 24% to 500 nH with the D68 pF antenna.

Figure 31:
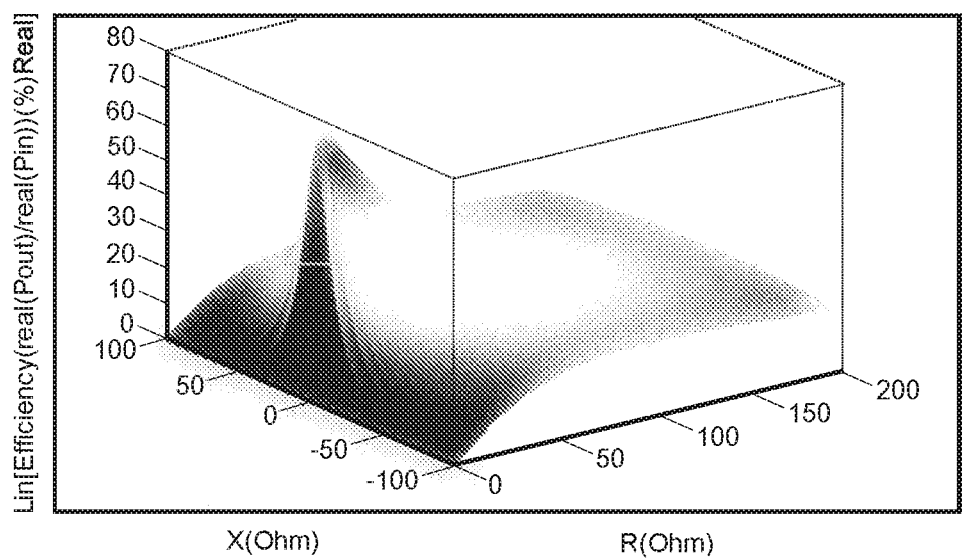
FIGS. 31 and 32 are graphs that illustrate the efficiency of two embodiments of a transmitting antenna as a function of the imaginary and real impedances of an electrical load in ohms.
Figure 32:
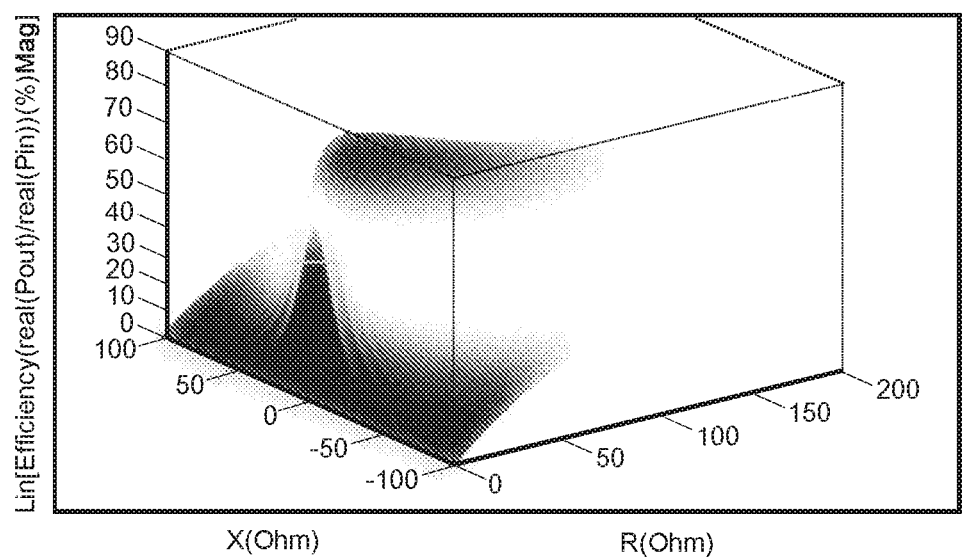

FIGS. 31 and 32, compare the efficiency curves of the D0 pF and D96 pF antennas, respectively. As shown, the z-axis is the coil to coil efficiency in percent of the respective D0 pF and D96 pF antennas. The X-axis is the imaginary electrical impedance due to the metallic surfaces of the cellular phone enclosure that was in contact with the receiving antenna and the R axis is the real impedance which is attributed to the electrochemical cell of the cellular phone in ohms. As illustrated in FIGS. 31 and 32, the added capacitance of the D96 pF antenna shifted the maximum inductance from an imaginary impedance of about 0 ohms (X-axis) and a real impedance of about 0 ohms (R axis) to a real impedance of about 5 ohms (R axis) and an imaginary impedance of about 0 ohms (X-axis). It is noted that the antenna configuration of D96 pF shown in FIG. 32 is preferred because the antenna configuration exhibited increased coil to coil efficiency over a larger x=axis and r-axis spectrum.

Thus, it is contemplated that the wireless electrical energy transfer system of the present disclosure is capable of being configured having a variety of receiving and transmitting antenna configurations. Furthermore, such a configuration of the variety of antennas allows for and significantly improves the wireless transmission of electrical energy and/or data across significantly increased distances such that electronic devices can be electrically charged or powered by positioning them a distance away from the source of wireless electrical energy. It is further contemplated that the various magnetic shielding materials 70 can be strategically positioned adjacent to the transmitting or receiving antennas 18, 20 to enhance quality factor and Mutual inductance between adjacently positioned transmitting and receiving antennas 18, 20. It is appreciated that various modifications to the inventive concepts described herein may be apparent to those of ordinary skill in the art without departing from the spirit and scope of the present disclosure as defined by the appended claims.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub combination.

The invention claimed is:

1. A method of transferring wireless energy via near-field magnetic coupling from a transmitting base to one or more electronic devices configured to receive wireless energy, wherein the wireless energy comprises one of wireless electrical energy, data, or combinations thereof, and wherein the transmitting base includes, a housing comprising a first sidewall positioned at a base proximal end, a second sidewall positioned at a base distal end, a third sidewall and a fourth sidewall that each intersect with each of the first and second sidewalls, and wherein the third sidewall and the fourth sidewall are positioned opposed to each other, the method comprising:
    transmitting the wireless energy via at least one transmitting coil, wherein the at least one transmitting coil is positioned above and substantially parallel to an interior of the first sidewall of the housing such that a gap extends between the at least one transmitting coil and the interior of the first sidewall and the at least one transmitting coil is in physical contact with at least an interior of the third sidewall, and wherein the at least one transmitting coil is configured to resonate at a transmitting coil resonant frequency or a transmitting coil resonant frequency band;
    re-transmitting the wireless energy via a first repeater coil, wherein the first repeater coil is positioned along the interior of the third sidewall of the housing and spaced apart from the at least one transmitting coil, the first repeater coil configured to receive the wireless energy from the at least one transmitting coil and re-transmit the received wireless energy;
    re-transmitting the wireless energy via a second repeater coil, wherein the second repeater coil is positioned along the interior of the fourth sidewall of the housing and spaced apart from the at least one transmitting coil, the second repeater coil configured to receive the wireless energy from the at least one transmitting coil and re-transmit the received wireless energy, and wherein each of the one or more electronic devices comprises at least a receiving coil configured to receive at least the re-transmitted wireless energy from one of the first repeater coil, the second repeater coil, or combinations thereof; and
    receiving the re-transmitted wireless energy by the receiving coil of each of the one or more electronic devices from one of the first repeater coil, the second repeater coil, or combinations thereof.

2. The method of claim 1, wherein the transmitting coil resonant frequency of the at least one transmitting coil is at least 1 kilohertz (kHz).

3. The method of claim 1, wherein the transmitting coil resonant frequency of the at least one transmitting coil is in a range of about 1 kHz to about 100 megahertz (MHz) or within the transmitting coil resonant frequency band that extends from about 1 kHz to about 100 MHz.

4. The method of claim 1, wherein the wireless energy that is one of transmitted, re-transmitted, received, or combinations thereof, has a magnitude from about 100 milliwatt (mW) to about 500 watts (W).

5. The method of claim 1, wherein a magnetic field shielding material is positioned adjacent to the at least one transmitting coil.

6. The method of claim 5, wherein the magnetic field shielding material is selected from a group consisting of a zinc comprising ferrite material, manganese-zinc, nickel-zinc, copper-zinc, magnesium-zinc, and combinations thereof.

7. The method of claim 5, wherein the magnetic field shielding material has a loss tangent less than about 0.70.

8. The method of claim 5, wherein a conductive material is positioned adjacent to the magnetic field shielding material.

9. The method of claim 1, wherein a gap extends between the first sidewall positioned at the base proximal end and the first repeater coil and the second repeater coil.

10. The method of claim 9, wherein the gap is equal to or less than 10 centimeters (cm).

11. The method of claim 1, wherein at least one receiving coil of the one or more electronic devices are positioned within a transmission distance that surrounds and extends from the transmitting base, and wherein the transmission distance is about three times a length, a width, a depth, or a diameter of the transmitting base, whichever is greater.

12. The method of claim 1, wherein at least one receiving coil of the one or more electronic devices are positioned within a transmission distance that surrounds and extends from the transmitting base, and wherein the transmission distance is about five times a length, a width, a depth, or a diameter of the transmitting base, whichever is greater.

13. The method of claim 1, wherein the transmitting base further comprises a transmitting circuit configured to select a capacitance or modify an inductance to cause a transmission distance of the transmitted wireless energy to be modified.

14. The method of claim 13, wherein the transmitting circuit comprises a transmitting selection sub-circuit.

15. The method of claim 1, wherein the at least one transmitting coil is adjacent to or in contact with a substrate, wherein the substrate is flexible.

16. The method of claim 1, wherein the one or more electronic devices are positioned, relative to the transmitting base, such that at least one receiving coil of the one or more electronic devices and the at least one transmitting coil are substantially perpendicular with respect to one another.

17. The method of claim 1, wherein the one or more electronic devices are positioned, relative to the transmitting base, such that at least one receiving coil of the one or more electronic devices and the at least one transmitting coil are substantially parallel with respect to one another, substantially coplanar with respect to one another, or combinations thereof.

18. The method of claim 1, wherein the one or more electronic devices are positioned, relative to the transmitting base, such that at least one receiving coil of the one or more electronic devices and at least one of the first repeater coil, the second repeater coil, or combinations thereof, are substantially parallel with respect to one another, substantially coplanar with respect to one another, or combinations thereof.

19. The method of claim 1, wherein the one or more electronic devices are positioned, relative to the transmitting base, such that at least one receiving coil of the one or more electronic devices and at least one of the first repeater coil, the second repeater coil, or combinations thereof are substantially perpendicular with respect to one another.

20. The method of claim 1,
wherein the one or more electronic devices comprise at least a first electronic device and a second electronic device,
wherein at least the first electronic device is positioned, relative to the transmitting base, such that the receiving coil of the first electronic device and at least one of the first repeater coil, the second repeater coil, or combinations thereof are substantially perpendicular with respect to one another, and
wherein at least the second electronic device is positioned, relative to the transmitting base, such that the receiving coil of the second electronic device and at least one of the first repeater coil, the second repeater coil, or combinations thereof are substantially parallel with respect to one another, substantially coplanar with respect to one another, or combinations thereof.

* * * * *